(12) United States Patent
Kubota et al.

(10) Patent No.: US 10,678,078 B2
(45) Date of Patent: Jun. 9, 2020

(54) DISPLAY DEVICE AND METHOD FOR MANUFACTURING THE DISPLAY DEVICE

(71) Applicant: Semiconductor Energy Laboratory Co., Ltd., Atsugi-shi, Kanagawa-ken (JP)

(72) Inventors: Daisuke Kubota, Atsugi (JP); Yusuke Kubota, Osaka (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 190 days.

(21) Appl. No.: 15/661,331

(22) Filed: Jul. 27, 2017

(65) Prior Publication Data
US 2018/0039125 A1    Feb. 8, 2018

(30) Foreign Application Priority Data

Aug. 5, 2016    (JP) .................... 2016-154436

(51) Int. Cl.
*G02F 1/1333*    (2006.01)
*G02F 1/1335*    (2006.01)
(Continued)

(52) U.S. Cl.
CPC ...... *G02F 1/133305* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 6,714,268 B2    3/2004    Wang et al.
7,038,641 B2    5/2006    Hirota et al.
(Continued)

FOREIGN PATENT DOCUMENTS

JP    2001-066593 A    3/2001
JP    2002-196702 A    7/2002
(Continued)

*Primary Examiner* — Edward J Glick
*Assistant Examiner* — David Y Chung
(74) *Attorney, Agent, or Firm* — Robinson Intellectual Property Law Office; Eric J. Robinson

(57) ABSTRACT

A thin display device, a lightweight display device, or a bendable display device is provided. The display device can be fabricated by a method including a first step of forming a first electrode and a second electrode over a substrate such that they are apart from each other; a second step of sequentially forming a light-blocking layer over a support substrate, a resin layer covering the light-blocking layer, and a first coloring layer and a second coloring layer over the resin layer; a third step of bonding the substrate and the support substrate to each other with a liquid crystal layer containing liquid crystal, monomers, and a polymerization initiator positioned therebetween; a fourth step of performing light irradiation from the support substrate side so that the monomers in the liquid crystal layer are polymerized in a region not shielded by the light-blocking layer; and a fifth step of performing separation between the resin layer and each of the support substrate and the light-blocking layer to remove the support substrate and the light-blocking layer.

14 Claims, 35 Drawing Sheets

(51) Int. Cl.
  *G06F 3/041*  (2006.01)
  *G02F 1/1343*  (2006.01)
  *G02F 1/1368*  (2006.01)
  *G02F 1/1337*  (2006.01)
  *H01L 27/12*  (2006.01)
  *H01L 27/32*  (2006.01)
  *G02F 1/13357*  (2006.01)

(52) U.S. Cl.
  CPC .. *G02F 1/133345* (2013.01); *G02F 1/133512* (2013.01); *G02F 1/133514* (2013.01); *G02F 1/133516* (2013.01); *G02F 1/133553* (2013.01); *G02F 1/133555* (2013.01); *G02F 1/134363* (2013.01); *G06F 3/0412* (2013.01); *G02F 1/13338* (2013.01); *G02F 1/133603* (2013.01); *G02F 1/133784* (2013.01); *G02F 2201/44* (2013.01); *H01L 27/1218* (2013.01); *H01L 27/1259* (2013.01); *H01L 27/3232* (2013.01); *H01L 27/3262* (2013.01); *H01L 2227/323* (2013.01)

(56) References Cited

U.S. PATENT DOCUMENTS

| | | |
|---|---|---|
| 7,084,936 B2 | 8/2006 | Kato |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,385,654 B2 | 6/2008 | Mitsui et al. |
| 7,435,516 B2 | 10/2008 | Sheen et al. |
| 7,674,650 B2 | 3/2010 | Akimoto et al. |
| 7,965,355 B2* | 6/2011 | Park .................. G02F 1/133555 349/106 |
| 2003/0201960 A1 | 10/2003 | Fujieda |
| 2006/0072047 A1 | 4/2006 | Sekiguchi |
| 2007/0002265 A1* | 1/2007 | Kwak .................. G02F 1/13392 349/156 |
| 2008/0180618 A1 | 7/2008 | Fujieda |
| 2010/0171905 A1 | 7/2010 | Huang et al. |
| 2012/0075563 A1* | 3/2012 | Takeda .............. G02F 1/133377 349/139 |
| 2016/0042696 A1 | 2/2016 | Hirakata et al. |
| 2016/0042702 A1* | 2/2016 | Hirakata ............. H01L 27/3269 345/205 |
| 2016/0283028 A1 | 9/2016 | Yamazaki et al. |
| 2016/0299387 A1 | 10/2016 | Yamazaki et al. |
| 2016/0313769 A1 | 10/2016 | Yoshitani et al. |
| 2017/0082887 A1 | 3/2017 | Kubota et al. |

FOREIGN PATENT DOCUMENTS

| | | |
|---|---|---|
| JP | 2004-296162 A | 10/2004 |
| JP | 2007-096055 A | 4/2007 |
| JP | 2007-123861 A | 5/2007 |
| JP | 2007-232882 A | 9/2007 |
| JP | 2012-113215 A | 6/2012 |
| JP | 2013-221965 A | 10/2013 |

* cited by examiner

DISPLAY DEVICE AND METHOD FOR MANUFACTURING THE DISPLAY DEVICE

BACKGROUND OF THE INVENTION

1. Field of the Invention

One embodiment of the present invention relates to a display device. One embodiment of the present invention relates to a method for manufacturing a display device. One embodiment of the present invention relates to a display device including a liquid crystal element and a method for manufacturing the display device. One embodiment of the present invention relates to a bendable display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device refers to any device that can function by utilizing semiconductor characteristics. A transistor, a semiconductor circuit, an arithmetic device, a memory device, and the like are each one embodiment of a semiconductor device. An imaging device, an electro-optical device, a power generation device (including a thin film solar cell, an organic thin film solar cell, and the like in its category), and an electronic device may each include a semiconductor device.

2. Description of the Related Art

An example of display devices is liquid crystal display devices provided with liquid crystal elements. For example, active matrix liquid crystal display devices, in each of which pixel electrodes are arranged in a matrix and transistors are used as switching elements connected to respective pixel electrodes, have attracted attention.

For example, an active matrix liquid crystal display device including transistors, in each of which a metal oxide is used for a channel formation region, as switching elements connected to respective pixel electrodes is known (Patent Documents 1 and 2).

As active matrix liquid crystal display devices, two major types are known: a transmissive type and a reflective type.

In a transmissive liquid crystal display device, a backlight such as a cold cathode fluorescent lamp or a light-emitting diode (LED) is used, and the optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, bright and dark images are combined to display an image.

In a reflective liquid crystal display device, the optical modulation action of liquid crystal is utilized to select one of the two states: a state where external light, that is, incident light is reflected on a pixel electrode to be output to the outside of the device and a state where incident light is not output to the outside of the device, whereby a bright or dark image is displayed. Furthermore, bright and dark images are combined to display an image. Unlike a transmissive liquid crystal display device, a reflective liquid crystal display device does not use a backlight and thus has an advantage of low power consumption.

REFERENCE

Patent Documents

[Patent Document 1] Japanese Published Patent Application No. 2007-123861
[Patent Document 2] Japanese Published Patent Application No. 2007-096055

SUMMARY OF THE INVENTION

Display devices incorporated in mobile phones, smartphones, tablet terminals, smart watches, and the like, which are portable, are required to be reduced in thickness and weight and operate with low power consumption, for example.

An object of one embodiment of the present invention is to provide a thin display device. Another object is to provide a lightweight display device. Another object is to provide a bendable display device. Another object is to provide a display device with high strength. Another object is to provide a display device that can operate with low power consumption. Another object is to provide a novel display device.

Note that the descriptions of these objects do not disturb the existence of other objects. In one embodiment of the present invention, there is no need to achieve all the objects. Other objects can be derived from the description of the specification and the like.

One embodiment of the present invention is a display device including a first electrode, a second electrode, a liquid crystal layer, a first coloring layer, and a second coloring layer. The first electrode and the second electrode are apart from each other on the same plane. The first coloring layer and the second coloring layer are apart from each other on the same plane. The first coloring layer partly overlaps with the first electrode. The second coloring layer partly overlaps with the second electrode. The liquid crystal layer includes a first portion overlapping with the first electrode and a second portion overlapping with a region between the first electrode and the second electrode. The second portion includes a portion overlapping with neither the first coloring layer nor the second coloring layer. The first portion contains monomers and liquid crystal. The second portion contains a polymer obtained by polymerization of the monomers.

The first electrode and the second electrode each preferably have a function of reflecting visible light or a function of transmitting visible light.

The above display device preferably further includes a third electrode overlapping with the first electrode with the liquid crystal layer located between the third electrode and the first electrode and having a function of transmitting visible light. In that case, the above display device preferably further includes a first alignment film covering the first electrode, and a second alignment film covering the third electrode. Furthermore, the first portion of the liquid crystal layer is preferably in contact with the first alignment film and the second alignment film.

A structure body having an insulating property is preferably provided inside the second portion.

The above display device preferably further includes a first insulating layer having a depression. In that case, the first electrode and the second electrode are preferably positioned over the first insulating layer such that they do not overlap with the depression. The second portion preferably includes a portion overlapping with the depression.

The above display device preferably further includes a first substrate and a second substrate. In that case, it is preferable that the first electrode and the second electrode be located between the first substrate and the liquid crystal layer, the first coloring layer and the second coloring layer be located between the second substrate and the liquid crystal layer, and the first substrate and the second substrate each have flexibility.

The above display device preferably further includes a second insulating layer and a light-emitting element. In that case, the light-emitting element preferably has a structure in which a fourth electrode transmitting visible light, a layer including a light-emitting substance, and a fifth electrode are stacked from the second insulating layer side. More preferably, the light-emitting element emits light through the second insulating layer and the liquid crystal layer. In that case, the display device preferably includes a first transistor electrically connected to the first electrode, and a second transistor electrically connected to the second electrode. The first transistor and the second transistor are preferably provided on the same plane.

Furthermore, in the above display device, the first transistor and the second transistor are preferably provided on the first surface side of the second insulating layer. In that case, it is preferable that the first electrode be provided on the opposite side of the second insulating layer from the first transistor, and the first electrode and the first transistor be electrically connected to each other through an opening in the second insulating layer.

Alternatively, in the above display device, it is preferable that the first transistor and the second transistor be provided on the first surface side of the second insulating layer, the fourth electrode be provided on the opposite side of the second insulating layer from the second transistor, and the fourth electrode and the second transistor be electrically connected to each other through an opening in the second insulating layer.

Another embodiment of the present invention is a method for manufacturing a display device. The method includes a first step of forming a first electrode and a second electrode over a substrate such that the first electrode and the second electrode are apart from each other; a second step of sequentially forming a light-blocking layer over a support substrate, a resin layer covering the light-blocking layer, and a first coloring layer and a second coloring layer over the resin layer; a third step of bonding the substrate and the support substrate to each other with a liquid crystal layer containing liquid crystal, monomers, and a polymerization initiator positioned between the substrate and the support substrate; a fourth step of performing light irradiation from the support substrate side so that the monomers in the liquid crystal layer are polymerized in a region not shielded by the light-blocking layer; and a fifth step of performing separation between the resin layer and each of the support substrate and the light-blocking layer to remove the support substrate and the light-blocking layer.

Another embodiment of the present invention is a method for manufacturing a display device. The method includes a first step of forming a first insulating layer over a first support substrate and forming a first electrode and a second electrode over the first insulating layer such that the first electrode and the second electrode are apart from each other; a second step of sequentially forming a light-blocking layer over a second support substrate, a resin layer covering the light-blocking layer, and a first coloring layer and a second coloring layer over the resin layer; a third step of bonding the first support substrate and the second support substrate to each other with a liquid crystal layer containing liquid crystal, monomers, and a polymerization initiator positioned between the first support substrate and the second support substrate; a fourth step of performing light irradiation from the second support substrate side so that the monomers in the liquid crystal layer are polymerized in a region not shielded by the light-blocking layer; a fifth step of performing separation between the resin layer and each of the second support substrate and the light-blocking layer; a sixth step of removing part of the resin layer exposed in the fifth step, by etching, and bonding a second substrate to the first coloring layer and the second coloring layer with a first bonding layer; a seventh step of performing separation between the first support substrate and the first insulating layer; and an eighth step of bonding a first substrate to an exposed surface of the first insulating layer with a second bonding layer.

In the above method, flexible substrates are preferably used as the first substrate and the second substrate.

One embodiment of the present invention can provide a thin display device, a lightweight display device, a bendable display device, a display device with high strength, a display device that can operate with low power consumption, or a novel display device.

Note that one embodiment of the present invention does not necessarily achieve all the effects listed above. Other effects can be derived from the description of the specification, the drawings, the claims, and the like.

BRIEF DESCRIPTION OF THE DRAWINGS

In the accompanying drawings:

FIGS. 29A, 29B1, and 29B2 illustrate structure examples of display devices of embodiments;

DETAILED DESCRIPTION OF THE INVENTION

Figure 1A:
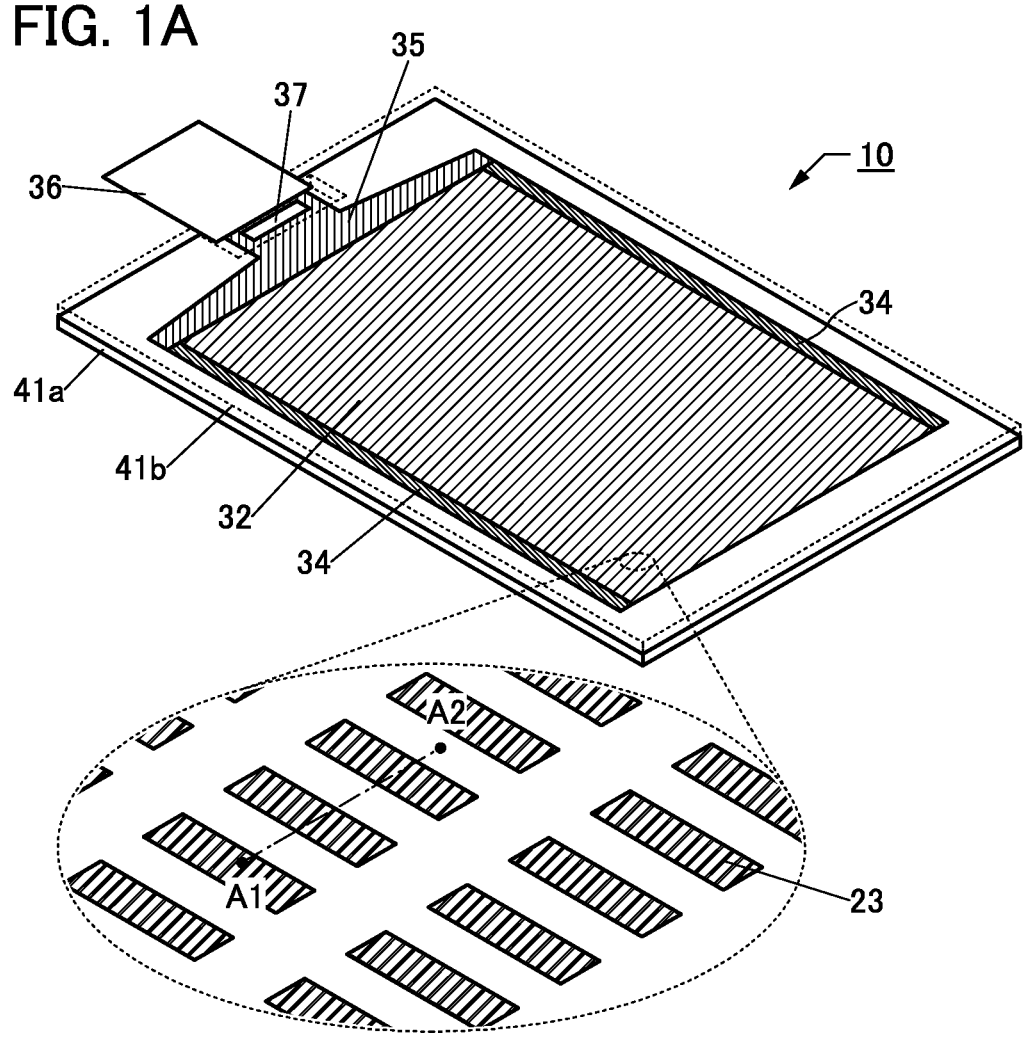
FIGS. 1A and 1B illustrate a structure example of a display device of an embodiment.

Embodiments will be described in detail with reference to the drawings. Note that the present invention is not limited to the description below, and it is easily understood by those skilled in the art that various changes and modifications can be made without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and description thereof is not repeated. Further, the same hatching pattern is used for portions having similar functions, and the portions are not denoted by reference numerals in some cases.

Note that in each drawing described in this specification, the size, the layer thickness, or the region of each component is exaggerated for clarity in some cases. Therefore, the size, the layer thickness, or the region is not limited to such a scale.

Note that in this specification and the like, ordinal numbers such as "first" and "second" are used in order to avoid confusion among components and do not limit the number.

A transistor is a kind of semiconductor elements and can achieve amplification of current and voltage, switching operation for controlling conduction and non-conduction, and the like. A transistor in this specification includes, in its category, an insulated-gate field effect transistor (IGFET) and a thin film transistor (TFT).

Embodiment 1

In this embodiment, structure examples of display devices of embodiments of the present invention and methods for manufacturing the display devices will be described.

The display device of one embodiment of the present invention includes a plurality of liquid crystal elements. The liquid crystal elements each include a pair of electrodes and a liquid crystal layer. One of the pair of electrodes serves as a pixel electrode, and the other serves as a common electrode. The liquid crystal layer can be provided between a pair of substrates.

The liquid crystal element can be either a reflective liquid crystal element or a transmissive liquid crystal element. In the case where the liquid crystal element is a reflective liquid crystal element, a conductive layer that reflects visible light can be used as the pixel electrode. In the case where the liquid crystal element is a transmissive liquid crystal element, a conductive layer that transmits visible light can be used as the pixel electrode.

The liquid crystal layer includes a first portion overlapping with the pixel electrode and a second portion overlapping with a region between two adjacent pixel electrodes. The first portion contains monomers and liquid crystal, and the second portion contains a polymer (high molecular material) obtained by polymerization of the monomers. In the second portion, the polymer constitutes the framework of a columnar partition wall which bonds the pair of substrates to each other. Furthermore, the second portion may contain liquid crystal, or a columnar partition wall may contain the polymer and liquid crystal.

The columnar partition wall containing the polymer, which is provided in the second portion of the liquid crystal layer, is placed between two adjacent liquid crystal elements and has a function of dividing the liquid crystal, between the two liquid crystal elements. Thus, the columnar partition wall containing the polymer can also be referred to as a polymer wall. The first portion in one liquid crystal element can contain the liquid crystal surrounded by the partition walls and the pair of substrates. The partition walls reduce the influence of the alignment state of the liquid crystal contained in the adjacent liquid crystal element; thus, a display device that has improved contrast and the like and can display a clearer image can be fabricated. Note that the liquid crystal in one liquid crystal element is not necessarily separated completely from the liquid crystal contained in the adjacent liquid crystal element as long as at least one island-like partition wall is provided between the two adjacent liquid crystal elements.

To fabricate the display device of one embodiment of the present invention, first, a light-blocking layer is formed over a support substrate, and a resin layer is formed to cover the light-blocking layer. For the liquid crystal layer, a material containing liquid crystal, monomers, and a polymerization initiator is used. Then, the support substrate and a substrate provided with a pixel electrode are bonded to each other such that the liquid crystal layer is sandwiched therebetween. After that, part of the liquid crystal layer is irradiated with light using the light-blocking layer as a light-blocking mask, whereby the monomers in a region not overlapping with the light-blocking layer polymerize to become a polymer. In this manner, the partition wall containing the polymer can be formed in the region not overlapping with the light-blocking layer. After that, separation is performed between the resin layer and each of the light-blocking layer and the support substrate, so that the support substrate and the light-blocking layer are removed.

The above method enables the light irradiation to be performed with the light-blocking layer and the liquid crystal layer being very close to each other. For example, when light irradiation is performed through a substrate with the use of a light-blocking mask in the state where a liquid crystal layer is sandwiched between a pair of substrates, an unintended region is also exposed to light because of scattering or diffraction of the light, so that a region where a polymer is formed extends in some cases. However, the above method allows highly accurate formation of a polymer in a desired position because the distance between the light-blocking layer and the liquid crystal layer is very small and the effect of light scattering or the like is significantly small.

Furthermore, since the support substrate and the light-blocking layer can be removed, a film-like substrate that is thin and lightweight can be easily bonded as a substrate to the resin layer after the removal of the support substrate and the light-blocking layer. As a result, a lightweight display device can be easily fabricated. Moreover, the light-blocking layer can be formed in any position; thus, a region where the partition wall is formed can be freely determined without being limited by, for example, the positions of the pixel electrode and other wirings.

For the resin layer, a photosensitive or non-photosensitive resin is preferably used. More preferably, a polyimide resin is used. After the resin layer is formed to cover the support substrate and the light-blocking layer, heat treatment is performed in an oxygen-containing atmosphere, whereby adhesion between the resin layer and each of the support substrate and the light-blocking layer is reduced, and consequently, separation therebetween is facilitated. This allows separation at the interface between the support substrate and the resin layer and the interface between the light-blocking layer and the resin layer after light irradiation.

After the support substrate and the light-blocking layer are removed, the remaining resin layer may be removed. In the case where the resin layer transmits visible light or has a sufficiently small thickness, for example, the resin layer may be left. Alternatively, only a portion of the resin layer that is located in a display portion of a pixel (e.g., a portion overlapping with the pixel electrode) may be removed.

In the display device of one embodiment of the present invention, the partition wall containing the polymer that bonds the pair of substrates to each other can be placed between adjacent pixels; thus, adhesion strength between the substrates is extremely high. In addition, the partition wall can serve as a gap spacer for keeping a distance between the pair of substrates. Thus, when external force is applied (e.g., the display surface is pushed or the display device is bent), the display device is oscillated, and the like, the cell gap of the liquid crystal element is not easily changed; as a result, an interference fringe, a change in color, and the like due to the change of the cell gap are unlikely to occur.

By using the above-described method, a polymer can be formed with high accuracy at the position not shielded by the light-blocking layer. Thus, as compared with the case where a light-blocking mask or the like is used to form a polymer, polymers each with a small diameter can be distributed with high density. As a result, an extremely high-resolution display device can be fabricated. The use of the method of one embodiment of the present invention allows fabrication of, for example, an extremely high-resolution display device in which the resolution of a display portion is higher than or equal to 300 ppi, higher than or equal to 500 ppi, higher than or equal to 800 ppi, or higher than or equal to 1000 ppi and lower than or equal to 3000 ppi, lower than or equal to 4000 ppi, or lower than or equal to 5000 ppi.

Structure examples and manufacturing method examples of a display device of one embodiment of the present invention will be described below with reference to drawings.

Note that the expressions indicating directions such as "over" and "under" are basically used to correspond to the directions of drawings. However, in some cases, the direction indicating "over" or "under" in the specification does not correspond to the direction in the drawings for the purpose of simplicity or the like. For example, when a stacking order (formation order) of a stack or the like is described, even in the case where a surface on which the stack is provided (e.g., a formation surface, a support surface, an attachment surface, or a planarization surface) is located above the stack in the drawings, the direction and the opposite direction are referred to as "under" and "over", respectively, in some cases.

Structure Example 1

FIG. 1A is a schematic perspective view illustrating a display device 10 of one embodiment of the present invention. In the display device 10, a substrate 41a and a substrate 41b are bonded to each other. In FIG. 1A, the substrate 41b is shown by a dashed line.

The display device 10 includes a display portion 32, a circuit 34, a wiring 35, and the like. The substrate 41a is provided with the circuit 34, the wiring 35, a conductive layer 23, and the like. The conductive layer 23, which is provided in the display portion 32, serves as a pixel electrode. In FIG. 1A, an IC 37 and an FPC 36 are mounted on the substrate 41a in an opening portion formed in the substrate 41b. Thus, the structure illustrated in FIG. 1A can be referred to as a display module.

As the circuit 34, for example, a circuit functioning as a scan line driver circuit can be used.

The wiring 35 has a function of supplying a signal or electric power to the display portion 32 or the circuit 34. The signal or power is input to the wiring 35 from the outside through the FPC 36 or from the IC 37.

FIG. 1A shows an example in which the IC 37 is provided on the substrate 41a by a chip on glass (COG) method or the like. As the IC 37, an IC functioning as a signal line driver circuit or the like can be used. Note that the IC 37 is not necessarily provided when, for example, the display device 10 includes a circuit serving as a signal line driver circuit and when a circuit serving as a signal line driver circuit is provided outside and a signal for driving the display device 10 is input through the FPC 36. Alternatively, the IC 37 may be mounted on the FPC 36 by a chip on film (COF) method or the like.

FIG. 1A is an enlarged view of part of the display portion 32. The conductive layers 23 included in a plurality of display elements are arranged in a matrix in the display portion 32. The conductive layer 23 functions as a pixel electrode, for example.

Cross-Sectional Structure Example 1-1

Figure 1B:
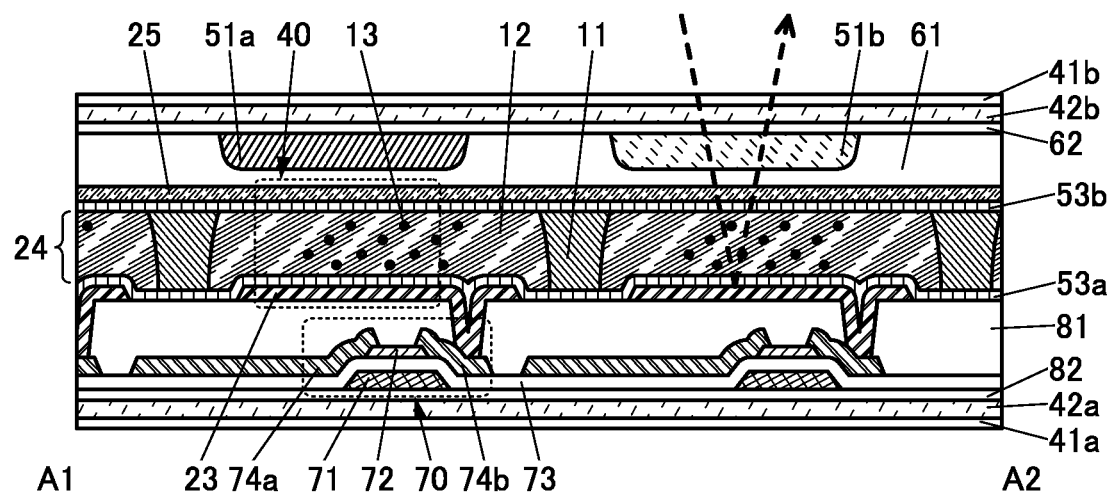

FIG. 1B shows an example of a cross section taken along line A1-A2 in FIG. 1A. A cross section of a region including adjacent two pixels (subpixels) is shown in FIG. 1B. Here, an example where a reflective liquid crystal element 40 is used as a display element is shown. In FIG. 1B, the substrate 41b side is the display surface side.

The substrate 41a is bonded to the insulating layer 82 with a bonding layer 42a. The substrate 41b is bonded to an insulating layer 62 with a bonding layer 42b.

In the display device 10, the liquid crystal layer 24 is provided between the substrate 41a and the substrate 41b. The liquid crystal element 40 includes the conductive layer 23 provided on the substrate 41a side, a conductive layer 25 provided on the substrate 41b side, and the liquid crystal layer 24 provided therebetween.

The conductive layer 23 serves as a pixel electrode. Here, the conductive layer 23 has a function of reflecting visible light. The conductive layer 25 serves as a common electrode or the like. Here, the conductive layer 25 has a function of transmitting visible light. Thus, the liquid crystal element 40 is a reflective liquid crystal element.

Although not illustrated here, a circularly polarizing plate is provided outward from the substrate 41b. An example of a circularly polarizing plate is a stack including a linear polarizing plate and a quarter-wave retardation plate. Such a structure enables display using reflected light and reduction of reflection of external light on the display surface side. In addition, a light diffusion plate is preferably provided on the display surface side to improve visibility.

A transistor 70 electrically connected to the conductive layer 23 is provided over the substrate 41a. On the substrate 41a side of the substrate 41b, an insulating layer 62, a coloring layer 51a, a coloring layer 51b, an insulating layer 61, the conductive layer 25, and the like are provided. In addition, an alignment film 53a is provided between the conductive layer 23 and the liquid crystal layer 24 and an alignment film 53b is provided between the conductive layer 25 and the liquid crystal layer 24. Note that the alignment films 53a and 53b are not necessarily provided when not needed.

The transistor 70 includes a conductive layer 71 serving as a gate, a semiconductor layer 72, an insulating layer 73 serving as a gate insulating layer, a conductive layer 74a serving as one of a source and a drain, a conductive layer 74b serving as the other of the source and the drain, and the like.

An insulating layer 81 is provided to cover the transistor 70. The conductive layer 23 is provided over the insulating layer 81. The conductive layer 23 is electrically connected to the conductive layer 74b through an opening in the insulating layer 81. The transistor 70 and the conductive layer 23 are placed in each pixel (subpixel).

The coloring layers 51a and 51b are placed to overlap with different conductive layers 23.

The liquid crystal layer 24 contains liquid crystal 12 and monomers 13 in a region overlapping with the conductive layer 23. In addition, the liquid crystal layer 24 includes a partition wall 11 in a region overlapping with a region between the two adjacent conductive layers 23.

The monomer 13 is a material which becomes a polymer by polymerization. Furthermore, the partition wall 11 includes a polymer obtained by polymerization of the monomers 13. In the partition wall 11, a material which is the same as that of the liquid crystal 12 may be included.

As the monomer 13, a polymerizable monomer can be used. For example, a photopolymerizable (photocurable) monomer, which is polymerized by light, and a thermopolymerizable (thermosetting) monomer, which is polymerized by heat, can be used. In particular, a photopolymerizable material is preferably used. The liquid crystal layer 24 may include, in addition to the monomer 13, an oligomer whose polymerization degree is greater than or equal to 2 and less than or equal to 100, for example. In that case, the oligomer is preferably a photopolymerizable oligomer or a thermopolymerizable oligomer.

As the monomer 13, a monofunctional monomer such as acrylate or methacrylate, a polyfunctional monomer such as diacrylate, triacrylate, dimethacrylate, or trimethacrylate, or the like can be used. Alternatively, a mixture of two kinds or more of the monofunctional monomer and the polyfunctional monomer may be used. Alternatively, as the monomer 13, a liquid-crystalline material, a non-liquid-crystalline material, or a mixture thereof can be used.

The liquid crystal layer 24 may include a polymerization initiator in a region overlapping with the conductive layer 23. The polymerization initiator changes to a substance which is to be a trigger for polymerization of monomers due to external stimuli such as light and heat, for example. As the polymerization initiator, a radical polymerization initiator which generates radicals by irradiation with light such as ultraviolet light or heating can be used, for example. The polymerization initiator whose amount is minimal compared with those of the liquid crystal and the monomers is used. For example, the polymerization initiator may be mixed such that the weight ratio of the polymerization initiator to the total weight of a composition of the liquid crystal, the monomers, and the polymerization initiator is lower than or equal to 1 wt %. Moreover, the polymerization initiator can be selected as appropriate in accordance with the material of the monomer 13. Depending on the material of the monomer 13, a cation polymerization initiator, an anion polymerization initiator, or the like may be used instead of the radical polymerization initiator.

As the material of the monomer 13, a material with which polymerization is started by a polymerization initiator to be used is selected. In particular, for the monomer 13 and the polymerization initiator, the combination of materials with which polymerization is started and proceeds by ultraviolet light is preferably used.

The liquid crystal layer 24 may contain a chiral material, in addition to the liquid crystal 12, the monomers 13, the polymerization initiator, and the like.

The partition wall 11 includes a polymer obtained by polymerization of the monomers 13. For example, when acrylate is used for the monomers 13, the partition wall 11 includes polyacrylate.

Furthermore, the degree of polymerization of the polymer included in the partition wall 11 depends on the formation condition of the polymer or the material of the monomers 13. In addition, the volume density of the partition wall 11 also depends on the formation condition of the polymer or the material of the monomers 13, or the like. For example, the volume density of the partition wall 11 can be higher than or equal to 70% and lower than or equal to 100%, preferably higher than or equal to 80% and lower than or equal to 100%, more preferably higher than or equal to 90% and lower than or equal to 100%.

The partition wall 11 preferably has a function of bonding the substrate 41a and the substrate 41b to each other. Specifically, the partition wall 11 has a function of bonding a layer which is provided on the substrate 41a side and in contact with the liquid crystal layer 24 and a layer which is provided on the substrate 41b side and in contact with the liquid crystal layer 24 to each other. In FIG. 1B, the partition wall 11 bonds part of the alignment film 53a in contact with the liquid crystal layer 24 and part of the alignment film 53b in contact with the liquid crystal layer 24 to each other. In the case where the alignment films 53a and 53b are not provided, the partition wall 11 bonds part of the insulating layer 81 in contact with the liquid crystal layer 24 and part of the conductive layer 25 in contact with the liquid crystal layer 24 to each other.

For the substrate 41a and the substrate 41b, a thin lightweight material is preferably used. For example, a material having a smaller weight per unit area than 0.5-mm-thick glass, such as a material containing a resin or glass thin enough to have flexibility, is preferably used.

For example, for the substrate 41a or the substrate 41b, a thin sheet-like material with a thickness greater than or equal to 1 μm and less than or equal to 300 μm, preferably greater than or equal to 3 μm and less than or equal to 200 μm, more preferably greater than or equal to 5 μm and less than or equal to 150 μm, still more preferably greater than or equal to 10 μm and less than or equal to 100 μm can be used. The use of such a material for each of the substrates 41a and 41b allows fabrication of a bendable display device.

In the display device 10 of one embodiment of the present invention, the adhesion strength between the substrate 41a and the substrate 41b is increased by the partition wall 11 which is positioned in a region overlapping with a region between the two conductive layers 23 serving as pixel electrodes; thus, the display device 10 is unlikely to be broken and has high reliability. Moreover, in the display device 10, by the partition wall 11, the physical strength against external force is increased and the change of the cell gap due to external force is suppressed.

The above is the description of Cross-sectional structure example 1-1.

Manufacturing Method Example 1-1

Next, an example of a method for manufacturing the display device 10 illustrated in FIG. 1B will be described. FIGS. 2A to 2C to FIGS. 6A to 6C are schematic cross-sectional views each illustrating a stage of the process in the method for manufacturing the display device 10.

Note that the thin films included in the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Alternatively, the thin films included in the display device (the insulating film, the semiconductor film, the conductive film, and the like) can be formed by a method such as spin coating, dipping, spray coating, ink-jetting, dispensing, screen printing, or offset printing, or with a doctor knife, a slit coater, a roll coater, a curtain coater, or a knife coater, for example.

When the thin films included in the display device are processed, a photolithography method or the like can be used. Alternatively, island-shaped thin films may be formed by a film formation method using a shielding mask. Alternatively, the thin films may be processed by a nanoimprinting method, a sandblasting method, a lift-off method, or the like. Examples of the photolithography method include the following two methods: a method in which a photosensitive resist material is applied to a thin film to be processed, the material is exposed to light through a photomask and then developed to form a resist mask, the thin film is processed by etching or the like, and the resist mask is removed; and a method in which a photosensitive thin film is formed and then exposed to light and developed to be processed into a desired shape.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by a liquid immersion exposure technique. As the light for the exposure, extreme ultra-violet light (EUV) or X-rays may be used. Instead of the light for the exposure, an electron beam can be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

<Formation of Separation Layer 43a and Insulating Layer 82>

Figure 2A:
FIGS. 2A to 2C illustrate a method for manufacturing a display device of an embodiment.

First, a separation layer 43a and the insulating layer 82 are formed over a support substrate 44a (FIG. 2A).

As the support substrate 44a, a substrate having rigidity high enough to be easily transferred in a device or between devices can be used. Furthermore, a substrate that is resistant to heat in the manufacturing process is used. For example, a glass substrate with a thickness greater than or equal to 0.3 mm and less than or equal to 1 mm can be used.

As materials used for the separation layer 43a and the insulating layer 82, materials with which separation is performed at the interface between the separation layer 43a and the insulating layer 82 or in the separation layer 43a can be selected.

For example, it is possible to use a stack of a layer containing a high-melting-point metal material, such as tungsten, and a layer containing an oxide of the metal material, as the separation layer 43a, and a stack of layers of inorganic insulating materials, such as silicon nitride, silicon oxide, silicon oxynitride, and silicon nitride oxide, as the insulating layer 82. Note that in this specification, oxynitride contains more oxygen than nitrogen, and nitride oxide contains more nitrogen than oxygen. A high-melting-point metal material is preferably used for the separation layer 43a because in the process after that, treatment at high temperature can be performed and there are more materials and formation methods to choose from.

When a stack of a tungsten layer and a tungsten oxide layer is used as the separation layer 43a, separation can be performed at the interface between the tungsten layer and the tungsten oxide layer, in the tungsten oxide layer, or at the interface between the tungsten oxide layer and the insulating layer 82.

The structures of the separation layer 43a and a layer thereover to be separated are not limited thereto, and any of a variety of materials can be selected.

<Formation of Transistor 70>

Next, the conductive layer 71 is formed over the insulating layer 82. The conductive layer 71 can be formed in the following manner: a conductive film is formed, a resist mask is formed, the conductive film is etched, and then the resist mask is removed.

Then, the insulating layer 73 is formed to cover the insulating layer 82 and the conductive layer 71.

Then, the semiconductor layer 72 is formed. The semiconductor layer 72 can be formed in the following manner: a resist mask is formed after a semiconductor film is formed, the semiconductor film is etched, and the resist mask is removed.

Then, the conductive layer 74a and the conductive layer 74b are formed. The conductive layers 74a and 74b can be formed by a method similar to that of the conductive layer 71.

Figure 2B:
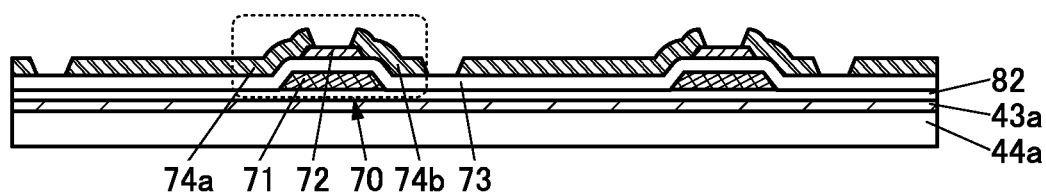

Through the above steps, the transistor 70 can be formed (FIG. 2B).

<Formation of Insulating Layer 81>

Then, the insulating layer 81 is formed. When a photosensitive material is used for the insulating layer 81, an opening can be formed by a photolithography method or the like. Alternatively, the opening may be formed in the following manner: an insulating film formed for the insulating layer 81 and then part of insulating film is etched with the use of a resist mask. It is preferable to use an organic insulating material for the insulating layer 81 since the flatness of the top surface thereof can be enhanced.

An inorganic insulating film may be used for the insulating layer 81. The insulating layer 81 can be formed using a single layer of any of layers of inorganic insulating materials such as silicon nitride, silicon oxide, silicon oxynitride, silicon nitride oxide, aluminum oxide, aluminum nitride, aluminum oxynitride, and aluminum nitride oxide or a stack thereof. Thus, the insulating layer 81 serves as a protective layer of the transistor 70.

Alternatively, the insulating layer 81 may have a stacked structure of an inorganic insulating film and an organic insulating film.

<Formation of Conductive Layer 23 and Alignment Film 53a>

Next, the conductive layer 23 is formed over the insulating layer 81. The conductive layer 23 can be formed by a method similar to that of the conductive layer 71.

Figure 2C:
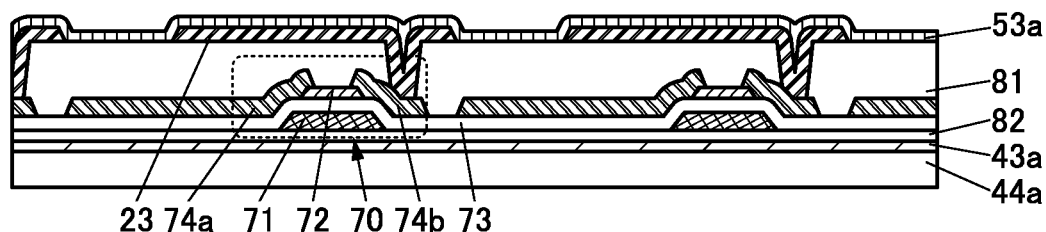

Then, the alignment film 53a is formed (FIG. 2C). A thin film to be the alignment film 53a is formed and then rubbing treatment is performed, whereby the alignment film 53a can be formed.

<Formation of Light-Blocking Layer 15>

Next, a light-blocking layer 15 is formed over a support substrate 44b. The light-blocking layer 15 is preferably formed by processing a conductive film by a method similar to that of the conductive layer 71 or the like. Note that the light-blocking layer 15 may be formed using a metal material or a resin material including a pigment or a dye by a method similar to that of the insulating layer 81 or the like, as long as separation can be performed later between the light-blocking layer 15 and a resin layer 16.

The light-blocking layer 15 is a layer that blocks light 20 when irradiation with the light 20 is performed later for formation of the partition wall 11. Thus, a material and the thickness of the light-blocking layer 15 can be determined depending on conditions for the later irradiation with the light 20.

For the light-blocking layer 15, especially, a metal or an alloy can preferably be used. For example, any of metals such as aluminum, titanium, chromium, nickel, copper, yttrium, zirconium, molybdenum, silver, tantalum, and tungsten, or an alloy containing any of the metals as its main component can be used. Furthermore, the light-blocking layer 15 may have a stacked structure of two or more layers.

The thickness of the light-blocking layer 15 can be greater than or equal to 10 nm and less than or equal to 2 μm, preferably greater than or equal to 30 nm and less than or equal to 1 μm, more preferably greater than or equal to 50 nm and less than or equal to 500 nm. Note that the thickness of the light-blocking layer 15 can be determined depending on a material for the light-blocking layer 15 and the wavelength, intensity, and the like of the light 20.

<Formation of Layer 16a>

Figure 3A:
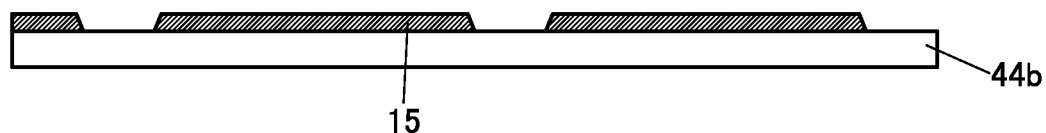
FIGS. 3A to 3E illustrate a method for manufacturing a display device of an embodiment.
Figure 3B:
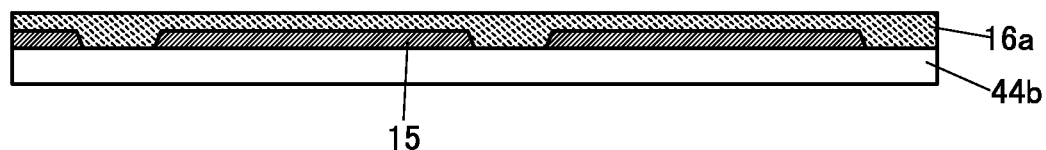

Next, the layer 16a is formed to cover the light-blocking layer 15 and the support substrate 44b (FIG. 3B). The layer 16a is to be subjected to heat treatment later to be the resin layer 16.

First, the material of the layer 16a is applied to the support substrate 44b and the light-blocking layer 15. For the application, a spin coating method is preferred because the layer 16a can be thin and uniformly formed over a large substrate. Furthermore, applying the material of the layer 16a is preferred because of improving step coverage and allowing the surface of the resin layer 16 to be flat.

Alternatively, the material of the layer 16a can be applied by dipping, spray coating, ink-jetting, dispensing, screen printing, or offset printing, or with a doctor knife, a slit coater, a roll coater, a curtain coater, or a knife coater, for example.

After the layer 16a is formed by application, heat treatment (also referred to as pre-baking treatment) to remove a solvent and the like is performed, whereby the layer 16a from which the solvent and the like are removed can be formed. The temperature of the pre-baking treatment can be appropriately determined in consideration of a material to be used and is, for example, higher than or equal to 50° C. and lower than or equal to 180° C., higher than or equal to 80° C. and lower than or equal to 150° C., or higher than or equal to 90° C. and lower than or equal to 120° C.

The material used for the layer 16a includes a thermosetting resin precursor that is cured by heat. In addition, the material preferably includes a solvent for adjusting the viscosity.

The material preferably includes a resin precursor that becomes a polyimide resin, an acrylic resin, an epoxy resin, a polyamide resin, a polyimide amide resin, a siloxane resin, a benzocyclobutene-based resin, or a phenol resin after being cured. That is, the formed resin layer 16 contains any of these resin materials. In particular, a resin precursor that has an imide bond caused by dehydration is preferably used for the material. A resin obtained after the resin precursor is cured, typified by a polyimide resin, is preferably used as the resin layer 16, in which case heat resistance and weatherability can be improved.

By the pre-baking treatment, the layer 16a including a resin precursor is formed. Note that depending on conditions of the pre-baking treatment, a polymer formed by a reaction of part of the resin precursor is included in the layer 16a in some cases.

As the material to be applied, a material including a soluble polymer may alternatively be used. Such a material can be easily applied in the state where a polymer is solved in a solvent. Furthermore, the solvent is removed by heat treatment or the like, whereby the layer 16a including the polymer can be formed.

The use of a low-viscosity solvent as the material to be applied allows the layer 16a to be easily formed thin and uniformly. The viscosity of the material used for the application is greater than or equal to 5 cP and less than 500 cP, preferably greater than or equal to 5 cP and less than 100 cP, more preferably greater than or equal to 10 cP and less than or equal to 50 cP. The lower the viscosity of the material is, the easier the application is. Furthermore, the lower the viscosity of the material is, the more the entry of bubbles can be suppressed, leading to a film with good quality.

<Formation of Resin Layer 16>

Figure 3C:
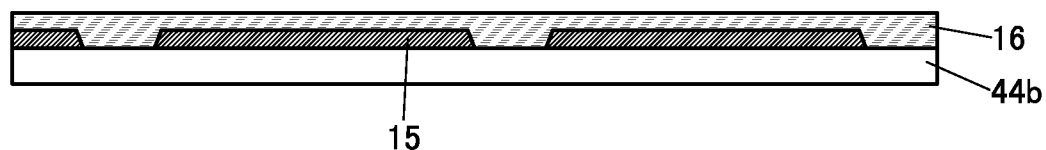

Next, the layer 16a is subjected to heat treatment to form the resin layer 16 (FIG. 3C).

The heat treatment can be performed in an oxygen-containing atmosphere. Heating the layer 16a in an oxygen-containing atmosphere facilitates separation between the formed resin layer 16 and each of the support substrate 44b and the light-blocking layer 15.

In the case where a material including a resin precursor is used for the layer 16a, the heat treatment promotes a reaction and thus the resin layer 16 that includes a polymer and becomes easy to separate is formed. In contrast, in the case where a material including a soluble polymer is used for the layer 16a, the resin layer 16 that becomes easier to separate than the layer 16a is formed through the heat treatment.

The heat treatment can be performed in an oxygen-containing atmosphere in a chamber of an apparatus, for example. Alternatively, the heat treatment may be performed with the layer 16a exposed to an air atmosphere with a hot plate or the like. Alternatively, the heat treatment may be performed while an oxygen-containing gas is supplied to a chamber of an apparatus. In that case, a mixed gas of an oxygen gas and a nitrogen or a rare gas is preferably used.

An atmosphere of the heat treatment preferably has a higher oxygen content, in which case more oxygen can be contained in the layer 16a and separation is facilitated. The partial pressure of oxygen is preferably higher than or equal to 5% and lower than 100%, more preferably higher than or equal to 10% and lower than 100%, still more preferably higher than or equal to 15% and lower than 100%, for example.

Depending on an apparatus used for heat treatment, a high oxygen content might degrade the apparatus. Thus, for example, when heat treatment is performed while a mixed gas is supplied to a chamber of an apparatus, the ratio of the oxygen gas flow rate to the total mixed gas flow rate (also referred to as the oxygen flow rate ratio) is preferably higher than or equal to 5% and lower than or equal to 50%, more preferably higher than or equal to 10% and lower than or equal to 50%, still more preferably higher than or equal to 15% and lower than or equal to 50%.

The higher the heat treatment temperature is, the more separation is facilitated. In the case where the heat treatment temperature is too high, part of the resin layer 16 is decomposed and lost in some cases. The heat treatment temperature is preferably higher than or equal to the highest temperature in the following steps. For the formation of the resin layer 16, heating at such a temperature is performed in the state where the surface of the resin layer 16 is exposed, so that a gas that can be released from the resin layer 16 can be removed. Thus, release of the gas in the following steps can be reduced.

The heat treatment temperature is preferably higher than the glass transition temperature, which is an index of the upper temperature limit of a resin material used for the resin layer 16. Heating in an oxygen-containing atmosphere at a temperature higher than the glass transition temperature allows more effective separation. Furthermore, the heat treatment temperature may be close to or higher than the 5% weight loss temperature, which is another index of the upper temperature limit of a resin material used for the resin layer 16. For example, the 5% weight loss temperature of the polyimide resin with increased heat resistance is higher than or equal to 400° C., higher than or equal to 450° C., higher than or equal to 500° C., or higher than or equal to 550° C.

Note that in the case where the heat treatment temperature is too high, depending on the structure of an apparatus used for the heat treatment, the heat treatment in an oxygen-containing atmosphere might degrade the apparatus. Thus, the temperature is determined in consideration of that.

The heat treatment temperature can be higher than or equal to 200° C. and lower than or equal to 500° C., preferably higher than or equal to 250° C. and lower than or equal to 475° C., more preferably higher than or equal to 300° C. and lower than or equal to 450° C., for example.

In addition, longer heat treatment time allows easier separation. Even in the case where the heat treatment temperature is relatively low, increasing the heat treatment time may enable separation that is as effective as that achieved when the heat treatment is performed at a high temperature. Therefore, in the case where the heat treatment temperature cannot be increased because of the structure of the apparatus, the treatment time can be increased.

The heat treatment time is longer than or equal to 5 minutes and shorter than or equal to 24 hours, preferably longer than or equal to 30 minutes and shorter than or equal to 12 hours, more preferably longer than or equal to 1 hour and shorter than or equal to 6 hours, for example. Note that in the case where a rapid thermal annealing (RTA) method is employed for the heat treatment, the heat treatment time may be shorter than 5 minutes.

As the heat treatment apparatus, any of a variety of apparatuses, e.g., an electric furnace and an apparatus for heating an object by heat conduction or heat radiation from a heating element such as a resistance heating element, can be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas that does not react with an object by heat treatment, such as nitrogen or a rare gas like argon, is used. With an RTA apparatus, the process time can be shortened and thus the RTA apparatus is preferred for mass production. Alternatively, an in-line heat treatment apparatus may be used for the heat treatment.

For example, in this embodiment, heat treatment is performed at 350° C. for an hour while a mixed gas of a nitrogen gas and an oxygen gas (the mixed gas has an oxygen flow rate ratio of 20%) is supplied to a chamber of a heat treatment apparatus.

In the case where a resin is used for a planarization layer or the like of the display device, for example, heating is generally performed under the condition where oxygen is hardly contained and at the lowest temperature in a temperature range in which the resin is cured, whereby a change in quality of the resin due to oxidation is prevented. However, in one embodiment of the present invention, heating is performed at relatively high temperature (e.g., higher than or equal to 200° C.) in the state where a surface of the layer 16a that is to be the resin layer 16 is exposed to an atmosphere where oxygen is intentionally contained. Thus, the resin layer 16 can have high separability after the heat treatment.

Note that the heat treatment sometimes makes the resin layer 16 thinner or thicker than the layer 16a. For example, removal of a solvent remaining in the layer 16a or density increase due to the progress of a reaction decreases the volume, reducing the thickness of the layer 16a, in some cases. Instead, in other cases, the volume increases when oxygen is supplied to the resin layer 16 at the time of the heat treatment, which makes the thickness of the resin layer 16 larger than that of the layer 16a.

The resin layer 16 is thick enough to cover at least the light-blocking layer 15. Preferably, the thickness of the resin layer 16 is set to be larger than that of the light-blocking layer 15, whereby a step is prevented from being formed on a surface of the resin layer 16 that covers the light-blocking layer 15, improving the flatness of a surface of the resin layer 16. The thickness of the resin layer 16 in a region overlapping with the light-blocking layer 15 is preferably greater than or equal to 10 nm and less than 10 μm, more preferably greater than or equal to 20 nm and less than or equal to 3 μm, still more preferably greater than or equal to 50 nm and less than or equal to 1 μm, for example.

The smaller the thickness of a portion of resin layer 16 that does not overlap with the light-blocking layer 15 is, the smaller the absorption amount of the light 20 in a later step of irradiation with the light 20 is. The thickness of the portion of resin layer 16 that does not overlap with the light-blocking layer 15 is preferably greater than or equal to 20 nm and less than or equal to 10 μm, more preferably greater than or equal to 40 nm and less than or equal to 5 μm, still more preferably greater than or equal to 100 nm and less than or equal to 2 μm, for example.

The resin layer 16 is thin enough to transmit at least light used in the later irradiation step. It is particularly preferred to use a material with a transmittance to the light 20 of 50% or more, preferably 60% or more, more preferably 70% or more.

Furthermore, a material with a high light transmittance is preferably used for the resin layer 16. It is preferred to use a material with a transmittance of 60% or more, preferably 70% or more, more preferably 80% or more, still more preferably 90% or more to light with wavelengths of greater than or equal to 400 nm and less than or equal to 750 nm, for example. Note that the heat treatment might make the transmittance of the resin layer 16 lower than that of the layer 16a.

Furthermore, the thermal expansion coefficient of the resin layer 16 is preferably greater than or equal to 0.1 ppm/° C. and less than or equal to 20 ppm/° C., more preferably greater than or equal to 0.1 ppm/° C. and less than or equal to 10 ppm/° C. The lower the thermal expansion coefficient of the resin layer 16 is, the more effectively damage to layers (e.g., the coloring layer 51a) formed over the resin layer 16 that is caused by stress due to expansion or contraction when heating is performed can be suppressed.

A thermosetting polyimide is a typical example of a material that can be used for the resin layer 16. For example, a photosensitive polyimide or a non-photosensitive polyimide can be used. Such a polyimide is a material that is preferably used for formation of a planarization film or the like of a display panel, and therefore, the formation apparatus and the material can be shared. Thus, there is no need to prepare another apparatus and another material to obtain the structure of one embodiment of the present invention.

In the case where a photosensitive material is used for the layer 16a that is to be the resin layer 16, part of the layer 16a can be removed by a photolithography method. For example, after the material is applied, heat treatment (also referred to as pre-baking) for removing the solvent is performed, and then light exposure is performed. Next, development is performed, whereby an unnecessary portion can be removed.

The method for forming the layer 16a that is partly removed will be described specifically. First, a photosensitive material is applied to form a thin film and heat treatment (pre-baking treatment) is performed to remove a solvent and the like. Next, the material is exposed to light with the use of a photomask, and then developed, whereby the layer 16a that is partly removed can be formed. This method allows the resin layer 16 to be provided such that it is not located outward from a display portion.

In the case where a photosensitive resin material is used for the layer 16a, the use of an optimal light exposure method or light exposure conditions enables formation of an uneven shape in a surface of the layer 16a. For example, a multiple exposure technique or an exposure technique using a half-tone mask or a gray-tone mask can be used.

Note that a non-photosensitive resin material may be used. In that case, the layer 16a or the resin layer 16 is partly etched using a resist mask or a hard mask formed thereover, whereby a desired shape can be obtained. For example, the resin layer 16 can be formed to have an island shape or an opening or an uneven shape can be formed in the resin layer 16.

<Formation of Insulating Layer 62>

Figure 3D:
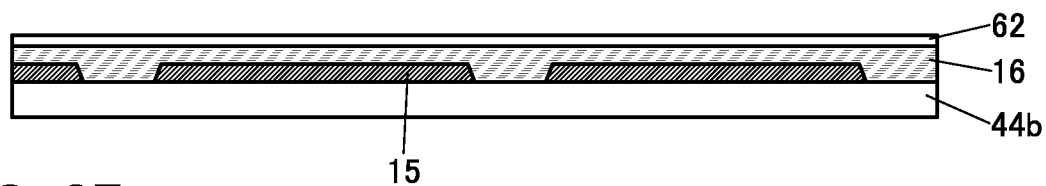

Next, the insulating layer 62 is formed over the resin layer 16 (FIG. 3D).

The insulating layer 62 has a surface that is provided with the coloring layer 51a, the coloring layer 51b, and the like. As is to be described below, in the case where the resin layer 16 is removed, a surface of the insulating layer 62 on the resin layer 16 side serves as a bonding surface to which the substrate 41b is bonded.

The insulating layer 62 can be formed by a method similar to that of the insulating layer 81.

<Formation of Conductive Layer 25 and Alignment Film 53b>

Then, the coloring layer 51a, the coloring layer 51b, and the like are formed over the insulating layer 62, and the insulating layer 61 is formed to cover them. In addition, the conductive layer 25 is formed over the insulating layer 61. The conductive layer 25 can be formed by a method similar to that of the conductive layer 71 or the like. Alternatively, the conductive layer 25 may be formed to have an island shape by a film formation method using a shielding mask.

Figure 3E:
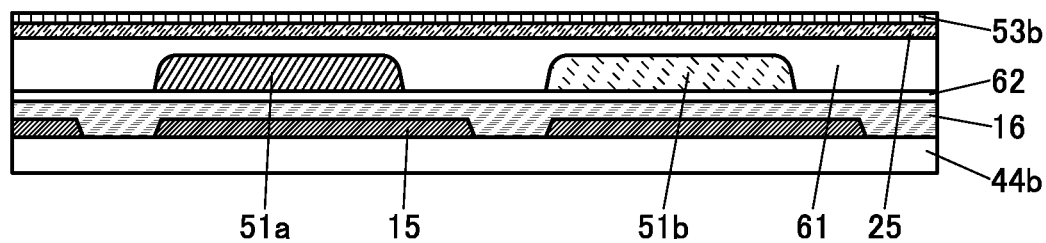

Then, the alignment film 53b is formed over the conductive layer 25 (FIG. 3E). The alignment film 53b can be formed by a method similar to that of the alignment film 53a.

Note that the above-described forming steps of the support substrate 44a side and the above-described forming steps of the support substrate 44b side can be separately performed.

<Bonding of Support Substrate 44a and Support Substrate 44b>

Next, a bonding layer (not illustrated) for bonding the support substrates 44a and 44b is formed on any one of the support substrates 44a and 44b or both of them. The bonding layer is formed to surround a region in which a pixel is positioned. The bonding layer can be formed by a screen printing method, a dispensing method, or the like. For the bonding layer, a thermosetting resin, an ultraviolet curable resin, or the like can be used. Alternatively, a resin which is cured when heated after pre-cured by ultraviolet light, or the like may be used. Alternatively, a thermosetting and ultraviolet curable resin or the like may be used.

Next, a composition to be the liquid crystal layer 24 is dripped in a region surrounded by the bonding layer by a dispensing method or the like. Specifically, a composition containing the liquid crystal 12, the monomer 13, and a polymerization initiator is dripped. Furthermore, the composition may include a chiral material and the like.

Then, the support substrate 44a and the support substrate 44b are bonded such that the composition to be the liquid crystal layer 24 is positioned therebetween, and the bonding layer is cured. The bonding is preferably performed in a reduced-pressure atmosphere because air bubbles and the like can be prevented from entering a region between the support substrate 44a and the support substrate 44b.

Note that the composition to be the liquid crystal layer 24 may be injected in a reduced-pressure atmosphere through a gap formed in the bonding layer after the support substrates 44a and 44b are bonded to each other. In addition, after the composition to be the liquid crystal layer 24 is dripped, particulate gap spacers may be dispersed in a region where the pixel is provided or outside the region, or a composition containing the gap spacers may be dripped.

Figure 4A:
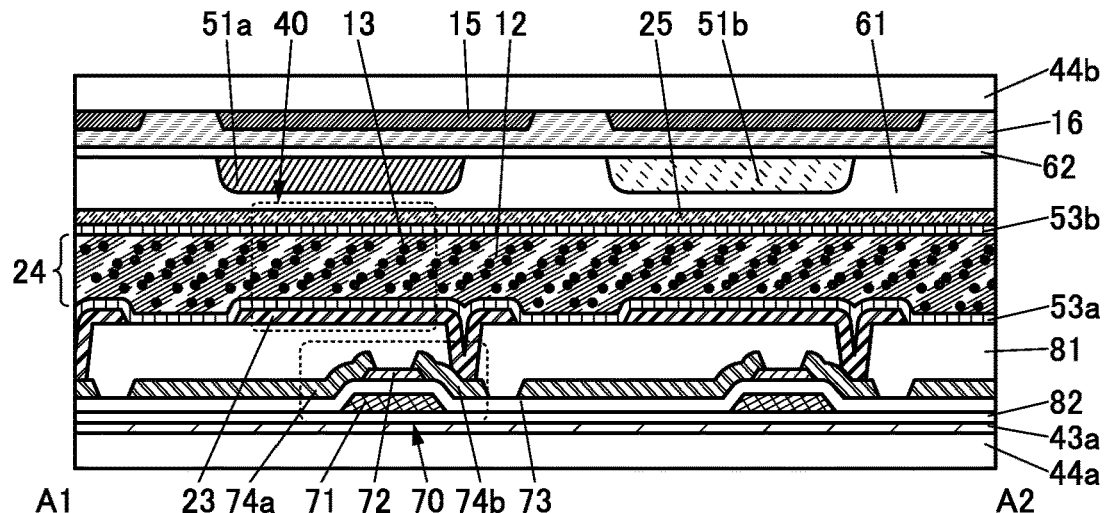
FIGS. 4A to 4C illustrate a method for manufacturing a display device of an embodiment.

At this time, the liquid crystal element 40 containing the conductive layer 23, the conductive layer 25, and the liquid crystal 12 is formed (FIG. 4A). Note that at this time, the partition walls 11 are not formed yet and the concentration of the monomers 13 contained in the liquid crystal layer 24 is high.

<Formation of Partition Wall 11>

Figure 4B:
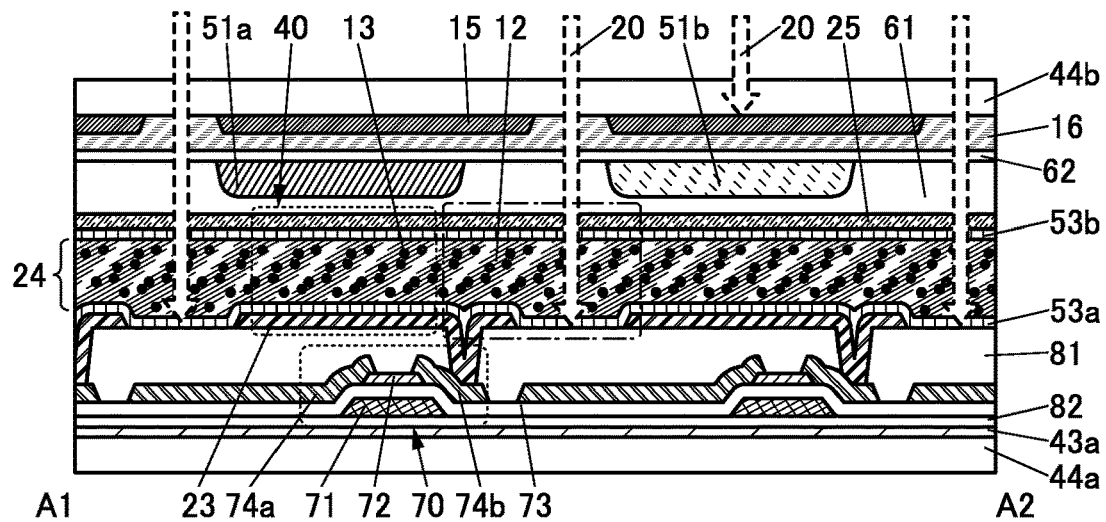

Next, light 20 is emitted from the support substrate 44b side (FIG. 4B).

As the light 20, light with a wavelength and intensity with which the polymerization initiator reacts can be used. For example, as the light 20, ultraviolet light with a wavelength of 100 nm to 400 nm can be used. Light with a wavelength of 200 nm to 400 nm is preferably used because absorption due to the air can be suppressed. Typical examples include light with a wavelength of 254 nm, light with a wavelength of 365 nm, light with a wavelength of 385 nm, and the like. The light 20 can be generated using a light source such as a high-pressure mercury lamp, a low-pressure mercury lamp, a metal halide lamp, a xenon lamp, or an LED. Other than a lamp and an LED, a laser such as an excimer laser may be used as a light source.

As the light 20, light which is as close to parallel light as possible is preferably used so that the light is perpendicularly incident on the surface of the support substrate 44b. In particular, in the case where a plurality of light sources are used because the support substrate 44b is large, for example, the light might be incident in an oblique direction. In that case, a slit or the like for making the light from the light source close to parallel light is preferably provided between the light source and the support substrate 44b.

As illustrated in FIG. 4B, in a region where the light-blocking layer 15 is not provided, the light 20 is emitted to the liquid crystal layer 24. In contrast, in a region where the light-blocking layer 15 is provided, the light 20 is blocked by the light-blocking layer 15 and does not reach the liquid crystal layer 24.

Here, the light 20 needs to be emitted to reach the liquid crystal layer 24 through the resin layer 16. Thus, a material that transmits the light 20 is preferably used for the resin layer 16. In the case where a material that easily absorbs ultraviolet light is used for the resin layer 16, for example, it is important to use a film that is thin enough to transmit the light 20 and to use appropriate conditions for irradiation with the light 20 in consideration of absorption by the resin layer 16.

For example, in the case where polyimide that absorbs ultraviolet light is used for the resin layer 16, the thickness of a portion of the resin layer 16 that does not overlap with the light-blocking layer 15 is set to greater than or equal to 20 nm and less than or equal to 10 µm, preferably greater than or equal to 40 nm and less than or equal to 5 µm, more preferably greater than or equal to 100 nm and less than or equal to 2 µm. This allows the partition wall 11 to be formed without a particular irradiation apparatus.

In addition, it is preferable that the output and the irradiation time of the irradiation apparatus be adjusted and the light 20 be emitted under the condition where the energy of light that reaches the liquid crystal layer 24 is higher than or equal to 0.1 J/cm$^2$ and lower than or equal to 100 J/cm$^2$, preferably higher than or equal to 1 J/cm$^2$ and lower than or equal to 50 J/cm$^2$.

Here, the transistor 70 has a bottom-gate structure in which the conductive layer 71 serving as a gate is positioned on the insulating layer 82 side. Thus, covering the semiconductor layer 72 of the transistor 70 with the conductive layer 23 as illustrated in FIG. 4B prevents scattered light from reaching the semiconductor layer 72 even in the case where part of the light 20 is scattered, so that the electrical characteristics of the transistor 70 are prevented from being changed. Note that in the case where a transmissive liquid crystal element is used as the liquid crystal element 40, a layer that blocks visible light is preferably provided between the semiconductor layer 72 and the conductive layer 23 because the conductive layer 23 has light transmittance. For example, a conductive layer that serves as a second gate of the transistor is preferably provided between the semiconductor layer 72 and the conductive layer 23.

Figure 5:
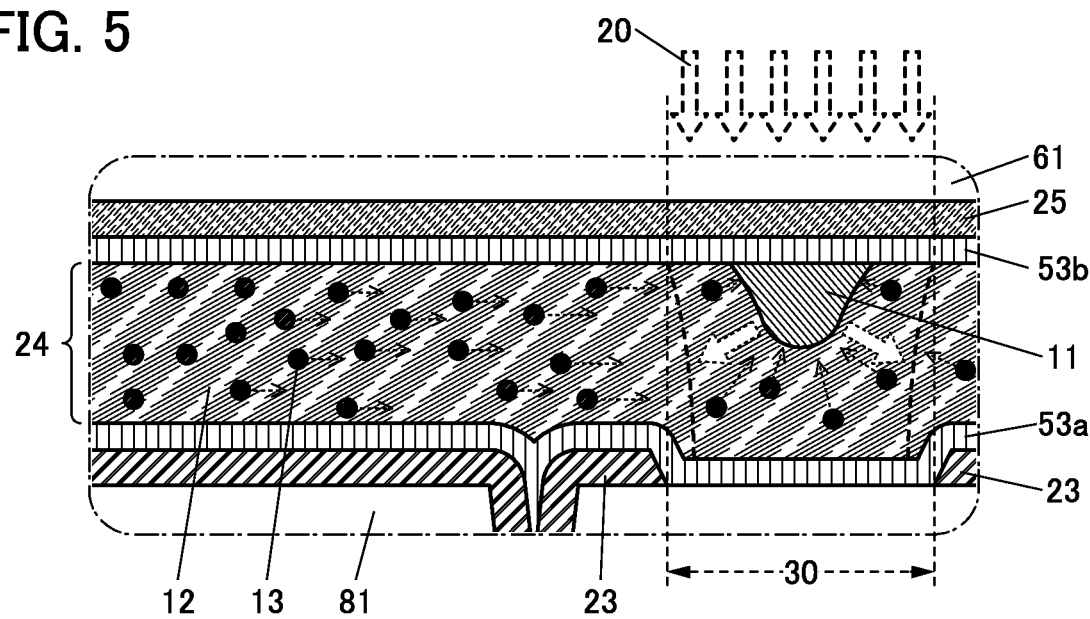
FIG. 5 illustrates a method for manufacturing a display device of an embodiment.

FIG. 5 is an enlarged view of a region shown by dashed-dotted line in FIG. 4B. FIG. 5 is a conceptual diagram of a process in which the light 20 starts to be emitted and the polymerization of the monomers 13 proceeds.

A region to which the light 20 is emitted without being shielded by the light-blocking layer 15 and the like is referred to as an irradiation region 30. In the irradiation region 30, when the light 20 is emitted, radicals are generated by the polymerization initiator in the liquid crystal layer 24, and thus the monomers 13 start to be polymerized. As the polymerization proceeds, the partition wall 11 including a polymer grows as illustrated in FIG. 5.

Here, in some cases, the polymerization of the monomers 13 is accompanied by decrease in the concentration of the monomers 13 contained in the liquid crystal layer 24 in and in the vicinity of the irradiation region 30, resulting in concentration distribution where the concentration of the monomers 13 increases as the distance from the irradiation region 30 increases. The monomers 13 are diffused from where the concentration of the monomers 13 is higher to where the concentration of the monomers 13 is lower to uniform the concentration distribution, in some cases. In that case, some of the monomers 13 are diffused toward the irradiation region 30 as shown by arrows in FIG. 5. Thus, the concentration of the monomers 13 in the liquid crystal layer 24 in a region overlapping with the conductive layer 23 after the irradiation with the light 20 is lower than that before the irradiation. In the case where the concentration of the monomers 13 contained in the liquid crystal layer 24 is sufficiently low or the monomers 13 are easily diffused into the liquid crystal layer 24, the concentration of the monomers 13 after the irradiation with the light 20 is too low to be measured, in some cases.

The optimal concentration of the monomers 13 in the liquid crystal layer 24 before the irradiation with the light 20 can be determined in accordance with the area of the irradiation region 30 with the light 20. For example, when the area proportion of the irradiation region 30 to a region where pixels are arranged (also referred to as a display region) is α % (α>0), the weight concentration of the monomers 13 in the liquid crystal layer 24 is preferably set within a range from (α−x) wt % to (α+x) wt %. Alternatively, the volume concentration of the monomers 13 in the liquid crystal layer 24 is preferably set within a range from (α−x) % to (α+x) %. Here, x=0.5α is satisfied, x=0.3α is preferably satisfied, and x=0.2α is more preferably satisfied. As a result, the concentration of the monomers 13 in the liquid crystal layer 24 in a portion functioning as the liquid crystal element 40, after the irradiation with the light 20, can be reduced.

When the polymerization of the monomers 13 proceeds, in the irradiation region 30, the partition wall 11 in contact with both the alignment film 53a and the alignment film 53b is formed. The partition wall 11 has a function of bonding the alignment film 53a and the alignment film 53b to each other.

Although the partition wall 11 grows from the alignment film 53b side in FIG. 5, FIG. 5 is only a conceptual diagram and the partition wall 11 can grow through a variety of the processes. For example, the partition wall 11 grows while millions of small polymers formed in the liquid crystal layer 24 are connected, in some cases. Alternatively, in the case where the intensity of the light 20 is so high that the light 20 reaches the alignment film 53a while having a sufficient intensity or the light 20 is reflected by the conductive layer (e.g., the conductive layer 71, the conductive layer 74a, or the conductive layer 74b) located on the support substrate 44a side and emitted to the liquid crystal layer 24 again, the polymer may grow also from the alignment film 53a side and is connected to the polymer growing from the alignment film 53b side. Which growth process the partition walls 11 are formed through can be roughly determined from the cross-sectional shape of the partition wall 11.

Figure 4C:
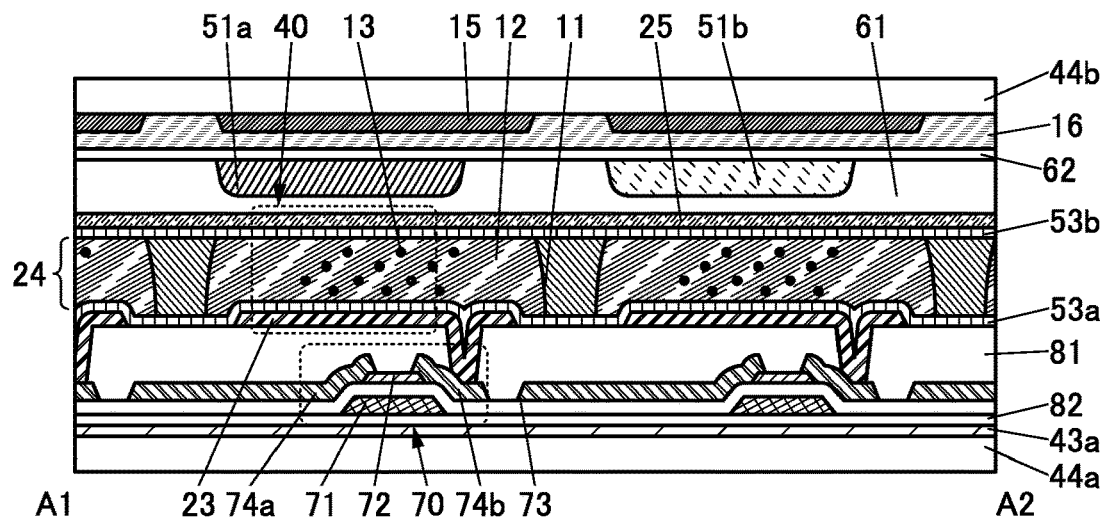

The partition wall 11 can be formed through the above steps (FIG. 4C).

In the above-described manufacturing method, depending on the irradiation condition of the light 20 or due to the scattering of the light 20, the partition wall 11 is formed also in a region of the liquid crystal layer 24 overlapping with the conductive layer 23, in some cases.

Here, in some cases, a region overlapping with the conductive layer 23 has concentration distribution where the concentration of the monomers 13 decreases as the distance from the partition wall 11 decreases and the concentration of the monomers 13 increases as the distance from the partition wall 11 increases.

Furthermore, in a region overlapping with the conductive layer 23, the polymerization initiator which does not react remains in some cases. In the case where both the monomers 13 and the polymerization initiator remain in the liquid crystal layer 24, the polymerization reaction of the monomers 13 might occur because of ultraviolet light in external light, or the like. However, in the display device 10, the coloring layer 51a and the like are provided closer to the display surface side than the liquid crystal layer 24; thus, the ultraviolet light in external light can be prevented from reaching the liquid crystal layer 24. Therefore, even when the monomers 13 and the polymerization initiator remain, the polymerization reaction does not occur in the usage environment, and a highly reliable display device can be fabricated.

<Separation of Support Substrate 44b>

Figure 6A:
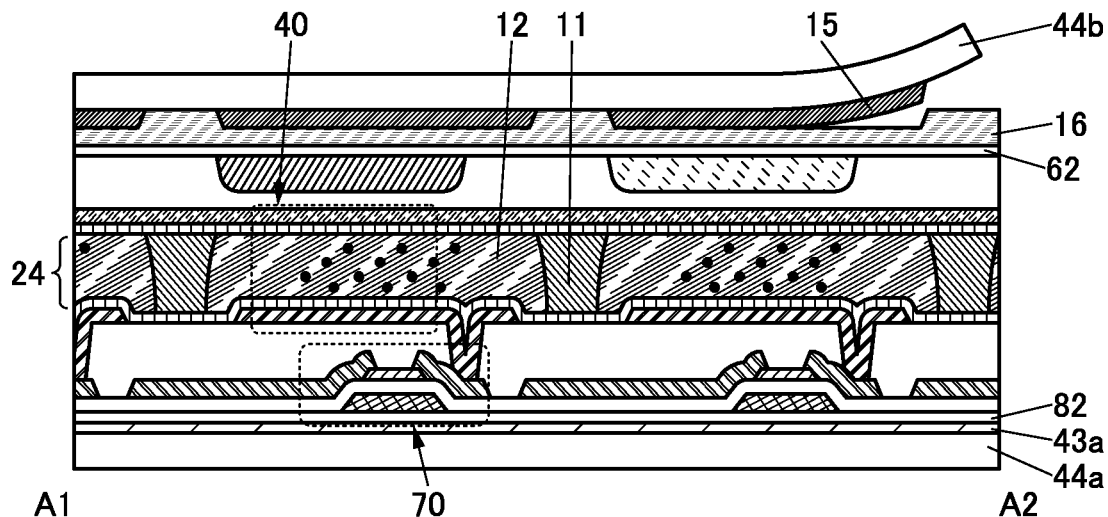
FIGS. 6A to 6C illustrate a method for manufacturing a display device of an embodiment.

Next, separation between the resin layer 16 and each of the support substrate 44b and the light-blocking layer 15 is performed to remove the support substrate 44b and the light-blocking layer 15 (FIG. 6A).

The partition walls 11 are preferably formed before the separation is performed, in this manner. Here, the plurality of partition walls 11 that bond the support substrate 44a and resin layer 16 to each other can be provided such that each of the partition walls 11 is positioned between adjacent pixels, increasing the strength of adhesion between the support substrate 44a and the resin layer 16. Thus, the separation in the liquid crystal layer 24 is suppressed in the step of performing the separation, so that the support substrate 44b can be separated with a higher yield.

As the method for separating the support substrate 44b from the resin layer 16 and the like, applying mechanical force and making a liquid permeate the separation interface by dripping the liquid or soaking the support substrate 44b in the liquid are given as examples. Alternatively, separation may be performed by heating or cooling two layers of the separation interface and utilizing a difference in thermal expansion coefficient between the two layers.

In addition, treatment for exposing part of the separation interface may be performed before the separation is performed. For example, a gap is formed between the resin layer 16 and the support substrate 44b with lasers or a sharp tool. Accordingly, the separation can be performed with the gap used as a trigger (separation start point).

Figure 6B:
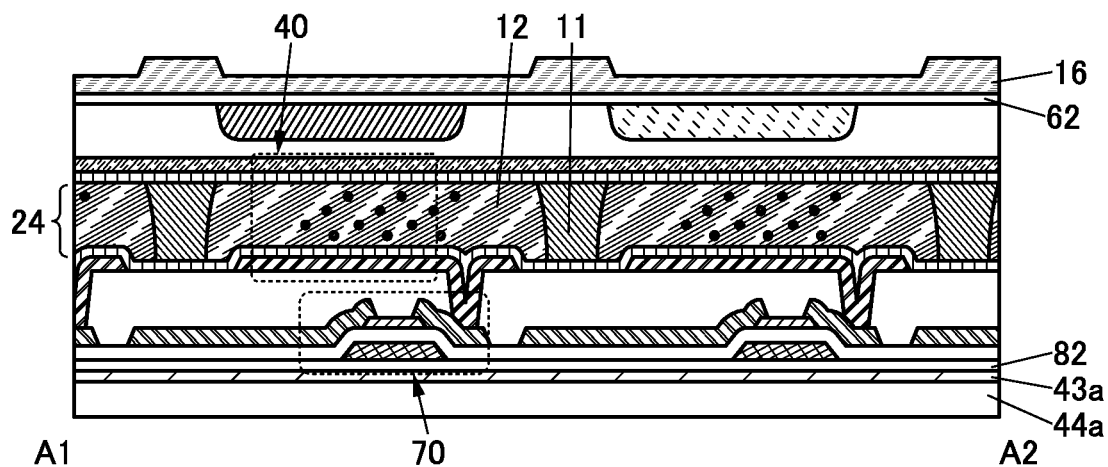

FIG. 6B illustrates the state after the removal of the support substrate 44b and the light-blocking layer 15. As illustrated in FIG. 6B, the top surface of the resin layer 16 has depressions that correspond to portions from which the light-blocking layer 15 is removed.

<Removal of Resin Layer 16>

Here, the resin layer 16 is preferably removed.

To remove the resin layer 16, a dry etching method is preferably used. Since the resin layer 16 contains an organic resin, it is particularly preferred to perform plasma treatment (ashing treatment) in an oxygen-containing atmosphere. In the case where an oxide film is used for the insulating layer 62, the oxide film, which is not easily etched by ashing treatment, can serve as an etching stopper when the resin layer 16 is processed.

<Bonding of Substrate 41b>

Figure 6C:
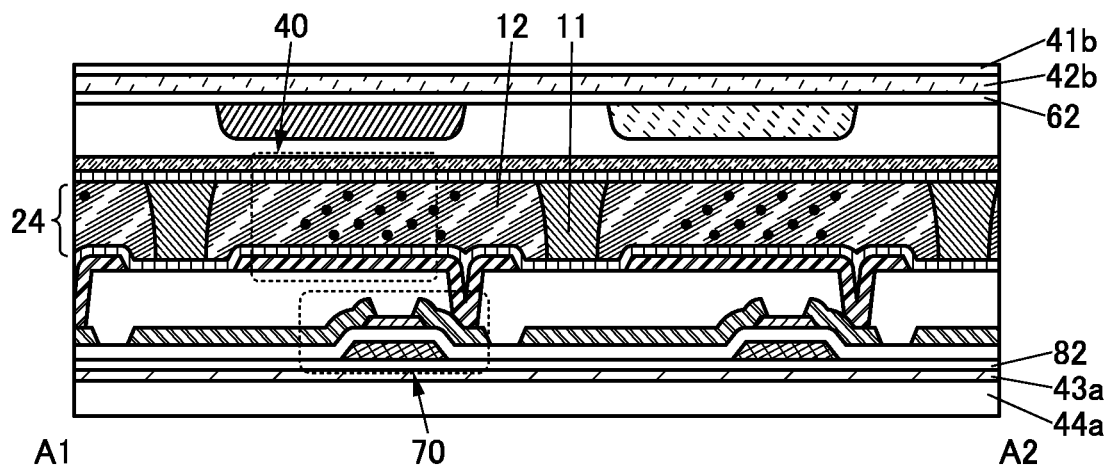

Then, the insulating layer 62 and the substrate 41b are bonded to each other with the bonding layer 42b (FIG. 6C). For the bonding layer 42b, a thermosetting resin, an ultraviolet curable resin, or the like can be used.

<Separation of Support Substrate 44a>

Figure 7A:
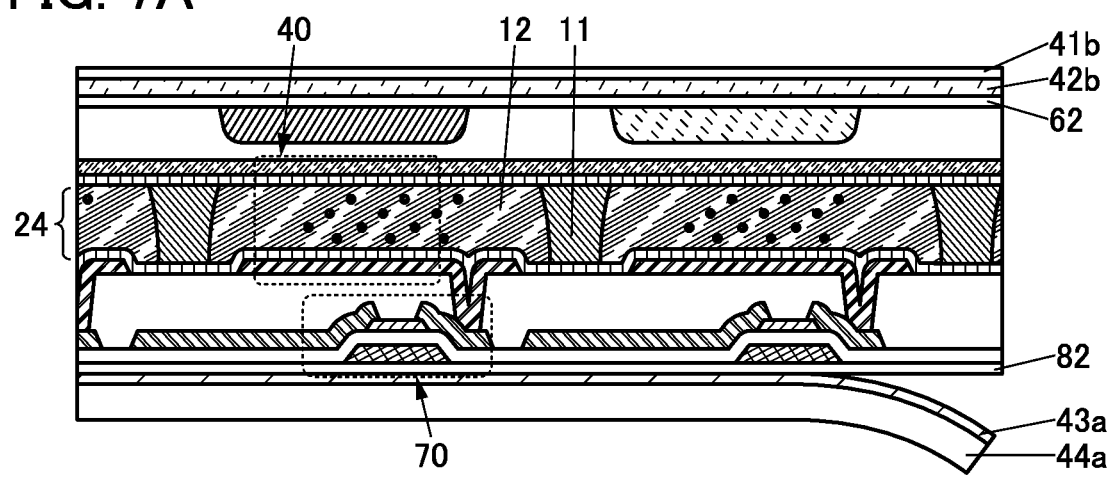
FIGS. 7A and 7B illustrate a method for manufacturing a display device of an embodiment.

Next, separation is performed between the insulating layer 82 and the separation layer 43a, whereby the support substrate 44a and the separation layer 43a are removed (FIG. 7A).

As the method for separating the support substrate 44a from the insulating layer 82, applying mechanical force, etching the separation layer, and making a liquid permeate the separation interface by dripping the liquid or soaking the support substrate 44a in the liquid are given as examples. Alternatively, separation may be performed by heating or cooling two layers of the separation interface and utilizing a difference in thermal expansion coefficient between the two layers.

In addition, treatment for exposing part of the separation interface may be performed before the separation is performed. For example, with lasers or a sharp tool, part of the insulating layer 82 on the separation layer 43a is removed.

Thus, a portion in which the insulating layer 82 is removed is used as a trigger to perform the separation.

After the separation, part of the separation layer 43a remains on the surface of the insulating layer 82 in some cases. In that case, the remaining separation layer 43a may be removed by washing, etching, wiping, or the like. When the remaining separation layer 43a does not affect the operation of the display device 10, the remaining separation layer 43a is not necessarily removed. In that case, a layer containing an element that is contained in the separation layer 43a remains between the insulating layer 82 and the bonding layer 42b, which is described later.

<Bonding of Substrate 41a>

Then, the insulating layer 82 and the substrate 41a are bonded to each other with the bonding layer 42a. For the bonding layer 42a, a thermosetting resin, an ultraviolet curable resin, or the like can be used.

Figure 7B:
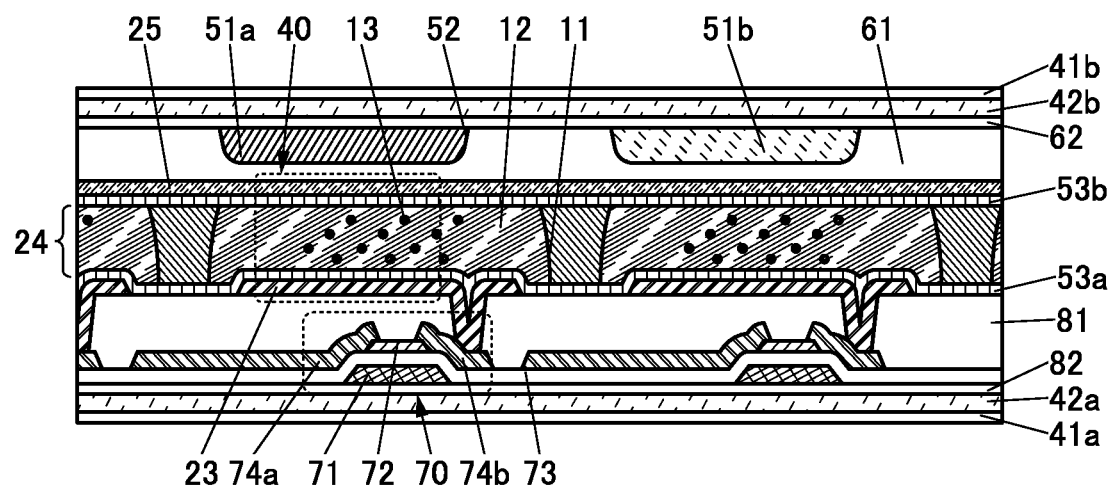

Through the above steps, the display device can be fabricated (FIG. 7B). FIG. 7B is the same as FIG. 1B.

Here, the process of removing the support substrate 44b and bonding the substrate 41b is performed before the process of removing the support substrate 44a and the separation layer 43a and bonding the substrate 41a; however, the process of removing the support substrate 44a and the separation layer 43a and bonding the substrate 41a may be performed before the process of removing the support substrate 44b and bonding the substrate 41b. Alternatively, these processes may be performed concurrently.

In the manufacturing method of the display device of one embodiment of the present invention, a relatively thick support substrate is used as the support substrate 44a when the transistor 70 and the conductive layer 23 are formed; thus, the display device is easily transferred and can be manufactured with a high yield. In addition, as compared with a method in which the transistor 70 and the like are formed directly over the thin substrate 41a, a high-temperature process can be performed to form the transistor 70 and insulating layers around the transistor 70. As a result, the impurities in and in the vicinity of the transistor 70 are reduced; thus, the transistor 70 can have very high reliability.

In forming the coloring layer 51a and the like, a relatively thick support substrate is used as the support substrate 44b; thus, the display device is easily transferred and can be manufactured with a high yield. In addition, with the support substrate 44b, a high temperature can be applied when the coloring layer 51a and the like are formed; thus, a highly reliable display device in which the concentration of impurities is reduced can be obtained. In addition, as compared with a method in which the coloring layer 51a and the like are formed directly over the thin substrate 41b, the above method can reduce an influence of expansion and contraction of the support substrate 44b due to heat. Furthermore, the support substrate 44a and the support substrate 44b can be bonded to each other with high positioning accuracy because the support substrate 44a and the support substrate 44b have rigidity. Thus, misalignment between the liquid crystal element 40 and the coloring layer 51a and the like can be prevented, and an extremely high-resolution display device can be fabricated.

Furthermore, the support substrate 44b is separated and the substrate 41b with a thickness smaller than that of at least the support substrate 44b is bonded thereto, whereby a thin lightweight display device can be fabricated. In addition, the thin substrate 41b can be bonded after the coloring layer 51a and the like are formed; thus, a material which has poor heat resistance can be used for the substrate 41b, and the range of choices of materials extends and any of a variety of materials can be used for the substrate 41b. Moreover, since the thickness of the substrate 41b on the display surface side is small, a display device having excellent optical characteristics such as display contrast, color reproducibility, and viewing angle dependence as compared with the case where a relatively thick glass substrate (for example, with a thickness greater than 0.3 mm) or the like is used can be fabricated.

The above is the description of Manufacturing method example 1-1.

Modification Example of Manufacturing Method
Example 1-1

A manufacturing method example that is partly different from Manufacturing method example 1-1 will be described below. Note that portions similar to those described above will not be described below in some cases.

First, as in Manufacturing method example 1-1, the separation layer 43a, the insulating layer 82, the transistor 70, the insulating layer 81, the conductive layer 25, the alignment film 53a, and the like are sequentially formed over the support substrate 44a.

In addition, as in Manufacturing method example 1-1, the light-blocking layer 15 is formed over the support substrate 44b.

Figure 8A:
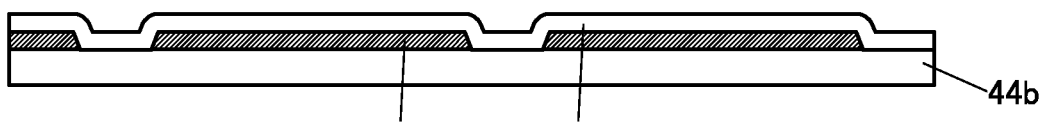
FIGS. 8A to 8D illustrate a method for manufacturing a display device of an embodiment.

Then, a buffer layer 48 is formed to cover the support substrate 44b and the light-blocking layer 15 (FIG. 8A).

Any of a variety of materials can be used for the buffer layer 48 as long as the material transmits at least the light 20 and is easily separated from the resin layer 16. For example, a conductive material such as a metal, an alloy, or an oxide conductor, a semiconductor material, or an insulating material can be used.

The inorganic insulating materials for the insulating layer 82 that are given above can preferably be used for the buffer layer 48.

Figure 8B:
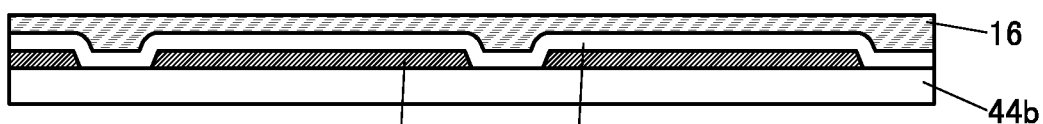
Figure 8C:
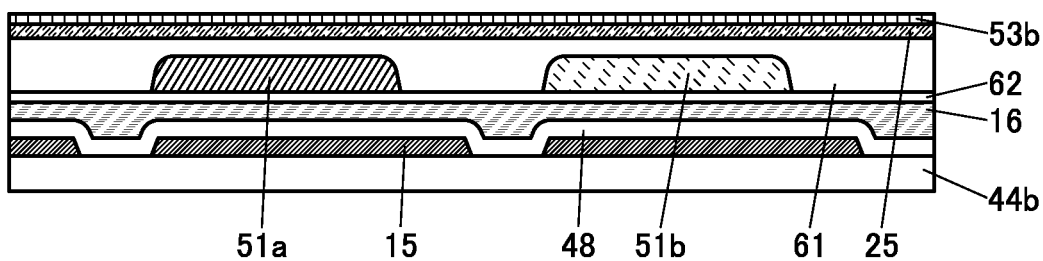

Next, the resin layer 16 is formed over the buffer layer 48 (FIG. 8B). Then, the insulating layer 62, the coloring layer 51a, the coloring layer 51b, the insulating layer 61, the conductive layer 25, and the alignment film 53b are sequentially formed over the resin layer 16 (FIG. 8C). After that, the support substrate 44a and the support substrate 44b are bonded to each other and irradiation with the light 20 is performed to form the partition walls 11.

Figure 8D:
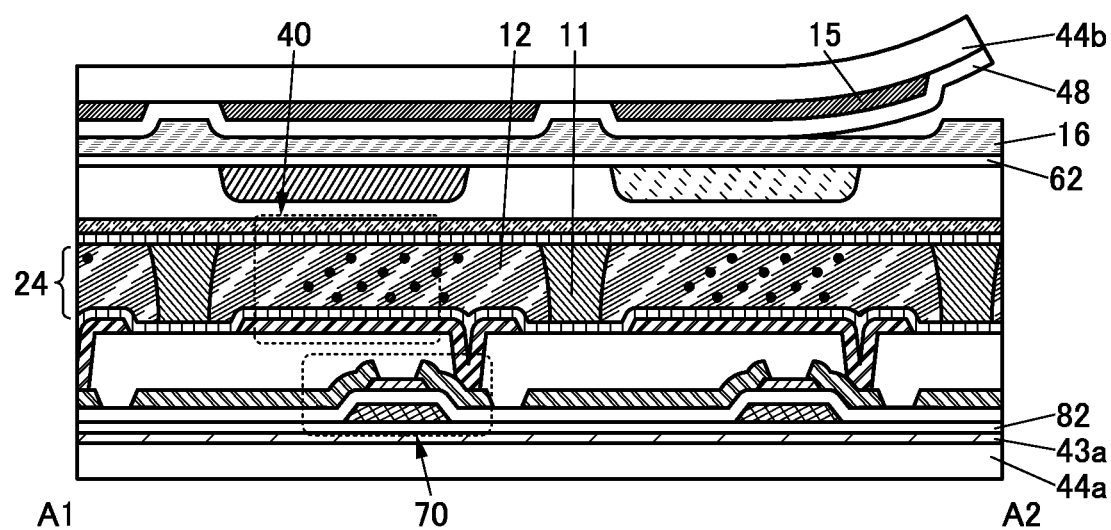

Then, separation is performed between the buffer layer 48 and the resin layer 16 to remove the support substrate 44b, the light-blocking layer 15, and the buffer layer 48 (FIG. 8D).

In Manufacturing method example 1-1, separation is performed at two interfaces, the interface between the resin layer 16 and the support substrate 44b and the interface between the resin layer 16 and the light-blocking layer 15. In the case where separation is performed at two or more separation interfaces with significantly different adhesions, separation might fail to be performed favorably. In contrast, in this manufacturing method example, separation is performed only at the interface between the resin layer 16 and the buffer layer 48; thus, failure of separation is unlikely to occur. Consequently, the yield of the separation step can be improved.

Subsequent steps can be performed in a way similar to that of Manufacturing method example 1-1.

The above is the description of Modification example of Manufacturing method example 1-1.

Cross-Sectional Structure Example 1-2

Figure 9A:
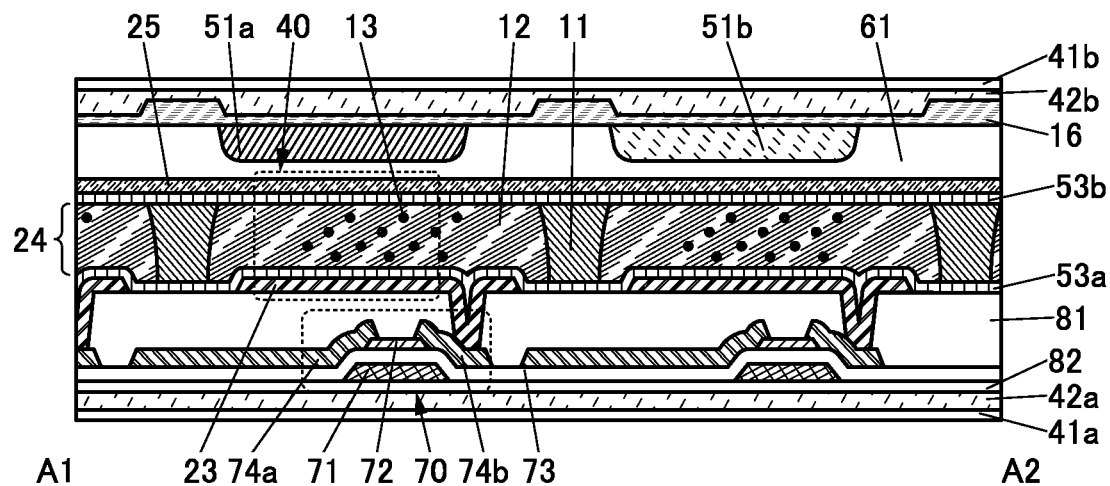
FIGS. 9A and 9B illustrate structure examples of display devices of embodiments.

The structure illustrated in FIG. 9A is an example where the resin layer 16 is not removed.

In FIG. 9A, the substrate 41b and the resin layer 16 are bonded to each other with the bonding layer 42b. In addition, the insulating layer 62 illustrated in FIG. 1A is not provided, and the coloring layer 51a and the coloring layer 51b are provided in contact with the resin layer 16.

Since the resin layer 16 is not removed, the insulating layer 62 that serves as an etching stopper used in removing the resin layer 16 is unnecessary, which can simplify the process.

Here, a material with high transmittance to visible light is preferably used as the resin layer 16. As illustrated in FIG. 9A, respective portions of the resin layer 16 that overlap with the coloring layer 51a and the coloring layer 51b are thinner than the other portion thereof by the thickness of the light-blocking layer 15; thus, deterioration of display quality can be prevented even if the resin layer 16 absorbs part of visible light.

Figure 9B:
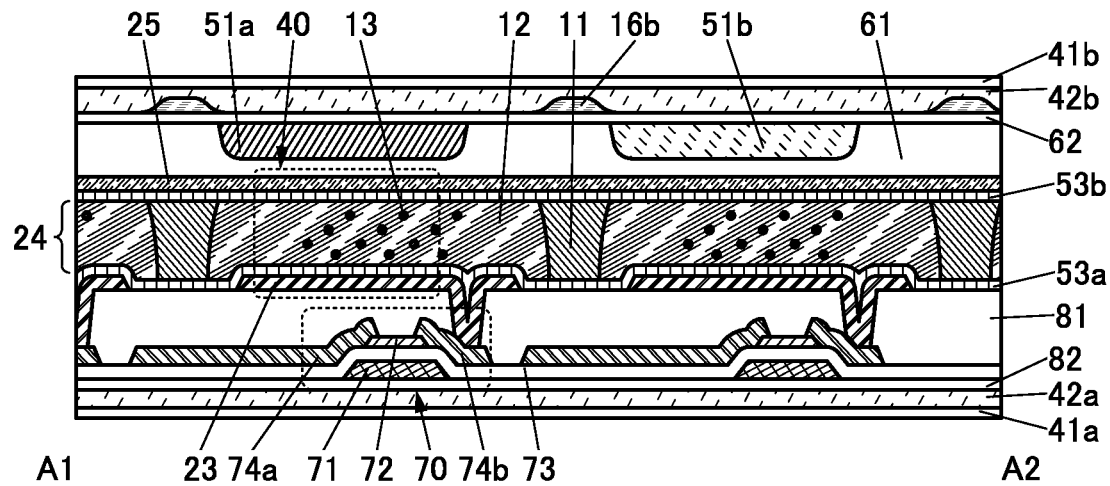

FIG. 9B illustrates an example where only thin portions of the resin layer 16 are removed. Here, the resin layers 16b remain over the insulating layer 62. The resin layers 16b are located in regions overlapping with the partition walls 11. The regions do not contribute to display, so that the remaining resin layers 16b do not decrease display quality.

Cross-Sectional Structure Example 1-3

Figure 10A:
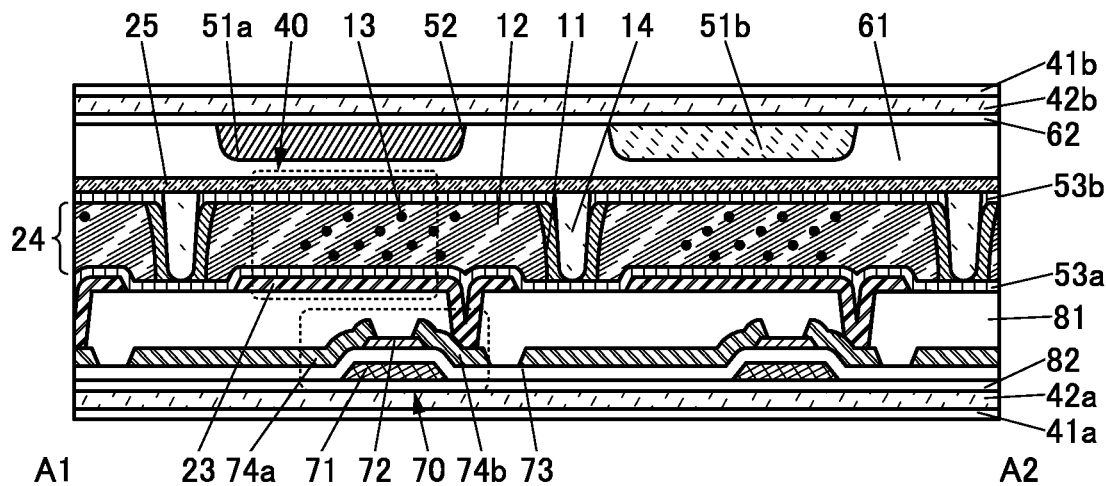
FIGS. 10A and 10B illustrate structure examples of display devices of embodiments.

FIG. 10A is a schematic cross-sectional view of a display device described below as an example. The structure illustrated in FIG. 10A is different from that in FIG. 1B mainly in including structure bodies 14.

The structure bodies 14 are provided between the conductive layer 25 and the alignment film 53b. The alignment film 53b is provided to cover the structure bodies 14. Each structure body 14 is located between the two adjacent conductive layers 23. In addition, the structure body 14 is located between the coloring layer 51a and the coloring layer 51b. The partition wall 11 is provided to surround the structure body 14.

When the substrate 41a and the substrate 41b are bonded to each other, the structure bodies 14 serve as spacers for preventing the substrates 41a and 41b from being unnecessarily close to each other and adjusting the cell gap of the liquid crystal element 40.

Since the partition wall 11 is provided to surround the structure body 14, the area of a bonding surface of the partition wall 11 is increased; thus, adhesion strength can be more increased by an anchor effect than that in the example shown in FIG. 1B.

To form the structure bodies 14, first, an insulating film to be the structure bodies 14 is formed over the conductive layer 25. For the insulating film, a photosensitive resin is preferably used. The insulating film can be formed by a spin coating method, for example. Next, the insulating film is exposed to light through a photomask, and then developed and baked, whereby the structure bodies 14 can be formed. Here, for the insulating film, a positive photosensitive material, a portion of which not irradiated with light remains after development, is preferably used.

The above is the description of Cross-sectional structure example 1-3.

Cross-Sectional Structure Example 1-4

Figure 10B:
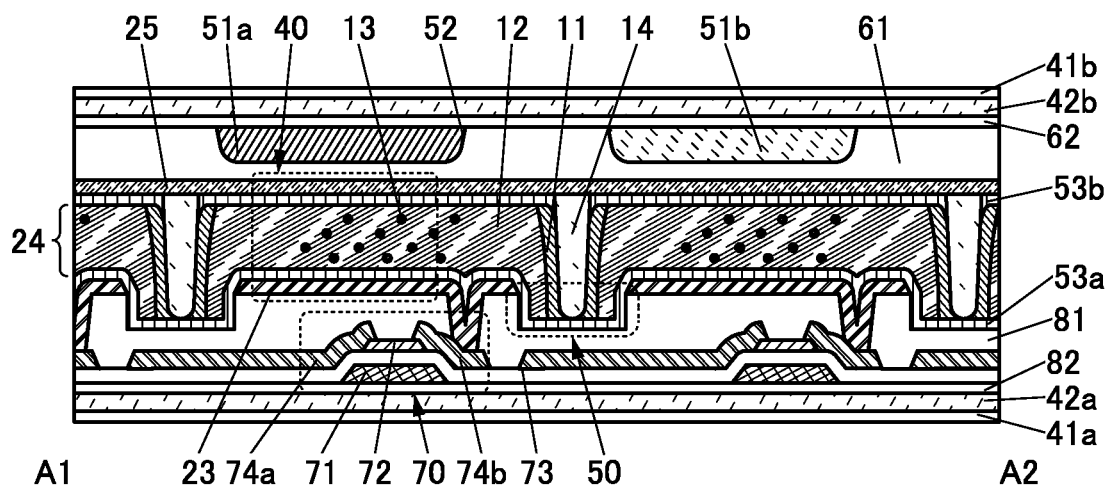

FIG. 10B is a schematic cross-sectional view of a display device described below as an example. The structure illustrated in FIG. 10B is different from that in FIG. 1B mainly in that the structure bodies 14 are provided and depressions are provided in the insulating layer 81.

The insulating layer 81 includes depressions 50. The depressions 50 are each provided in a portion not overlapping with the conductive layer 23. In other words, the insulating layer 81 includes a portion that does not overlap with the conductive layer 23 and has a smaller thickness than a portion overlapping with the conductive layer 23. The alignment film 53a is provided to cover the depressions 50 of the insulating layer 81. The top surface of the alignment film 53a has a recessed shape along the shapes of the depressions 50.

FIG. 10B illustrates an example in which the alignment film 53a is provided to cover side surfaces and the top surfaces of the depressions 50. In the case where coverage with the alignment film 53a is poor, a portion of the alignment film 53a that is in contact with the side surfaces of the depression 50 might be thinner than the other portion (e.g., a portion overlapping with the conductive layer 23), or might fail to cover the side surfaces of the depression 50 and might split.

The partition wall 11 is provided to overlap with the depression 50 of the insulating layer 81. Specifically, the partition wall 11 is provided in contact with part of the alignment film 53a that covers the top surface of the depression 50 and parts of the alignment film 53a that cover the side surfaces. Accordingly, the contact area between the partition wall 11 and the alignment film 53a is increased, so that the adhesion strength between the partition wall 11 and the alignment film 53a can be increased by an anchor effect. The partition wall 11 is preferably provided to fill the depression 50 because adhesion strength can be increased more effectively.

Note that in the case where the alignment film 53a fails to cover the side surfaces of the depression 50 of the insulating layer 81 and splits or the alignment film 53a is not provided, there may be a portion where the partition wall 11 and the insulating layer 81 are in contact with each other.

The projected structure bodies 14 are provided such that they fit respective depressions 50. When the partition wall 11 is provided in a region where both the depression 50 of the insulating layer 81 and the projected structure body 14 are provided, a better anchor effect is obtained, whereby the adhesion strength between the substrates can be more increased.

The depression 50 can be formed by, for example, etching part of the insulating layer 81 with the use of a resist mask used in forming the conductive layer 23 or etching part of the insulating layer 81 with the use of the conductive layer 23 as a hard mask.

The above is the description of Cross-sectional structure example 1-4.

Cross-Sectional Structure Example 1-5

Figure 11:
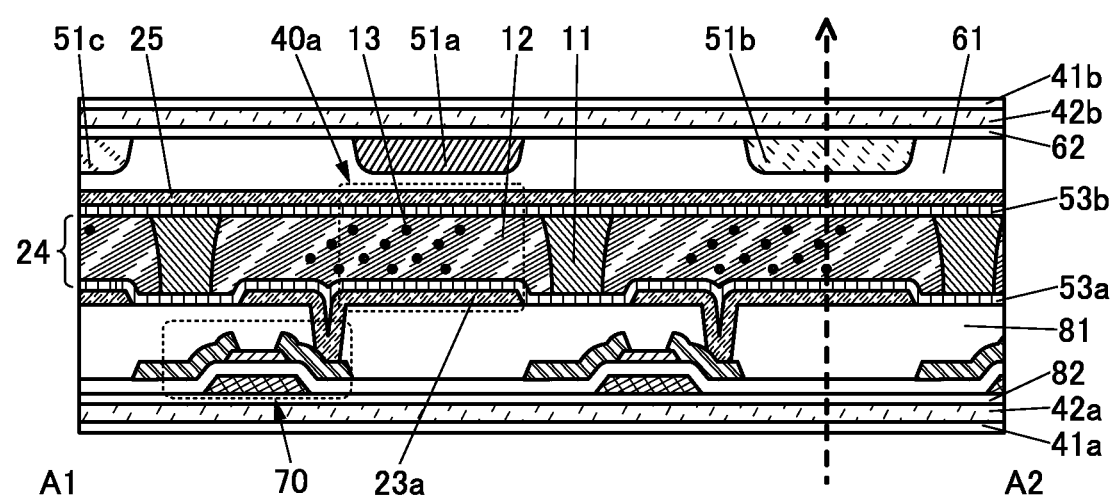
FIG. 11 illustrates a structure example of a display device of an embodiment.

FIG. 11 is a schematic cross-sectional view of a display device described below as an example. The display device illustrated in FIG. 11 is a display device using a transmissive liquid crystal element.

A liquid crystal element 40a includes a conductive layer 23a, the liquid crystal layer 24, and the conductive layer 25. Like the conductive layer 25, the conductive layer 23a transmits visible light. Thus, light incident from the substrate 41a side passes through the liquid crystal element 40a and is emitted to the substrate 41b side as shown by an arrow in FIG. 11.

Although not illustrated here, a pair of linear polarizing plates can be provided such that the substrate 41*a* and the substrate 41*b* are sandwiched therebetween. Furthermore, a backlight can be provided between the substrate 41*a* and the linear polarizing plate. The use of a circularly polarizing plate instead of the linear polarizing plate enables suppression of reflection of external light on the display surface side.

The partition wall 11, which is located in a region that does not contribute to display, is preferably placed to overlap with a conductive layer provided over the insulating layer 82, as illustrated in FIG. 11. In that case, even when an alignment defect of the liquid crystal 12 is caused in the vicinity of the partition wall 11, light leakage in the region can be suppressed, resulting in suppression of a decrease in contrast.

The above is the description of Cross-sectional structure example 1-5.

Structure Example 2

As an example of the display device of one embodiment of the present invention, a display device (display panel) which includes both a reflective liquid crystal element and a light-emitting element and can display an image in a transmissive mode, in a reflective mode, and in a hybrid mode in which both of these modes are employed simultaneously will be described below. Such a display panel can also be referred to as a transmissive OLED and reflective LC hybrid display (TR-hybrid display).

One example of such a display panel is a structure in which a liquid crystal element including an electrode that reflects visible light and a light-emitting element are stacked. In this structure, it is preferable that the electrode that reflects visible light have an opening and the opening overlap with the light-emitting element. This enables driving in the transmissive mode by which light is emitted from the light-emitting element through the opening. Furthermore, as compared with the case where the liquid crystal element and the light-emitting element are arranged side by side, in the case where the liquid crystal element and the light-emitting element are stacked, the size of a pixel including both the liquid crystal element and the light-emitting element can be reduced in a plan view; thus, a higher-resolution display device can be fabricated.

It is also preferable that a transistor for driving the liquid crystal element and a transistor included in the light-emitting element be positioned on the same plane. It is also preferable that the light-emitting element and the liquid crystal element be stacked with an insulating layer therebetween.

In one embodiment of the present invention, switching between a first mode in which an image is displayed by the reflective element, a second mode in which an image is displayed by the light-emitting element, and a third mode in which an image is displayed by the reflective element and the light-emitting element can be performed.

In the first mode, an image is displayed using light reflected by the reflective element. The first mode is a driving mode with extremely low power consumption because a light source is unnecessary, and is effective in the case where, for example, external light has a sufficiently high illuminance and is white light or light near white light. The first mode is a display mode suitable for displaying text information of a book or a document, for example. The first mode can offer eye-friendly display owing to the use of reflected light and thus has an effect of being less likely to cause eyestrain.

In the second mode, an image is displayed using light emitted by the light-emitting element. Thus, an extremely clear image (with a high contrast and high color reproducibility) can be displayed regardless of the illuminance and chromaticity of external light. For example, the second mode is effective in the case where the illuminance of external light is extremely low, such as during the nighttime or in a dark room. When a bright image is displayed under weak external light, a user may feel that the image is too bright. To prevent this, an image with reduced luminance is preferably displayed in the second mode. In that case, not only a reduction in brightness but also low power consumption can be achieved. The second mode is a mode suitable for displaying a vivid image and a smooth moving image, for example.

In the third mode, display is performed using both light reflected by the reflective element and light emitted by the light-emitting element. Specifically, the display device is driven so that light emitted from the reflective element and light emitted from the light-emitting element are mixed to express one color. A clearer image than that in the first mode can be displayed and power consumption can be lower than that in the second mode. For example, the third mode is effective when the illuminance of external light is relatively low, such as under indoor illumination or in the morning or evening, or when the external light does not represent a white chromaticity. Furthermore, the use of mixed light of reflected light and emitted light enables display of an image like a real painting.

Cross-Sectional Structure Example 2-1

Figure 12A:
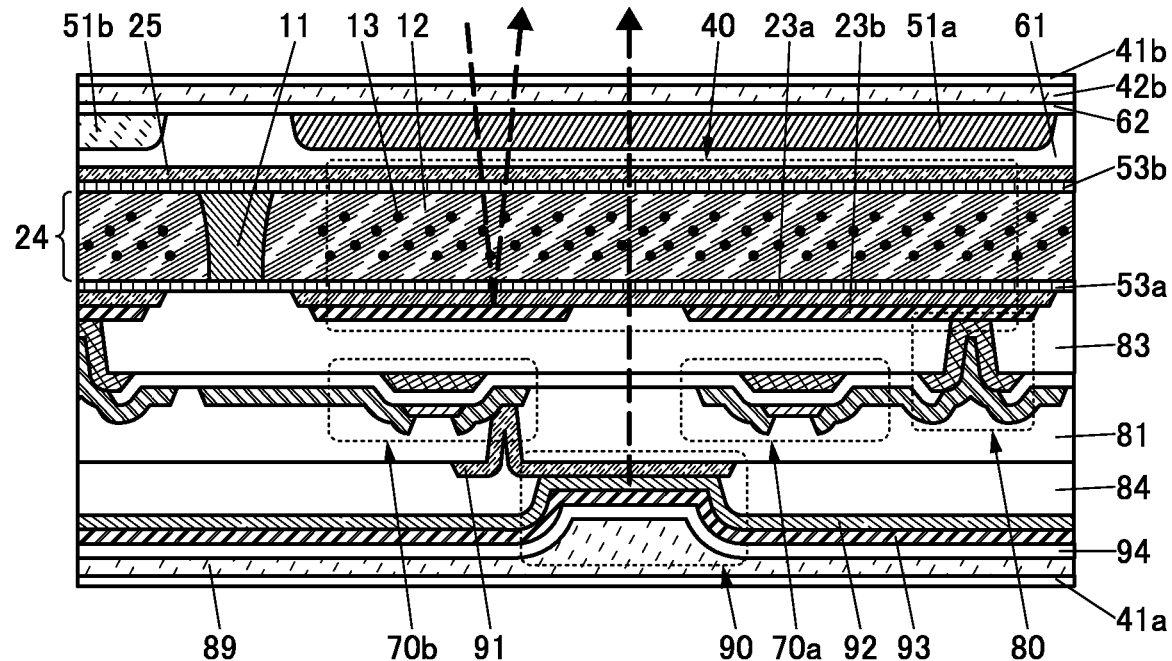
FIGS. 12A and 12B illustrate structure examples of display devices of embodiments.

FIG. 12A is a schematic cross-sectional view of a display device described below as an example. In a structure in FIG. 12A, the liquid crystal element 40 and a light-emitting element 90 overlap with each other with an insulating layer 83 therebetween. In the structure in FIG. 12A, the substrate 41*b* side corresponds to the display surface side.

The display device includes a transistor 70*a* and a transistor 70*b* which are formed on one surface of the insulating layer 83. The transistor 70*a* is electrically connected to the liquid crystal element 40 and the transistor 70*b* is electrically connected to the light-emitting element 90.

A conductive layer 91 is provided on the substrate 41*a* side of the insulating layer 81, which covers the transistors 70*a* and 70*b*, and an insulating layer 84 is provided to cover an end portion of the conductive layer 91. The conductive layer 91 and one of a source and a drain of the transistor 70*b* are electrically connected to each other through an opening provided in the insulating layer 81. The insulating layer 84 serves as a planarization layer. An EL layer 92 and a conductive layer 93 are provided on the substrate 41*a* side of the insulating layer 84. The conductive layer 91, the EL layer 92, and the conductive layer 93 form the light-emitting element 90.

Furthermore, an insulating layer 94 is provided to cover the light-emitting element 90. The insulating layer 94 serves as a barrier film. The insulating layer 94 is preferably formed by a film formation method that allows formation of a dense film even at a low temperature, such as a sputtering method or an ALD method. In addition, the insulating layer 94 may have a stacked structure of a film containing an inorganic insulating material and a film containing an organic insulating material.

The conductive layer 91 has a function of transmitting visible light. The conductive layer 93 has a function of reflecting visible light. Thus, the light-emitting element 90 is a bottom-emission light-emitting element that emits light to the conductive layer 91 side.

A stack of a conductive layer 23a and a conductive layer 23b is provided on the substrate 41b side of the insulating layer 83. In addition, the alignment film 53a is provided between the conductive layer 23a and the liquid crystal layer 24. For the structures of the liquid crystal layer 24 and a portion between the liquid crystal layer 24 and the substrate 41b, Structure example 1 can be referred to; thus, the description of the structures is omitted.

In addition, the display device includes a connection portion 80 where conductive layers provided on both sides of the insulating layer 83 are electrically connected to each other. In FIG. 12A, the connection portion 80 includes an opening provided in the insulating layer 83 and a conductive layer which is positioned in the opening and provided by processing the same conductive film as a gate of the transistor 70a and the like. One of a source and a drain of the transistor 70a and the conductive layer 23b are electrically connected to each other through the connection portion 80.

The conductive layer 23a and the conductive layer 25 each have a function of transmitting visible light. The conductive layer 23b has a function of reflecting visible light. Thus, the liquid crystal element 40 functions as a reflective liquid crystal element.

In the conductive layer 23b which reflects visible light, an opening is provided in a region overlapping with the light-emitting element 90. Light from the light-emitting element 90 is emitted to the substrate 41b side through the opening.

The display device in FIG. 12A includes the transistor 70a electrically connected to the liquid crystal element 40 and the transistor 70b electrically connected to the light-emitting element 90; thus, the liquid crystal element 40 and the light-emitting element 90 can be separately controlled. In addition, the transistors 70a and 70b can be formed on the same plane and through the same process; thus, the process can be simplified and the transistors can be manufactured with a high yield.

Manufacturing Method Example 2-1

A manufacturing method example of the display device illustrated in FIG. 12A will be described below.

First, a separation layer 43c is formed over a support substrate 44c. As the support substrate 44c, a substrate similar to the above-described support substrates 44a and 44b can be used. The separation layer 43c can be formed by a method similar to those of the above-described separation layers 43a and 43b.

Next, the conductive layer 23a is formed over the separation layer 43c. For the conductive layer 23a, an oxide conductive material is preferably used. When an oxide conductive material is used for the conductive layer 23a, separation can be favorably performed at the interface between the conductive layer 23a and the separation layer 43c. For the conductive layer 23a, a metal oxide, an oxide semiconductor material having low resistance, or the like can be used.

In the case where the oxide semiconductor material is used for the conductive layer 23a, oxygen vacancies may be generated in the oxide semiconductor material by plasma treatment, heat treatment, or the like, to increase the carrier density. Alternatively, impurities such as a rare gas of argon or the like, in addition to hydrogen and nitrogen, may be introduced in the oxide semiconductor material to increase the carrier density. Alternatively, a material to which oxygen is easily diffused may be used for the conductive layer 23b formed over the conductive layer 23a, to reduce oxygen in the oxide semiconductor. Note that two or more methods described above may be employed.

Then, the conductive layer 23b is formed over the conductive layer 23a. The conductive layer 23b can have a single-layer structure or a stacked structure that includes a metal or an alloy material. In the case where the conductive layer 23b has a stacked structure, a material having high reflectivity is preferably used for a layer in contact with the conductive layer 23a.

At that time, the conductive layer 23b is preferably processed to be positioned inward from the outline of the pattern of the conductive layer 23a so as not to be in contact with the separation layer 43c. When the conductive layer 23b and the separation layer 43c are in contact with each other, failure in separation may occur at the portion.

Next, the insulating layer 83 is formed to cover the separation layer 43c, the conductive layer 23a, and the conductive layer 23b. Then, an opening reaching the conductive layer 23b is formed in part of the insulating layer 83.

Figure 13A:
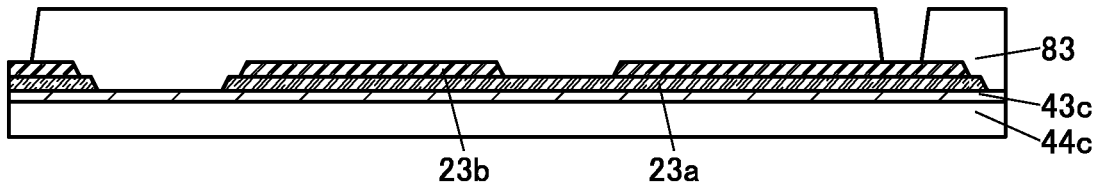
FIGS. 13A to 13D illustrate a method for manufacturing a display device of an embodiment.

FIG. 13A illustrates a schematic cross-sectional view at this stage.

Next, the transistors 70a and 70b are formed over the insulating layer 83. The transistors 70a and 70b can be formed by a method similar to that of Structure example 1.

In the step of forming gates of the transistors 70a and 70b, when a conductive film is formed and processed, a conductive layer electrically connected to the conductive layer 23b through the opening provided in the insulating layer 83 is formed at the same time. Thus, the connection portion 80 can be formed.

To electrically connect one of the source and the drain of the transistor 70a to the connection portion 80, an opening is formed in an insulating layer serving as a gate insulating layer of the transistor 70a and the like.

Then, the insulating layer 81 is formed to cover the transistors 70a and 70b. At this time, in the insulating layer 81, an opening reaching one of the source and the drain of the transistor 70b is formed. After that, the conductive layer 91 is formed over the insulating layer 81.

Figure 13B:
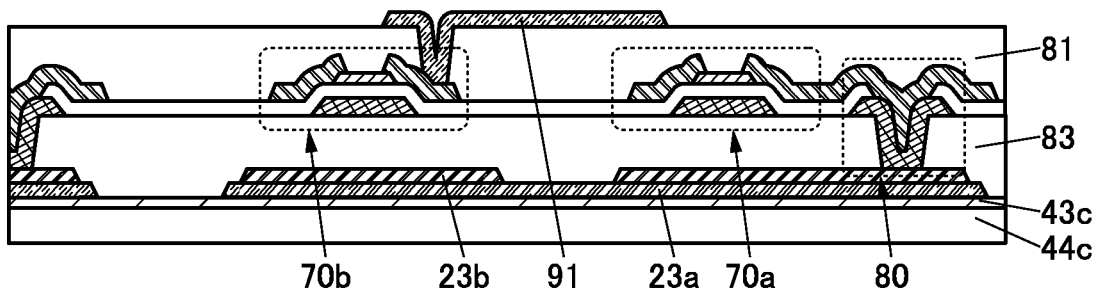

FIG. 13B illustrates a schematic cross-sectional view at this stage.

Then, the insulating layer 84 which covers the end portion of the conductive layer 91 and has an opening in a portion overlapping with the conductive layer 91 is formed. The insulating layer 84 covers the end portion of the conductive layer 91 and serves as a planarization layer. For the insulating layer 84, an organic resin is preferably used. In addition, an end portion of the insulating layer 84 preferably has a tapered shape.

Next, the EL layer 92 and the conductive layer 93 are formed in this order over the conductive layer 91 and the insulating layer 84. Then, the insulating layer 94 is formed over the conductive layer 93.

Then, the insulating layer 94 is bonded to the substrate 41a with the bonding layer 89.

Figure 13C:
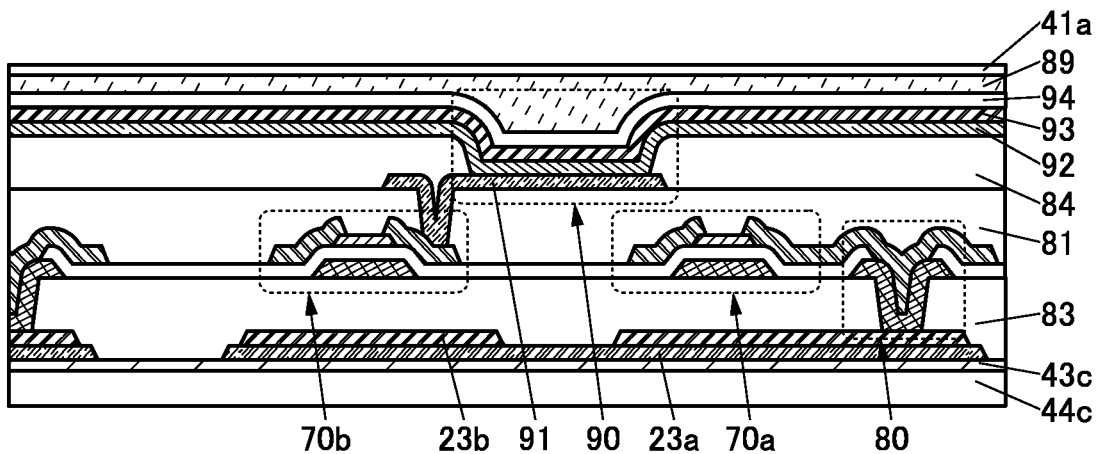

FIG. 13C illustrates a schematic cross-sectional view at this stage.

Figure 13D:
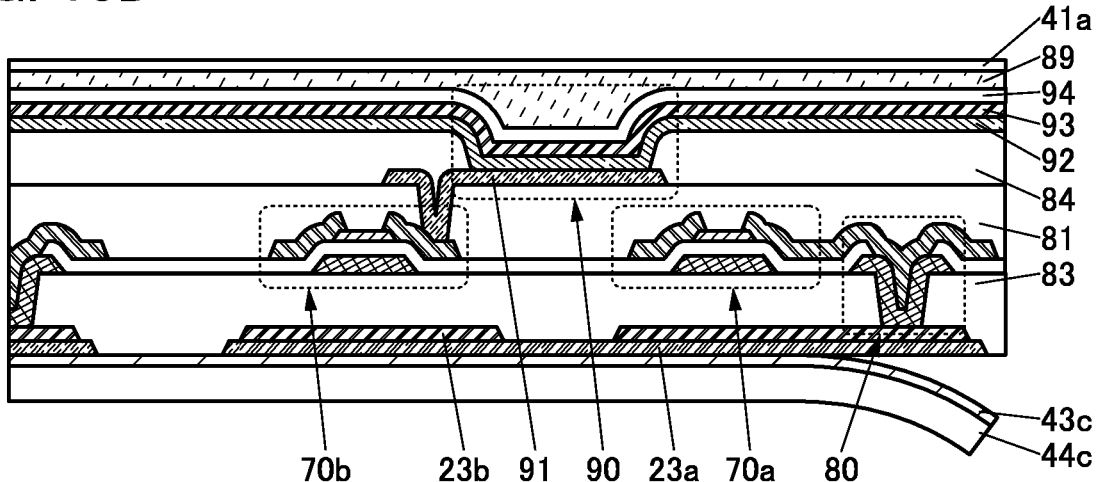

Next, separation is performed between the separation layer 43c and each of the insulating layer 83 and the conductive layer 23a, so that the support substrate 44c and the separation layer 43c are removed (FIG. 13D).

After the separation, part of the separation layer 43c remains on the surface of the conductive layer 23a and the surface of the insulating layer 83 and a thin film is formed in some cases. For example, when the remaining film has conductivity, the two conductive layers 23a of adjacent pixels, terminals formed by processing the same conductive film as the conductive layer 23a, or the like might be electrically short-circuited. In contrast, when the thin film has an insulating property, the surfaces of the conductive layer 23a, the above-described terminals, and the like are not exposed and their functions of the electrode and the terminal are lost in some cases. Thus, washing, etching, wiping, or the like is preferably performed after the separation. For the etching, either wet etching or dry etching can be used.

After that, the alignment film 53a is formed over the conductive layer 23a and the insulating layer 83.

Figure 14A:
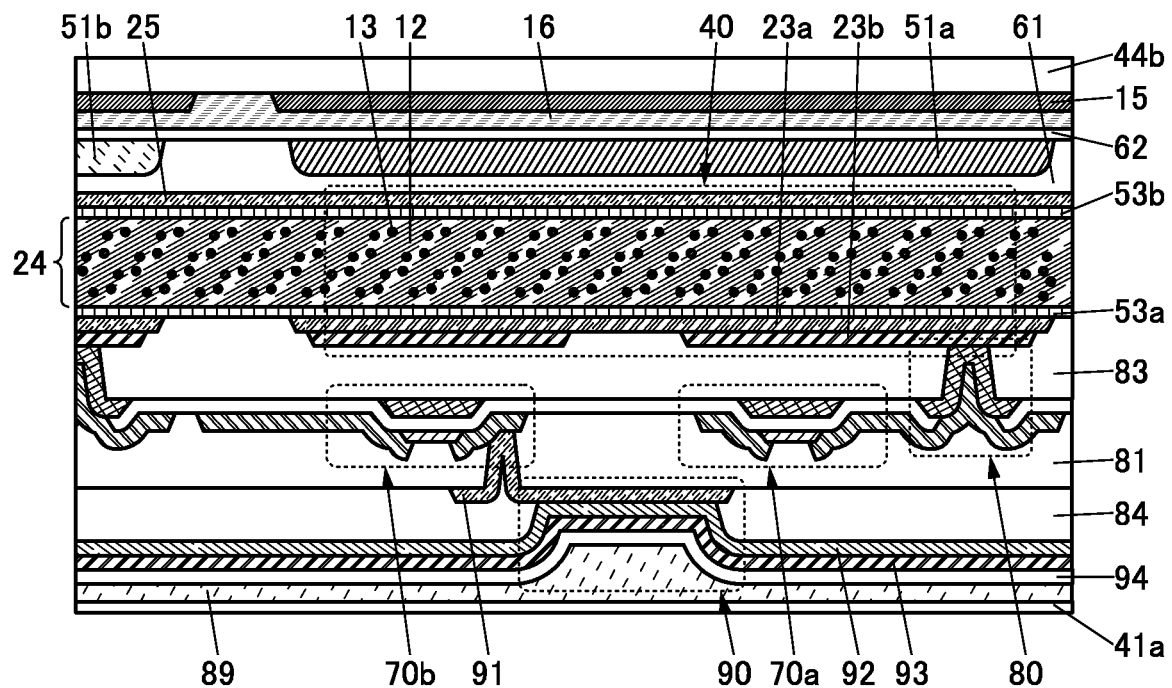
FIGS. 14A and 14B illustrate a method for manufacturing a display device of an embodiment.

Next, the support substrate 44b provided with the light-blocking layer 15, the resin layer 16, the coloring layer 51a, the coloring layer 51b, the insulating layer 61, the insulating layer 62, the conductive layer 25, the alignment film 53b, and the like in advance is prepared. Then, the support substrate 44b and the substrate 41a are bonded to each other with the liquid crystal layer 24 therebetween (FIG. 14A).

Figure 14B:
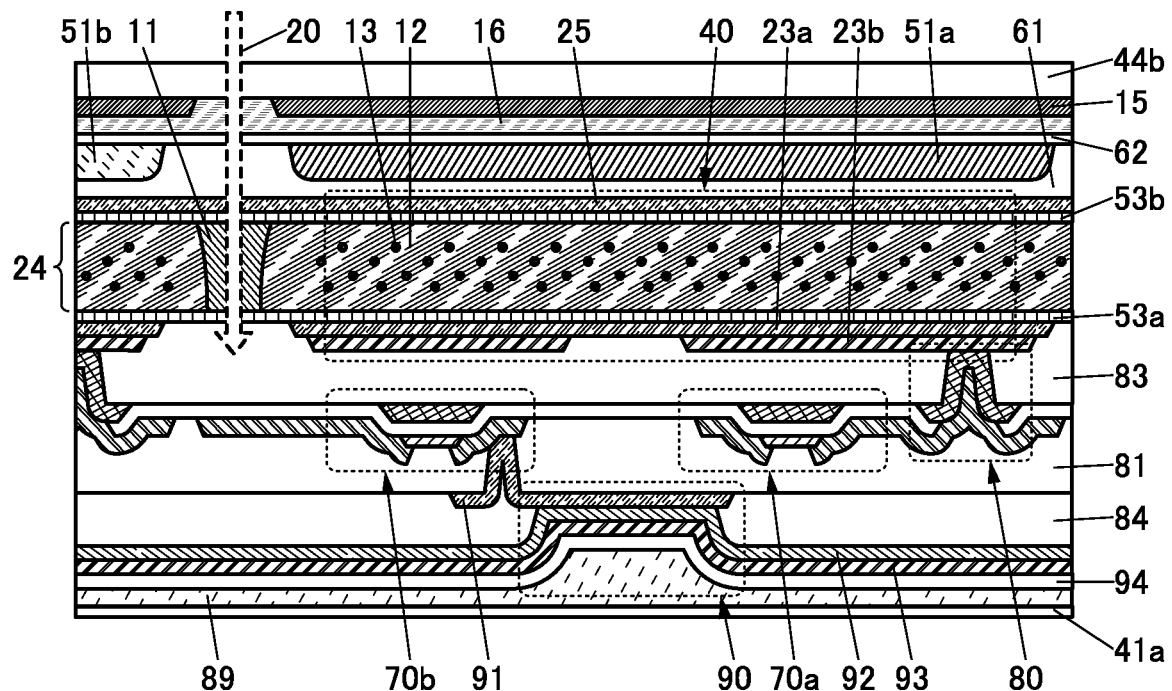

Then, the light 20 is emitted from the support substrate 44b side (FIG. 14B). Here, the light 20 is emitted to a portion of the liquid crystal layer 24 that does not overlap with the light-blocking layer 15, whereby the partition wall 11 is formed. In addition, a region where the light-emitting element 90 is provided is preferably covered with the light-blocking layer 15. In that case, the EL layer 92 and the like in the light-emitting element 90 can be inhibited from being irradiated with the light 20, preventing deterioration of the light-emitting element 90.

Figure 15A:
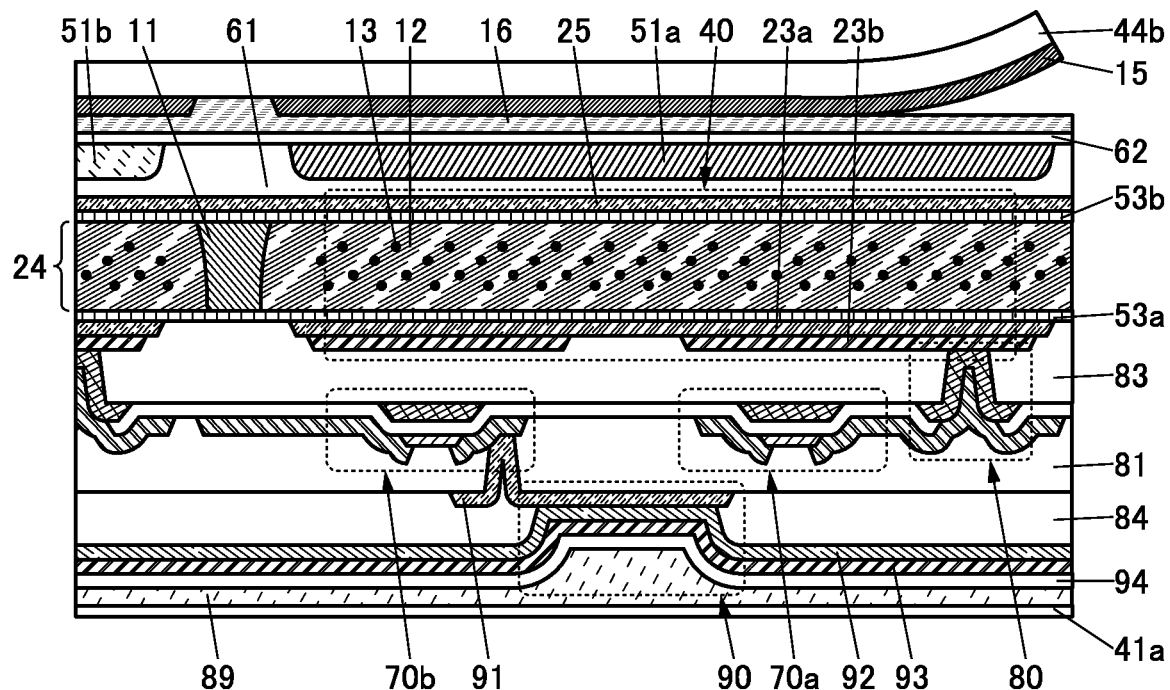
FIGS. 15A and 15B illustrate a method for manufacturing a display device of an embodiment.
Figure 15B:
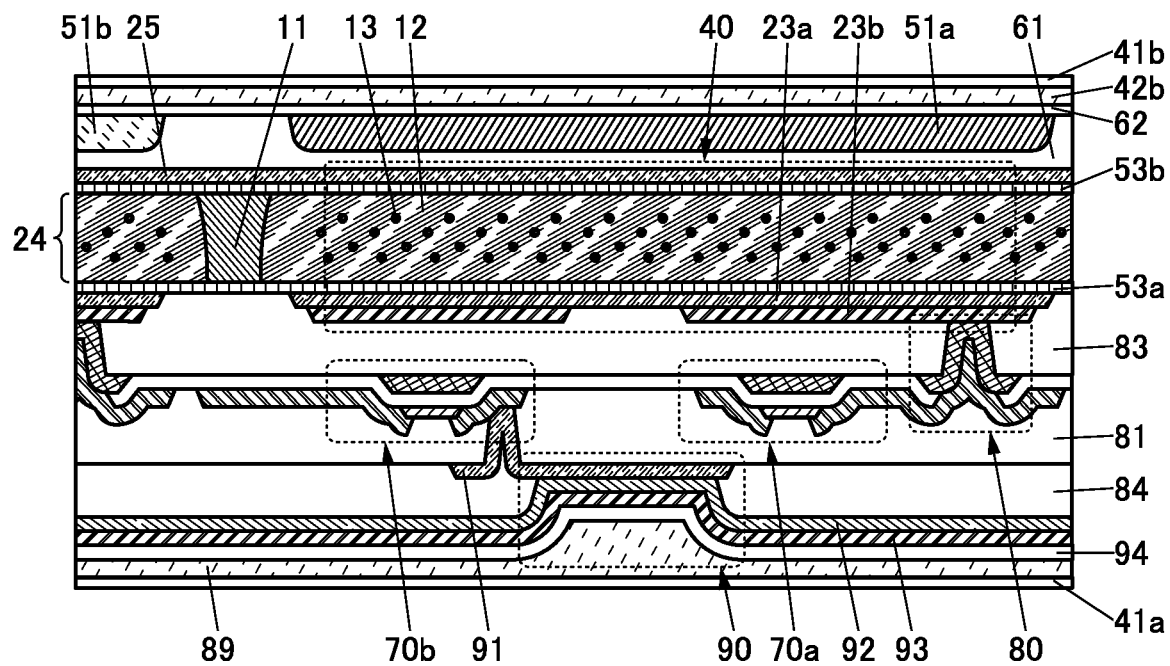

Next, separation is performed between the resin layer 16 and each of the support substrate 44b and the light-blocking layer 15, whereby the support substrate 44b and the light-blocking layer 15 are removed (FIG. 15A).

Then, the resin layer 16 is removed by etching.

After that, the insulating layer 62 and the substrate 41b are bonded to each other with the bonding layer 42b.

Through the above steps, the display device in FIG. 12A can be fabricated.

Cross-Sectional Structure Example 2-2

Figure 12B:
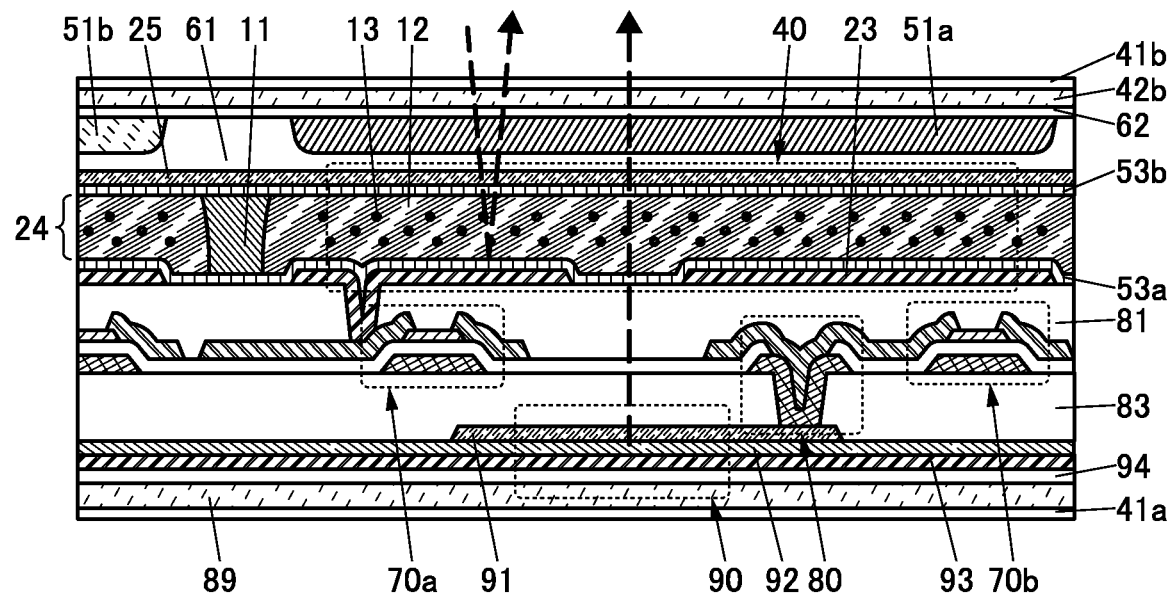

FIG. 12B is a schematic cross-sectional view of a display device described below as an example. The structure in FIG. 12B is different from that in FIG. 12A mainly in that the transistors 70a and 70b are provided closer to the substrate 41b than the insulating layer 83.

One of a source and a drain of the transistor 70a is electrically connected to the conductive layer 23 provided over the insulating layer 81 through an opening provided in the insulating layer 81. In addition, the alignment film 53a is provided over the conductive layer 23.

The transistor 70b is electrically connected to the conductive layer 91 through the connection portion 80. The EL layer 92 and the conductive layer 93 are stacked to cover the conductive layer 91. In addition, the insulating layer 94 is provided to cover the conductive layer 93.

Here, a surface of the conductive layer 91 on the substrate 41a side is substantially aligned with a surface of the insulating layer 83 on the substrate 41a side, and a difference in level at their boundary is extremely small. Thus, an insulating layer covering the end portion of the conductive layer 91 (the insulating layer 84), which is shown in FIG. 12A and the like, is not necessarily provided. Note that the insulating layer 84 may be provided.

Manufacturing Method Example 2-2

A manufacturing method example of the display device in FIG. 12B will be described below.

First, the separation layer 43c is formed over the support substrate 44c, and the conductive layer 91 is formed over the separation layer 43c. The conductive layer 91 can be formed using a material and a method which are similar to those of the conductive layer 23a.

Next, the insulating layer 83 is formed to cover the conductive layer 91 and the separation layer 43c. Then, an opening reaching the conductive layer 91 is formed in the insulating layer 83.

Next, the transistors 70a and 70b are formed over the insulating layer 83. In the step of forming the gates of the transistors 70a and 70b, the conductive layer electrically connected to the conductive layer 91 is formed at the same time, so that the connection portion 80 is formed.

Then, after the insulating layer 81 is formed, the conductive layer 23 is formed over the insulating layer 81. After that, the alignment film 53a is formed to cover the conductive layer 23 and the insulating layer 81.

Figure 16A:
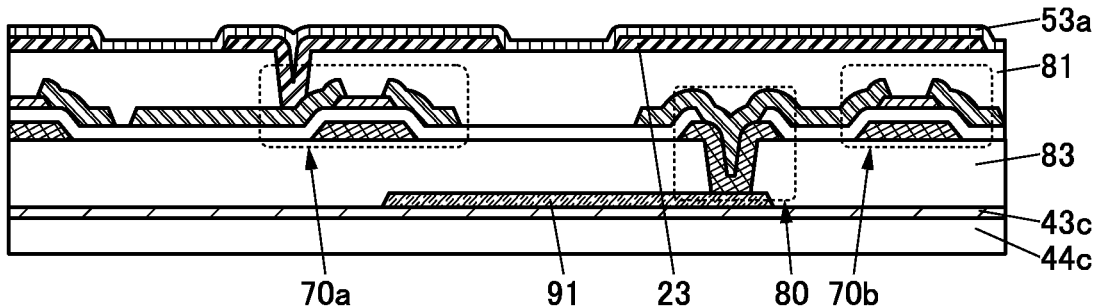
FIGS. 16A to 16C illustrate a method for manufacturing a display device of an embodiment.

FIG. 16A is a schematic cross-sectional view at this stage.

Next, by a method similar to that described above, the support substrate 44c and the support substrate 44b are bonded to each other with the liquid crystal layer 24 therebetween.

Figure 16B:
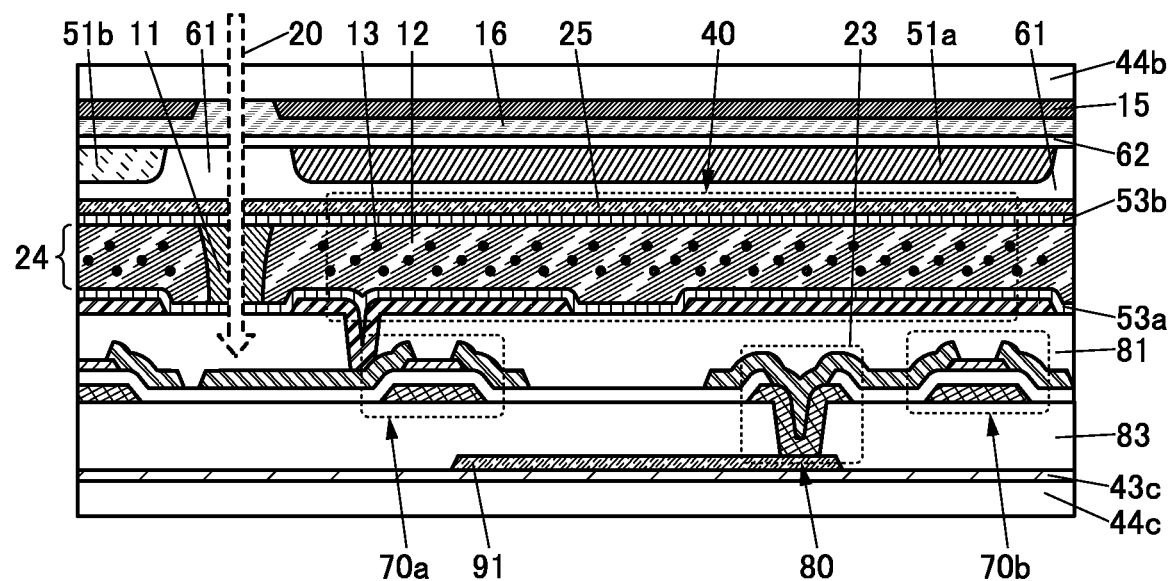

Then, the light 20 is emitted from the support substrate 44b side to form the partition wall 11 in the liquid crystal layer 24 (FIG. 16B).

Next, separation is performed between the resin layer 16 and each of the support substrate 44b and the light-blocking layer 15, whereby the support substrate 44b and the light-blocking layer 15 are removed.

Then, the resin layer 16 is removed by etching.

After that, the insulating layer 62 and the substrate 41b are bonded to each other with the bonding layer 42b.

Figure 16C:
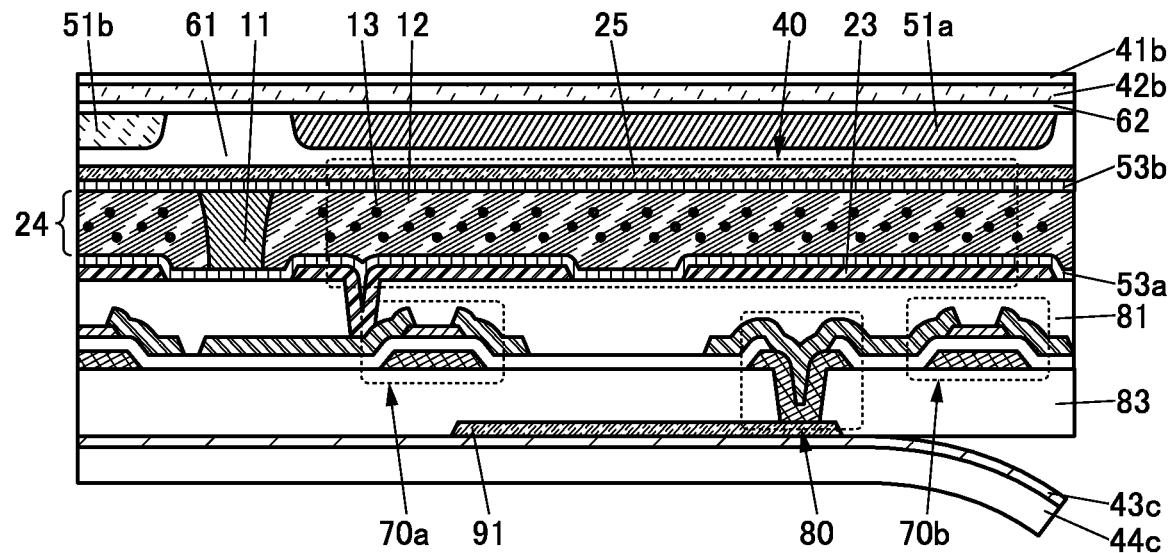

Next, separation is performed between the separation layer 43c and each of the insulating layer 83 and the conductive layer 91, so that the support substrate 44c and the separation layer 43c are removed (FIG. 16C). Immediately after that, treatment such as washing may be performed on the surface on which separation is performed.

Figure 17A:
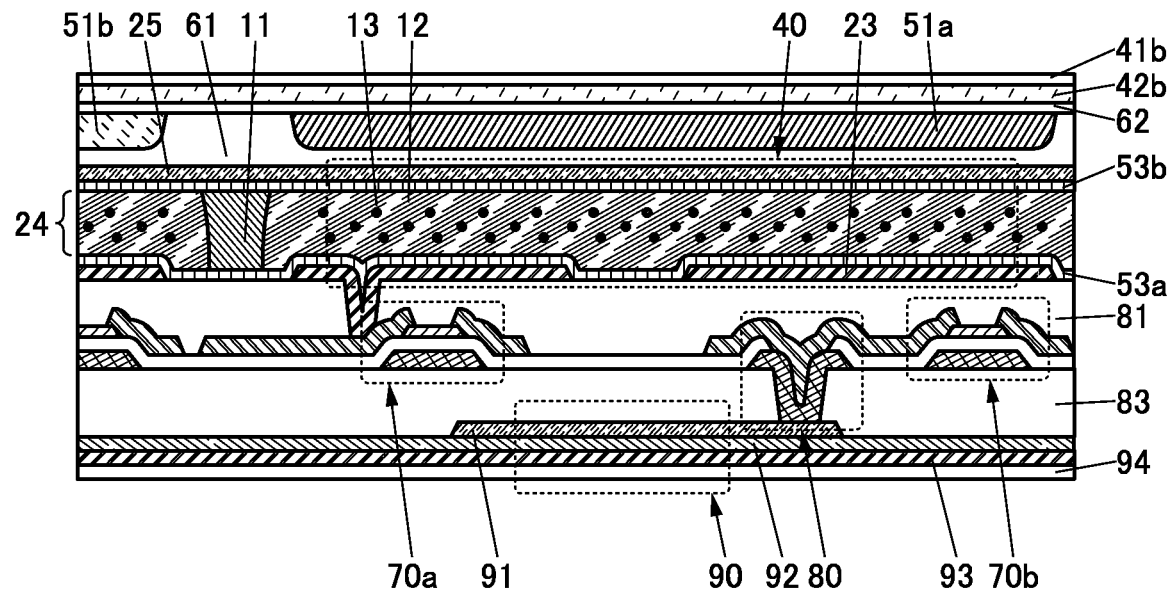
FIGS. 17A and 17B illustrate a method for manufacturing a display device of an embodiment.

Next, the EL layer 92, the conductive layer 93, and the insulating layer 94 are formed to cover the conductive layer 91 and the insulating layer 83 (FIG. 17A).

Figure 17B:
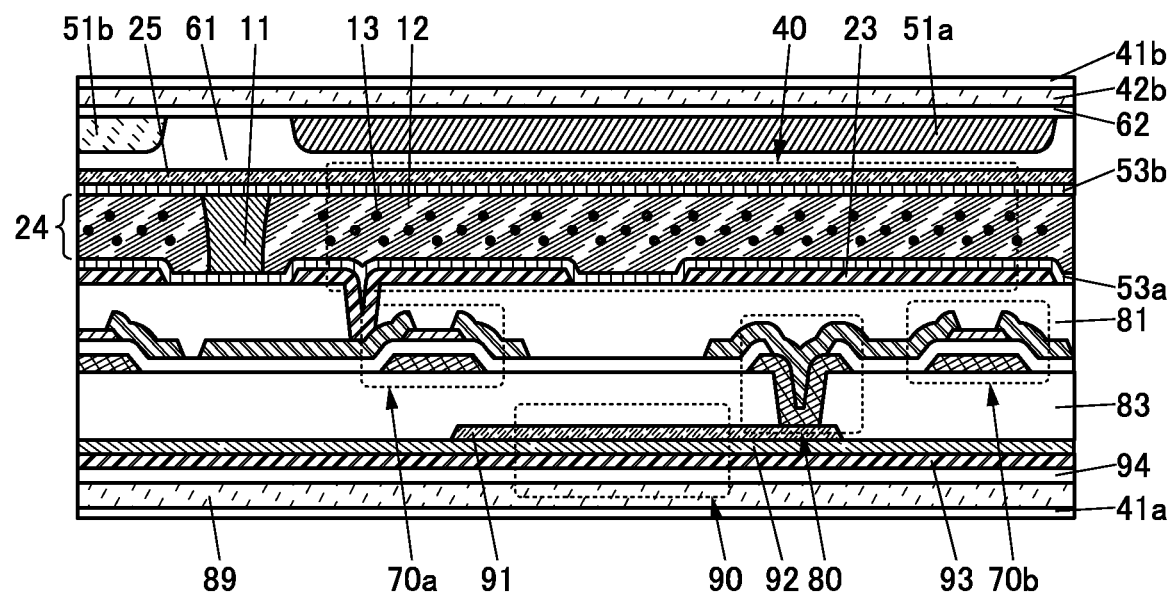

Then, the insulating layer 94 and the substrate 41a are bonded to each other with the bonding layer 89 (FIG. 17B).

Through the above steps, the display device in FIG. 12B can be fabricated.

Cross-Sectional Structure Example 2-3

Figure 18A:
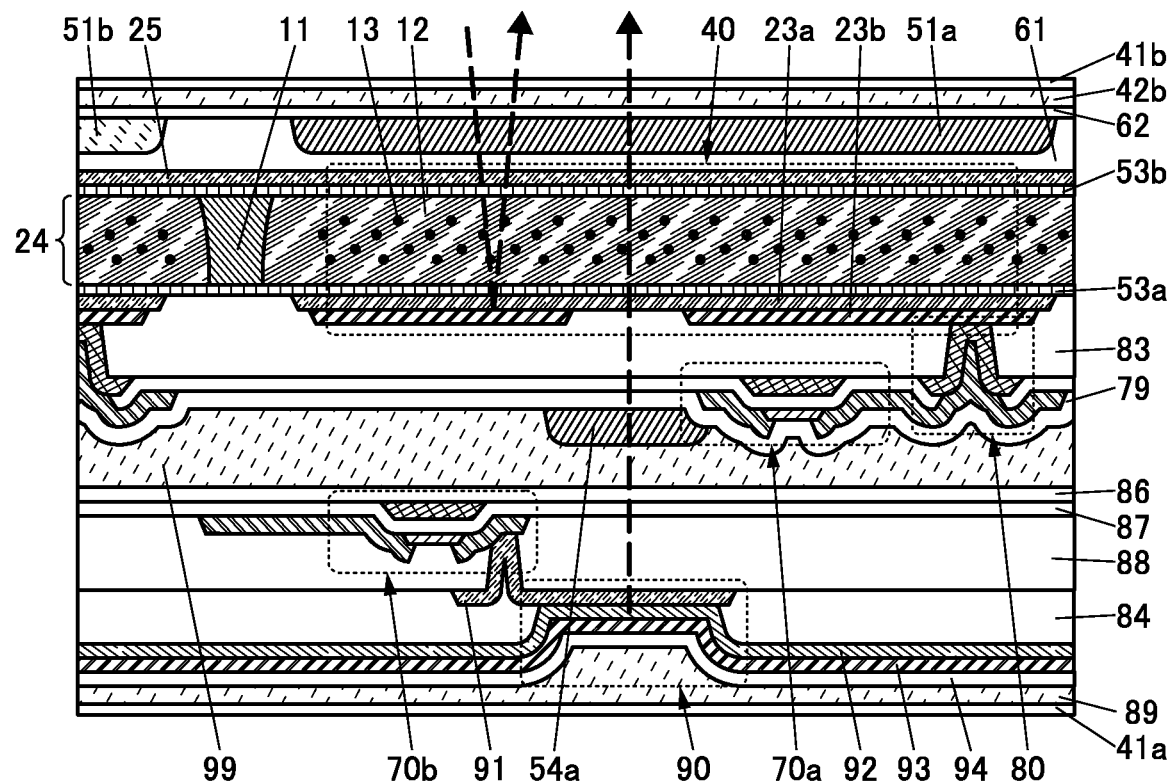
FIGS. 18A and 18B illustrate structure examples of display devices of embodiments.

FIG. 18A is a schematic cross-sectional view of a display device described below as an example. The structure in FIG. 18A is different from that in FIG. 12A mainly in that the transistor 70a and the transistor 70b are provided over different insulating layers and a bonding layer 99 is provided between the transistor 70a and the transistor 70b.

The transistor 70b is provided on one surface side of an insulating layer 86. The other surface of the insulating layer 86 is bonded to the insulating layer 79 covering the transistor 70a, with the bonding layer 99.

An insulating layer 87 and an insulating layer 88 are provided on the one surface side of the insulating layer 86. The insulating layer 87 partly functions as a gate insulating layer of the transistor 70b. The insulating layer 88 is provided to cover the transistor 70b. The insulating layer 84 is provided to cover part of the insulating layer 88.

In addition, here, the coloring layer 54a is included between the insulating layer 79 and the bonding layer 99.

Light from the light-emitting element 90 passes through the coloring layer 54a and the coloring layer 51a and emitted to the outside.

Although the substrate 41a and the substrate 41b are included in this example, these can be replaced with inflexible substrates (e.g., glass substrates). This enables fabrication of a display device with high strength.

Manufacturing Method Example 2-3

A manufacturing method example of the display device in Cross-sectional structure example 2-3 will be described below.

First, the separation layer 43c, the conductive layer 23a, the conductive layer 23b, and the insulating layer 83 having an opening are formed over the support substrate 44c in a manner similar to that of Manufacturing method example 2-1.

Figure 19A:
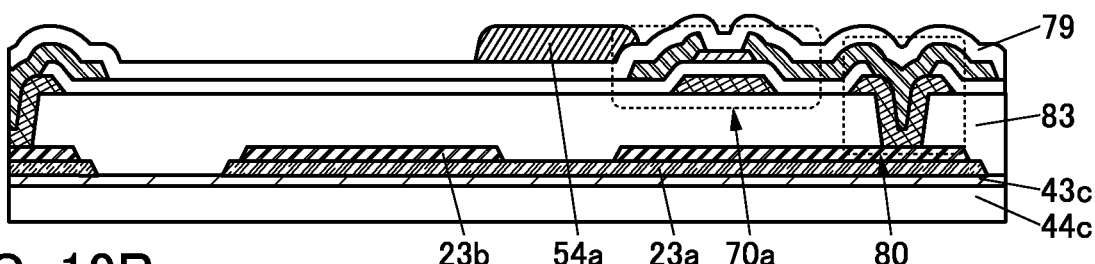
FIGS. 19A to 19C illustrate a method for manufacturing a display device of an embodiment.

Next, the transistor 70a is formed over the insulating layer 83 and the insulating layer 79 is formed to cover the transistor 70a. Then, the coloring layer 54a is formed over the insulating layer 79. FIG. 19A is a schematic cross-sectional view at this stage.

Figure 19B:
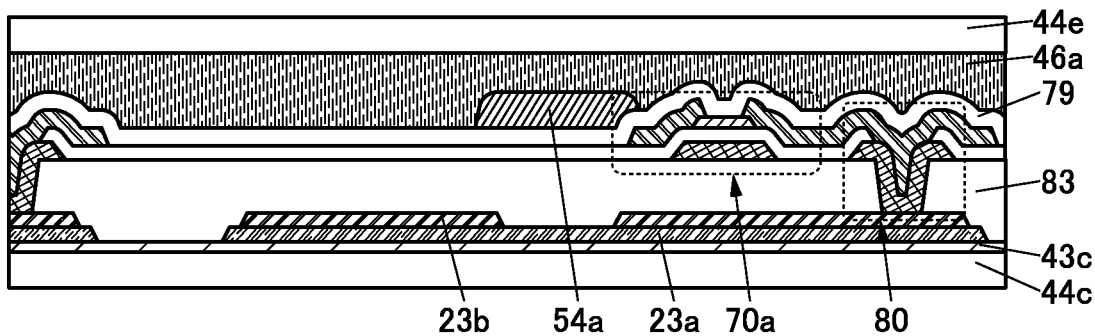

Then, a support substrate 44e is bonded to the insulating layer 79 with a bonding layer 46a (FIG. 19B). For the support substrate 44e, a material similar to that used for the support substrates 44a described above or the like can be used. For the bonding layer 46a, a material which can be easily peeled in a later step is preferably used. For example, a viscous material, a double-sided tape, a silicone sheet, a water-soluble adhesive, or the like can be used for the bonding layer 46a.

Figure 19C:
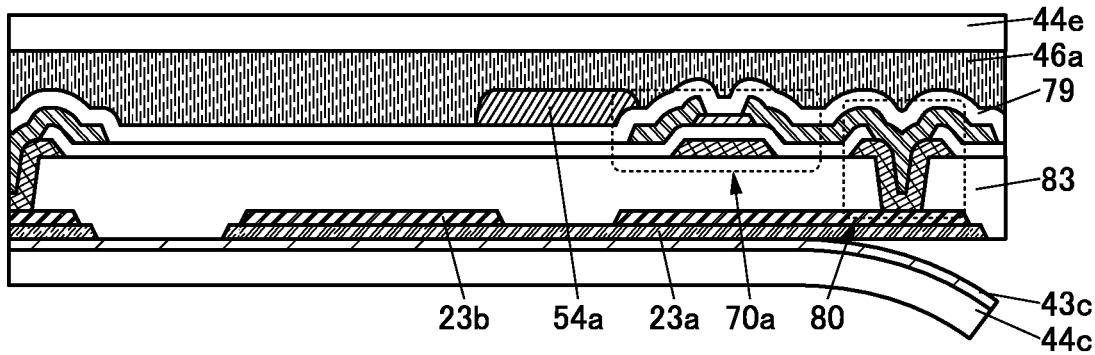

Next, separation is performed between the separation layer 43c and each of the insulating layer 83 and the conductive layer 23a, so that the support substrate 44c and the separation layer 43c are removed (FIG. 19C).

After that, the alignment film 53a is formed over the conductive layer 23a and the insulating layer 83.

Next, the support substrate 44b provided with the light-blocking layer 15, the resin layer 16, the coloring layer 51a, the coloring layer 51b, the insulating layer 61, the insulating layer 62, the conductive layer 25, the alignment film 53b, and the like in advance is prepared. Then, the support substrate 44b and the substrate 44e are bonded to each other with the liquid crystal layer 24 therebetween.

Figure 20A:
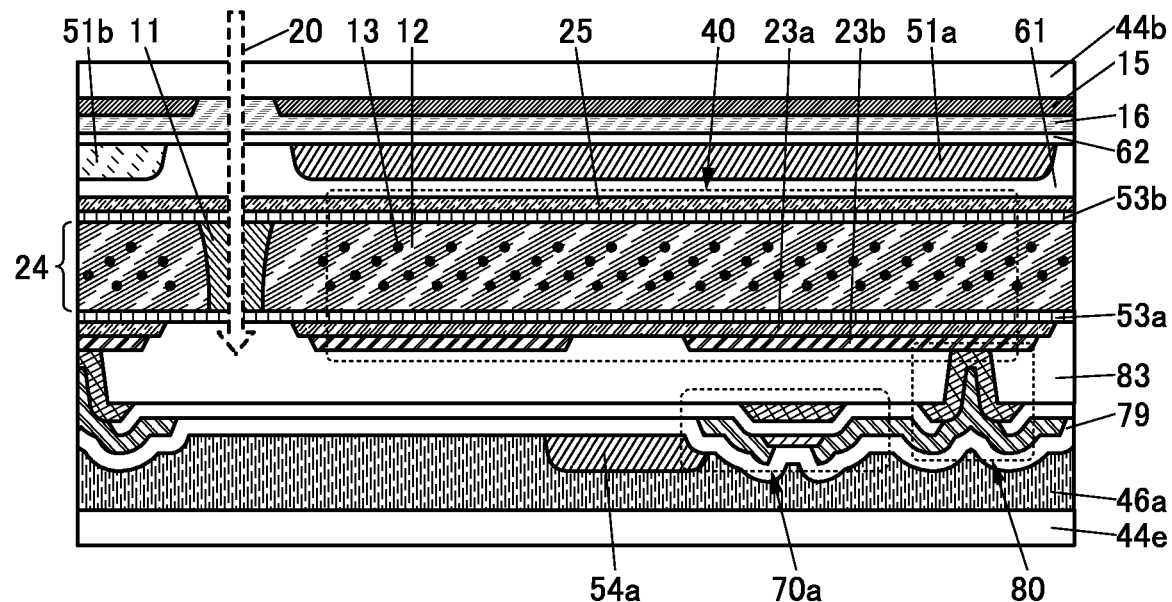
FIGS. 20A and 20B illustrate a method for manufacturing a display device of an embodiment.

Next, the light 20 is emitted from the support substrate 44b side to form the partition wall 11 (FIG. 20A).

Figure 20B:
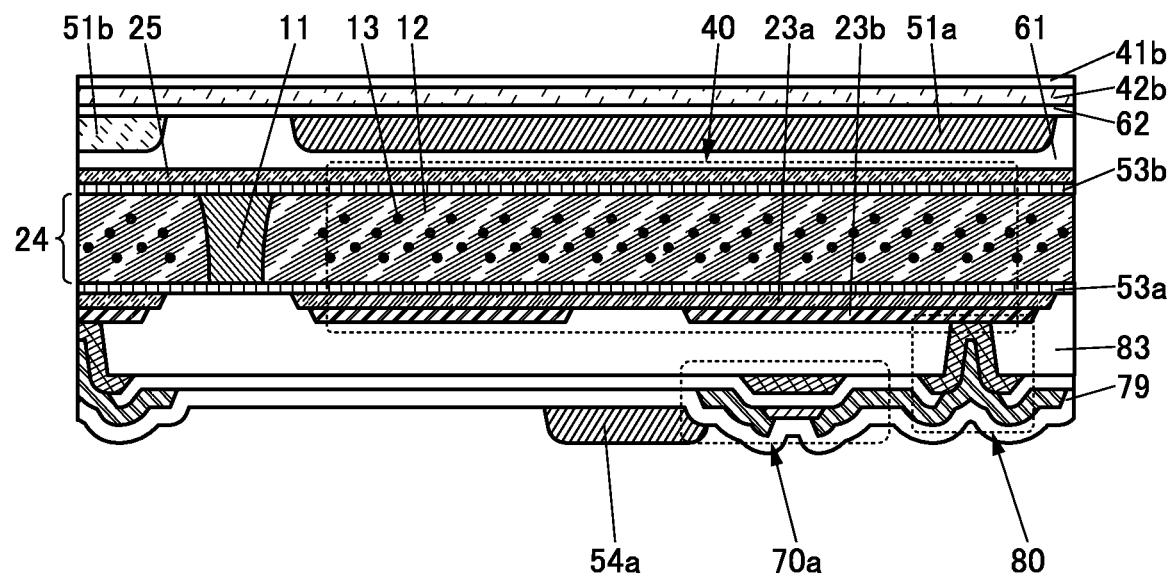

Subsequently, the bonding layer 46a and the support substrate 44e are removed (FIG. 20B).

Figure 21A:
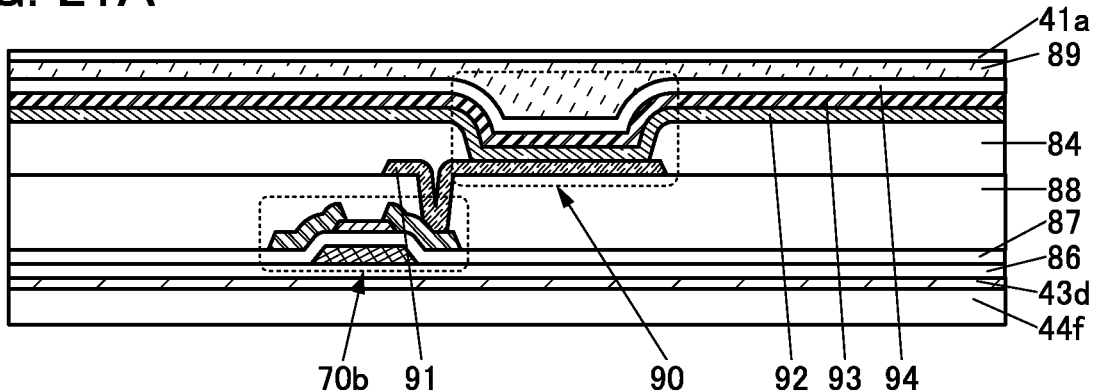
FIGS. 21A to 21C illustrate a method for manufacturing a display device of an embodiment.

In addition to the above, a support substrate 44f is prepared. A separation layer 43d, the insulating layer 86, the transistor 70b (including the insulating layer 87), the insulating layer 88, the conductive layer 91, the insulating layer 84, the light-emitting element 90, and the insulating layer 94 are formed in this order over the support substrate 44f. After that, the substrate 41a covering the light-emitting element 90 is bonded with the bonding layer 89 (FIG. 21A).

Figure 21B:
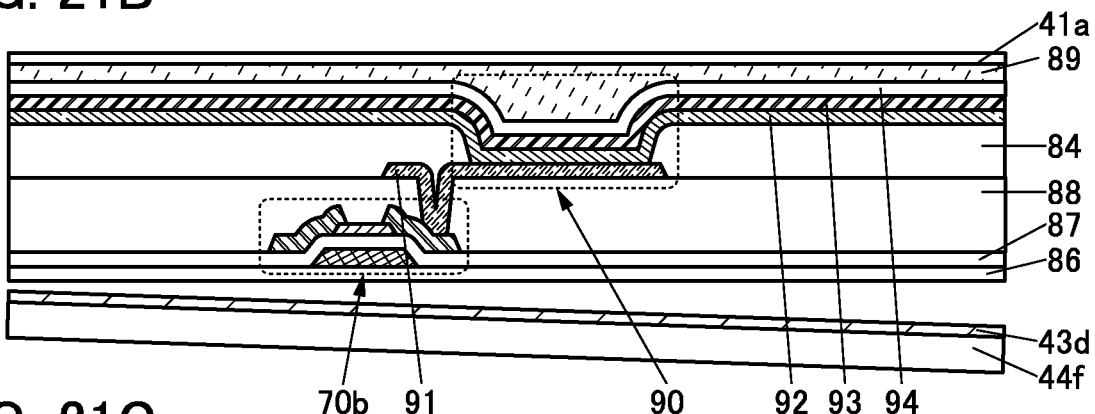

Next, the separation layer 43d and the support substrate 44f are removed (FIG. 21B).

Figure 21C:
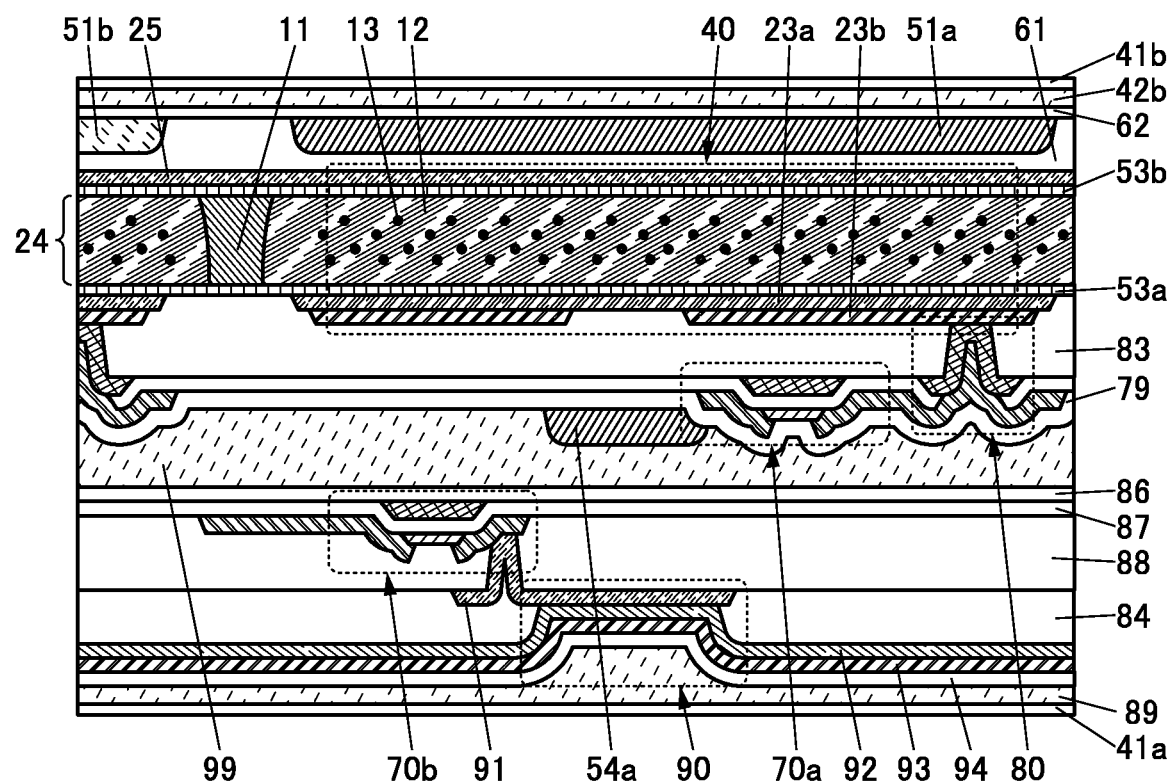

Then, the substrate 41a and the substrate 41b are bonded to each other with the bonding layer 99 (FIG. 21C).

Through the above steps, the display device in FIG. 18A can be fabricated.

Cross-Sectional Structure Example 2-4

Figure 18B:
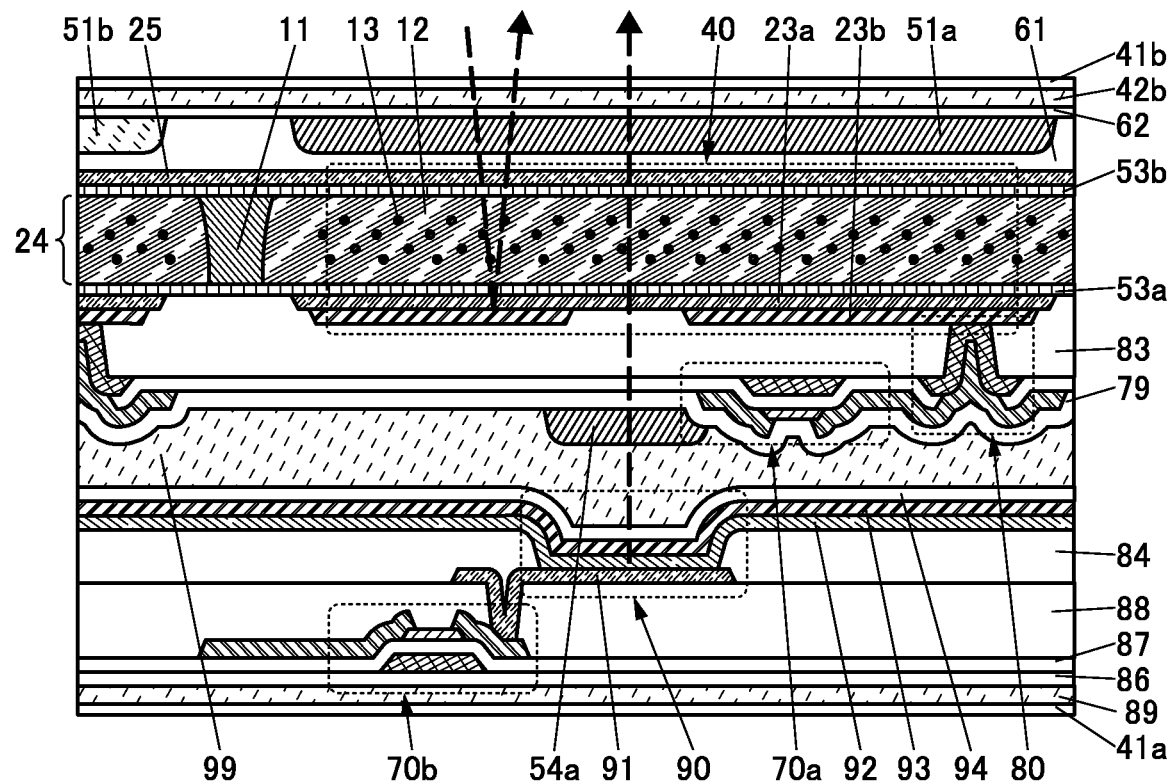

FIG. 18B is a schematic cross-sectional view of a display device described below as an example. The structure in FIG. 18B is different from that in FIG. 18A mainly in that the light-emitting element 90 is a top-emission light-emitting element and the components from the insulating layer 87 to the light-emitting element 90 are stacked in the reverse order.

The substrates 41a and 41b are bonded to each other with the bonding layer 99. The bonding layer 99 is provided to cover the light-emitting element 90 and has a function of sealing the light-emitting element 90.

Manufacturing Method Example 2-4

A manufacturing method example of the display device described in Cross-sectional structure example 2-4 will be described below. Here, portions different from those in Manufacturing method example 2-3 will be described.

First, the support substrate 44f is prepared, and the separation layer 43d, the insulating layer 86, the transistor 70b (including the insulating layer 87), the insulating layer 88, the conductive layer 91, the insulating layer 84, the light-emitting element 90, and the insulating layer 94 are formed in this order over the support substrate 44f.

Then, a support substrate 44g and the insulating layer 94 are bonded to each other with a bonding layer 46b. For the bonding layer 46b, a material similar to that for the bonding layer 46a can be used. For the support substrate 44g, a material similar to that for the support substrate 44e can be used.

Figure 22A:
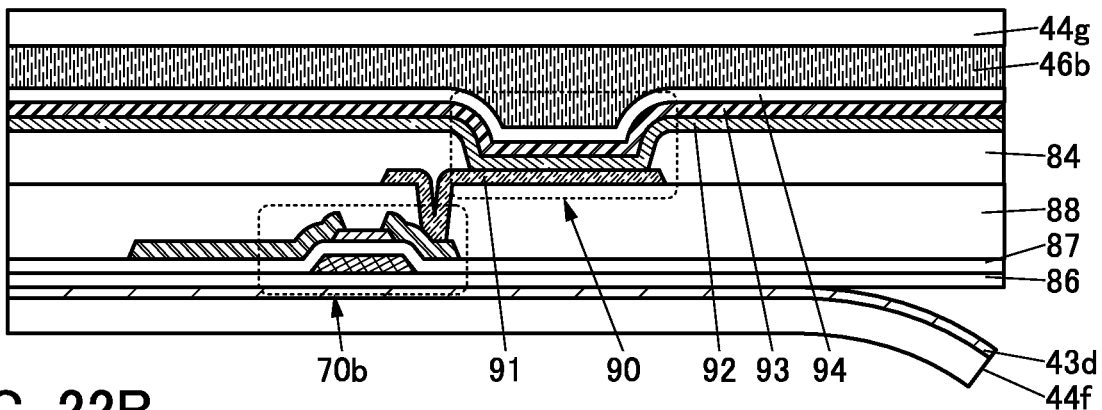
FIGS. 22A to 22C illustrate a method for manufacturing a display device of an embodiment.

Next, the separation layer 43d and the support substrate 44f are removed (FIG. 22A).

Figure 22B:
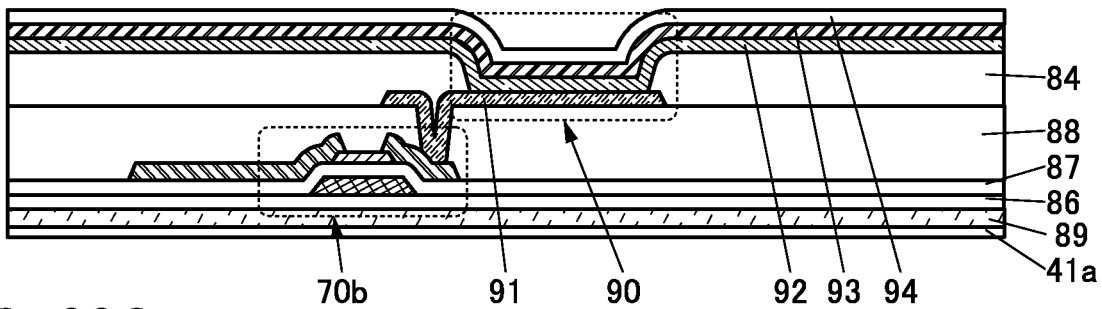

Then, the insulating layer 86 and the substrate 41a are bonded to each other with the bonding layer 89. After that, the support substrate 44g and the bonding layer 46b are removed (FIG. 22B).

Figure 22C:
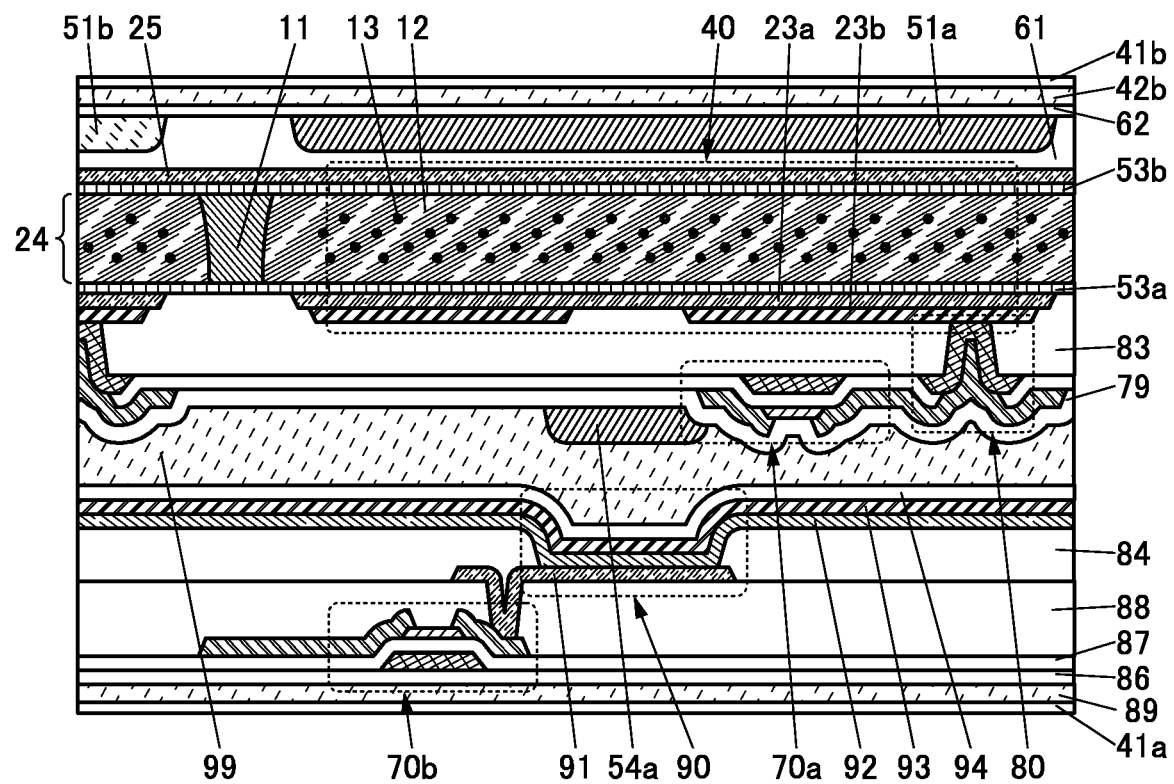

Then, the substrate 41a and the substrate 41b are bonded to each other with the bonding layer 99 (FIG. 22C).

Through the above steps, the display device in FIG. 18B can be fabricated.

The above is the description of Structure example 2.

[Components]

The above components will be described below.

A material having a flat surface can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display device can be decreased by using a thin substrate. A flexible display device can be fabricated by using a substrate that is thin enough to have flexibility.

Since the substrate through which light emission is not extracted does not need to have a light-transmitting property, a metal substrate or the like can be used, other than the above-mentioned substrates. A metal substrate, which has high thermal conductivity, is preferable because the whole metal substrate can easily conduct heat and accordingly can prevent a local temperature rise in the display device. To obtain flexibility and bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, metals such as aluminum, copper, and nickel, an aluminum alloy, and an alloy such as stainless steel can preferably be used, for example.

It is possible to use a substrate subjected to insulation treatment in such a manner that a surface of a metal substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposure to or heating in an oxygen atmosphere, or the like.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass, metal, or the like that is thin enough to have flexibility can be used as the substrate. Alternatively, a composite material where glass and a resin material are bonded to each other with a bonding layer may be used.

A hard coat layer (e.g., a silicon nitride layer and an aluminum oxide layer) by which a display device surface is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display device can be provided.

[Transistor]

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state current of the transistor can be reduced.

For the semiconductor layer, it is particularly preferable to use an oxide semiconductor including a plurality of crystal parts whose c-axes are aligned substantially perpendicularly to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be favorably used for a flexible display device which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current, and therefore, charges stored in a capacitor that is connected in series to the transistor can be held for a long time. When such a transistor is used for a pixel, operation of a driver circuit can be stopped while the gray level of each pixel is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in the electrical characteristics of the transistor including the oxide semiconductor, the oxide semiconductor preferably contains a stabilizer in addition to indium, zinc, and M.

Examples of the stabilizer, including metals that can be used as M, are gallium, tin, hafnium, aluminum, and zirconium. Other examples of the stabilizer include lanthanoids such as lanthanum, cerium, praseodymium, neodymium, samarium, europium, gadolinium, terbium, dysprosium, holmium, erbium, thulium, ytterbium, and lutetium.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor included in the semiconductor layer is preferably 2 eV or more, more preferably 2.5 eV or more, still more preferably 3 eV or more. With the use of an oxide semiconductor having such a wide energy gap, the off-state current of the transistor can be reduced.

In the case where the oxide semiconductor included in the semiconductor layer is an In-M-Zn oxide, it is preferable that the atomic ratio of metal elements of a sputtering target used to form a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1, and the like are preferable. Note that the atomic ratio of metal elements in the formed semiconductor layer varies from the above atomic ratio of metal elements of the sputtering target within a range of ±40% as an error.

An oxide semiconductor film with low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, yet still more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor included in the semiconductor layer, the semiconductor layer includes an increased number of oxygen vacancies and thus becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor included in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen which is measured by secondary ion mass spectrometry is preferably set to lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film may have, for example, a single-layer structure or a stacked structure including two or more of the above regions.

<Composition of CAC-OS>

Described below will be the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline or CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be deposited by a sputtering method under conditions where a substrate is not heated intentionally, for example. In the case of depositing the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow rate of an oxygen gas is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, a leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

A semiconductor element including a CAC-OS has high reliability. Thus, the CAC-OS is suitably used in a variety of semiconductor devices typified by a display.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where the display portion with extremely high resolution is provided, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, and a substrate below the semiconductor layer, resulting in wider choice of materials. For example, an extremely large glass substrate can be favorably used. Meanwhile, the top-gate transistor is preferable because an impurity region is easily formed in a self-aligned manner and variations in characteristics can be reduced. In that case, the use of polycrystalline silicon, single-crystal silicon, or the like is particularly suitable.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased. They can also be used for conductive layers of a variety of wirings and electrodes included in a display device, and conductive layers (e.g., conductive layers serving as a pixel electrode and a common electrode) included in a display element

[Insulating Layer]

As an insulating material that can be used for the insulating layers, a resin such as acrylic or epoxy, a resin having a siloxane bond, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m²·day)], preferably lower than or equal to $1\times10^{-6}$ [g/(m²·day)], more preferably lower than or equal to $1\times10^{-7}$ [g/(m²·day)], still more preferably lower than or equal to $1\times10^{-8}$ [g/(m²·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls transmission or nontransmission of light utilizing an optical modulation action of liquid crystal. Note that the optical modulation action of liquid crystal is controlled by an electric field applied to the liquid crystal (including an horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either positive liquid crystal or negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, a reflective liquid crystal element can be used.

In the case where the transmissive or semi-transmissive liquid crystal element is used, two polarizing plates are provided such that a pair of substrates are sandwiched therebetween. A backlight is provided outside one of the polarizing plates. As the backlight, a direct-below backlight or an edge-light backlight may be used. The direct-below backlight including an LED is preferably used because local dimming is easily performed to improve contrast. The edge-light backlight is preferably used because the thickness of a module including the backlight can be reduced.

In the case where a reflective liquid crystal element is used, a polarizing plate is provided on the display surface side. In addition, a light diffusion plate is preferably provided on the display surface side to improve visibility.

[Light-Emitting Element]

As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

In one embodiment of the present invention, in particular, a bottom-emission light-emitting element can be used.

The EL layer includes at least a light-emitting layer. In addition to the light-emitting layer, the EL layer may further include one or more layers containing any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element that emits white light is used as the light-emitting element, the EL layer preferably contains two or more kinds of light-emitting substances. For example, the two or more kinds of light-emitting substances are selected so that light of complementary colors is emitted, to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). The emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium, an alloy containing any of these metal materials, a nitride of any of these metal materials (e.g., titanium nitride), or the like can be used when formed thin so as to have a light-transmitting property. Alternatively, a stacked film of any of the above materials can be used for the conductive layers. For example, a stacked film of indium tin oxide and an alloy of silver and magnesium is preferably used, in which case conductivity can be increased. Still alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

Note that the aforementioned light-emitting layer and layers containing a substance with an excellent hole-injection property, a substance with an excellent hole-transport property, a substance with an excellent electron-transport property, a substance with an excellent electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Bonding Layer]

As the bonding layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

[Coloring Layer]

Examples of materials that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

The above is the description of each of the components.

Manufacturing Method Example

A manufacturing method example of a display device using a flexible substrate will be described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes, in its category, an extremely thin film with a thickness greater than or equal to 10 nm and less than or equal to 300 μm and the like.

As a method for forming an element layer over a flexible substrate with an insulating surface, typically, there are two methods shown below. One of them is to directly form an element layer over the substrate. The other method is to form an element layer over a support substrate that is different from the substrate and then to separate the element layer from the support substrate so that the element layer is transferred to the substrate. Although not described in detail here, in addition to the above two methods, there is a method in which the element layer is formed over a substrate which does not have flexibility and the substrate is thinned by polishing or the like to have flexibility.

In the case where a material of the substrate has resistance to heat applied in the forming process of the element layer, it is preferable that the element layer be formed directly over the substrate, in which case a manufacturing process can be simplified. At this time, the element layer is preferably formed in a state where the substrate is fixed to a support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. In this case, selected is a material with which separation at the interface between the support substrate and the separation layer, at the interface between the separation layer and the insulating layer, or in the separation layer occurs. In the case of employing the method, it is preferable that a material having high heat resistance be used for the support substrate or the separation layer, in which case the upper limit of the temperature applied when the element layer is formed can be increased, and an element layer including a more reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer, be used as the insulating layer over the separation layer. Note that in this specification, oxynitride contains more oxygen than nitrogen, and nitride oxide contains more nitrogen than oxygen.

As the method for separating the support substrate from the element layer, applying mechanical force, etching the separation layer, and making a liquid permeate the separation interface are given as examples. Alternatively, separation may be performed by heating or cooling two layers of the separation interface and utilizing a difference in thermal expansion coefficient between the two layers.

The separation layer is not necessarily provided in the case where the separation can be performed at the interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, to perform separation at the interface between the glass and the organic resin.

Alternatively, a heat generation layer may be provided between the support substrate and the insulating layer formed of an organic resin, and separation may be performed at the interface between the heat generation layer and the insulating layer by heating the heat generation layer. As the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display device.

Structure Example 3

A more specific structure example of the display device of one embodiment of the present invention will be described below with reference to drawings.

Cross-Sectional Structure Example 3-1

Figure 23:
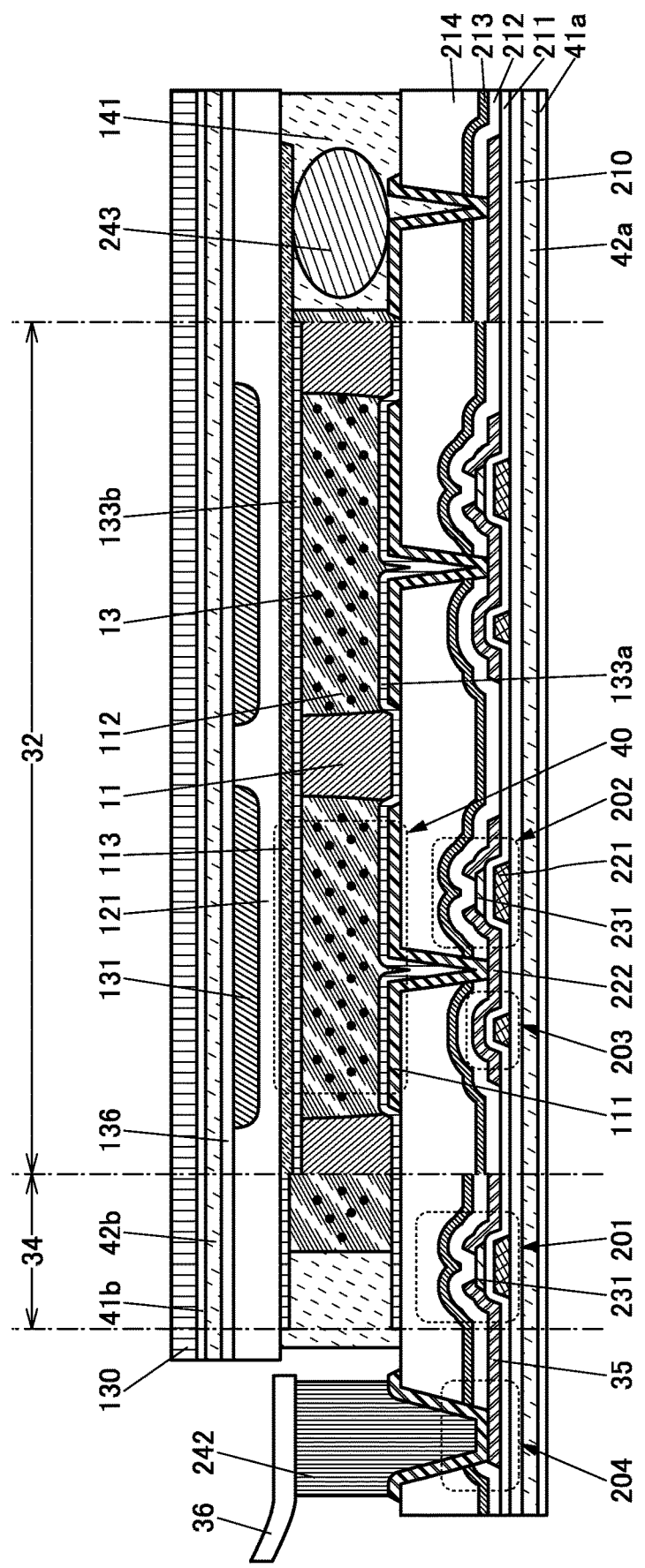
FIG. 23 illustrates a structure example of a display device of an embodiment.

FIG. 23 is a schematic cross-sectional view of a display device described below as an example. FIG. 23 illustrates an example of cross sections of a region including the FPC 36, a region including the circuit 34, a region including the display portion 32, and the like in FIG. 1A.

The substrate 41a is bonded to an insulating layer 210 with the bonding layer 42a, and the substrate 41b is bonded to an insulating layer 136 with the bonding layer 42b. The substrate 41a and the substrate 41b are bonded to each other with a bonding layer 141. A region surrounded by the substrate 41a, the substrate 41b, and the bonding layer 141 is filled with liquid crystal 112. A polarizing plate 130 is provided on an outer surface of the substrate 41b.

In FIG. 23, the liquid crystal element 40 includes the conductive layer 111, part of the conductive layer 113, and the liquid crystal 112 sandwiched therebetween. In addition, an alignment film 133a is provided between the liquid crystal 112 and the conductive layer 111, and an alignment film 133b is provided between the liquid crystal 112 and the conductive layer 113.

In addition, between the substrate 41a and the substrate 41b, the monomers 13 are dispersed in the liquid crystal 112. Moreover, the partition walls 11 are provided between the substrate 41a and the substrate 41b.

Although not illustrated, a front light can be provided outside the polarizing plate 130. As the front light, an edge-light front light is preferably used. A front light including an LED is preferably used because power consumption can be reduced.

The insulating layer 136 is provided with a coloring layer 131, an insulating layer 121, the conductive layer 113 serving as a common electrode of the liquid crystal element 40, the alignment film 133b, and the like.

The conductive layer 111 serving as a pixel electrode of the liquid crystal element 40, the alignment film 133a, a transistor 201, a transistor 202, a capacitor 203, a connection portion 204, the wiring 35, and the like are provided over the insulating layer 210. For example, the transistor 201 corresponds to the transistor 70 described above.

Insulating layers such as an insulating layer 211, an insulating layer 212, an insulating layer 213, and an insulating layer 214 are provided over the insulating layer 210. A portion of the insulating layer 211 functions as a gate insulating layer of each transistor, and another portion thereof functions as a dielectric of the capacitor 203. The insulating layer 212, the insulating layer 213, and the insulating layer 214 are provided to cover each transistor and the capacitor 203. The insulating layer 214 functions as a planarization layer. Note that an example where the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided. The insulating layer 214 functioning as a planarization layer is not necessarily provided when not needed.

The transistor 201 and the transistor 202 each include a conductive layer 221 part of which functions as a gate, conductive layers 222 parts of which function as a source and a drain, and a semiconductor layer 231. Here, a plurality of layers obtained by processing the same conductive film are shown with the same hatching pattern.

In the transistor 202, one of the pair of conductive layers 222 which is not electrically connected to the conductive layer 111 may function as part of a signal line. The conductive layer 221 functioning as a gate of the transistor 202 may also function as part of a scan line.

FIG. 23 illustrates a cross section of two pixels (sub-pixels) as an example of the display portion 32. One sub-pixel includes, for example, the transistor 202, the capacitor 203, the liquid crystal element 40, and the coloring layer 131. For example, the coloring layers 131 are selectively formed so that a sub-pixel exhibiting a red color, a sub-pixel exhibiting a green color, and a sub-pixel exhibiting a blue color are arranged; thus, full-color display can be achieved.

FIG. 23 illustrates an example of the circuit 34 in which the transistor 201 is provided.

Although the transistors 201 and 202 each include one gate in FIG. 23, the semiconductor layer 231 where a channel is formed may be provided between two gates. Such a structure enables control of threshold voltages of transistors. In that case, the two gates may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of an increase in size or resolution.

Note that the transistor included in the circuit 34 and the transistor included in the display portion 32 may have the same structure. A plurality of transistors included in the circuit 34 may have the same structure or different structures. A plurality of transistors included in the display portion 32 may have the same structure or different structures.

A material through which impurities such as water or hydrogen do not easily diffuse is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and a highly reliable display device can be provided.

The conductive layer 111 is provided over the insulating layer 214. The conductive layer 111 is electrically connected to one of a source and a drain of the transistor 202 through an opening formed in the insulating layer 214, the insulating layer 213, the insulating layer 212, and the like. The conductive layer 111 is also electrically connected to one electrode of the capacitor 203.

The insulating layer 121 is provided on the substrate 41b side to cover the coloring layer 131. The insulating layer 121 may have a function of a planarization layer. The insulating layer 121 enables the conductive layer 113 to have an almost flat surface, resulting in a uniform alignment state of the liquid crystal 112.

In FIG. 23, the partition walls 11 are each positioned to overlap with a region between two adjacent conductive layers 111. In addition, the partition walls 11 are positioned to overlap with the alignment film 133a, the alignment film 133b, the conductive layer 113, and the like.

In the liquid crystal element 40, the conductive layer 111 has a function of reflecting visible light, and the conductive layer 113 has a function of transmitting visible light. Light incident from the substrate 41b side is polarized by the polarizing plate 130, passes through the conductive layer 113 and the liquid crystal 112, and is reflected by the conductive layer 111. Then, the light passes through the liquid crystal 112 and the conductive layer 113 again and reaches the polarizing plate 130. In this case, the alignment of the liquid crystal 112 is controlled with a voltage that is applied between the conductive layer 111 and the conductive layer 113, and thus optical modulation of light can be controlled. That is, the intensity of light emitted through the polarizing plate 130 can be controlled. Light other than one in a particular wavelength region of the light is absorbed by the coloring layer 131, and thus, emitted light is red light, for example.

As the polarizing plate 130, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the liquid crystal element 40 are controlled in accordance with the kind of the polarizing plate 130 so that desirable contrast is obtained.

The conductive layer 113 is electrically connected to a conductive layer provided on the substrate 41a side through a connector 243 in a portion close to an end portion of the substrate 41b. Thus, a potential or a signal can be supplied from an FPC, an IC, or the like provided on the substrate 41a side to the conductive layer 113.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 23, the connector 243 which is the conductive particle has a shape that is vertically crushed in some cases. With the crushed shape, the contact area between the connector 243 and a conductive layer electrically connected to the connector 243 can be increased, resulting in a reduction in contact resistance and suppression of the generation of problems such as disconnection.

The connector 243 is preferably provided such that it is covered with the bonding layer 141. For example, the connectors 243 are dispersed in the bonding layer 141 before curing of the bonding layer 141.

The connection portion 204 is provided in a region near an end portion of the substrate 41a. The connection portion 204 is electrically connected to the FPC 36 through a connection layer 242. In the structure in FIG. 23, the connection portion 204 is formed by stacking part of the wiring 35 and a conductive layer obtained by processing the same conductive film as the conductive layer 111.

The above is the description of Cross-sectional structure example 3-1.

Cross-Sectional Structure Example 3-2

A structure example of a touch panel that includes a touch sensor will be described below as an example of the display device of one embodiment of the present invention.

Figure 24:
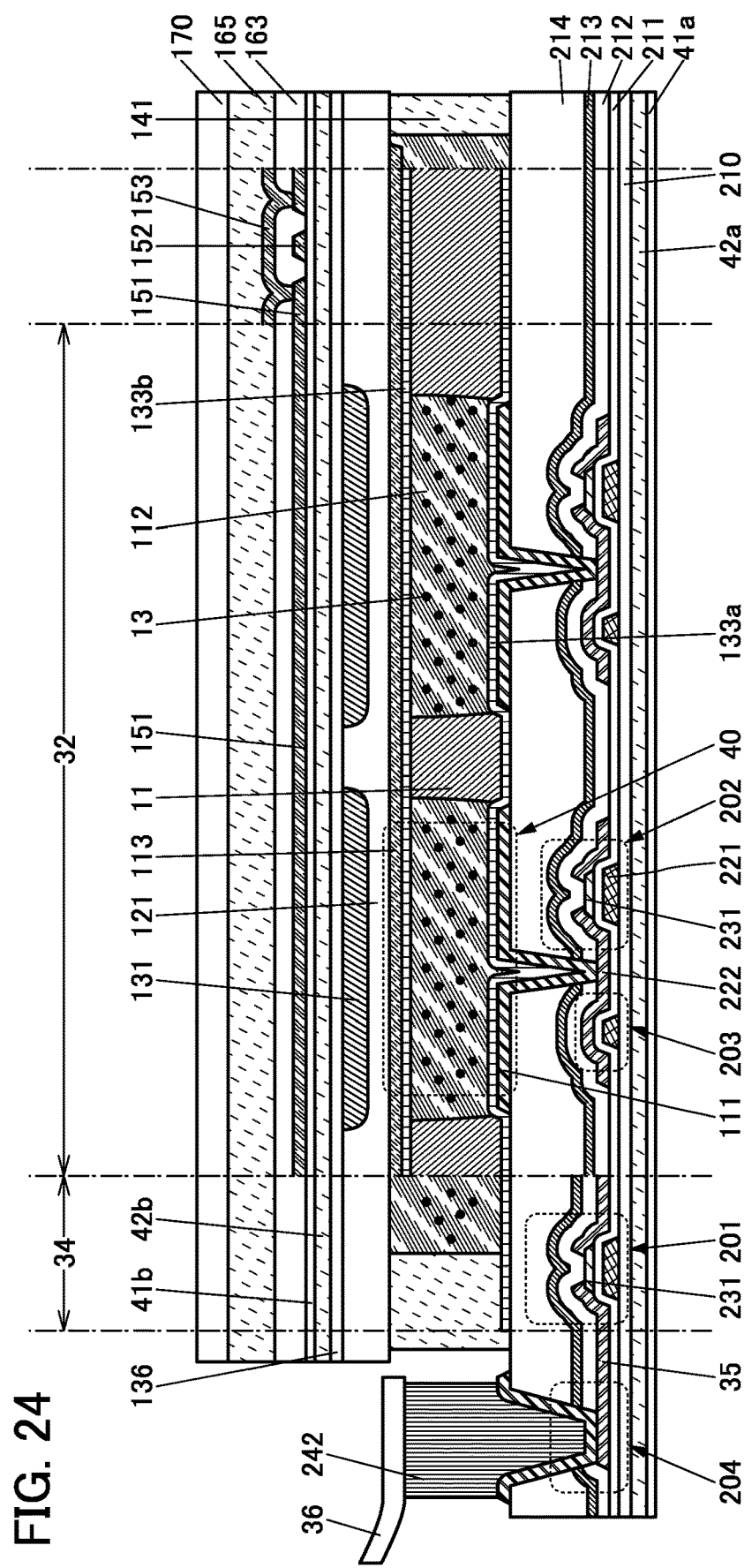
FIG. 24 illustrates a structure example of a display device of an embodiment.

FIG. 24 is a schematic cross-sectional view of a display device described below as an example.

FIG. 24 illustrates an example in which the conductive layers 151 and 152 and the like included in the touch sensor are formed on the surface of the substrate 41b that is opposite to the surface facing the substrate 41a. This structure can be referred to as an on-cell touch panel.

The conductive layers 151 and 152 and the like are formed over the substrate 41b and covered with the insulating layer 163. The conductive layer 153 is provided over the insulating layer 163.

The conductive layers 151 and 152 each serve as a wiring included in a capacitive touch sensor.

FIG. 24 clearly shows an intersection of the conductive layers 151 and 152. Through openings in the insulating layer 163, the conductive layer 153 is electrically connected to the two conductive layers 151 between which the conductive layer 152 is positioned.

A substrate 170 is a substrate serving as a touch surface, and for example, serves as part of a housing, protective glass, or the like of an electronic device in which the display device is incorporated. The substrates 170 and 41b are bonded with a bonding layer 165.

FIG. 24 illustrates an example in which the conductive layer 151 is provided in a region overlapping with the liquid crystal element 40, the coloring layer 131, and the like. In that case, the conductive layer 151 can be formed using a material transmitting visible light. A film containing a metal oxide, a film containing graphene, a film that contains a metal or an alloy and is thin enough to transmit visible light, or the like can be used for the conductive layer 151. The same applies to the conductive layer 152. The conductive layer 153 may also be formed using a material transmitting visible light; however, a material blocking visible light, such as a metal or an alloy, may also be used in the case where the area of the conductive layer 153 is extremely small.

The conductive layers 151 and 152 may be positioned such that they do not overlap with the liquid crystal element 40 in the display portion. In other words, the conductive layer 151 has a mesh shape with an opening overlapping with the liquid crystal element 40. In such a structure where the conductive layer 151 is not positioned on the path of light emitted from the outside and reflected by the liquid crystal element 40 to be emitted to the outside, the conductive layer 151 does not cause a decrease in luminance substantially; thus, a display device with high visibility and low power consumption can be fabricated. Note that the conductive layers 152 and 153 can each have a similar structure. In addition, not overlapping with the liquid crystal element 40, the conductive layers 151, 152, and 153 can be formed using a metal material with relatively low resistance. This increases the sensitivity of the touch sensor as compared with the case where a light-transmitting conductive material is used for the conductive layers 151, 152, and 153.

The above is the description of Cross-sectional structure example 3-2.

Structure Example 4

More specific cross-sectional structure examples of the display device shown in Structure example 2 that includes both a reflective liquid crystal element and a light-emitting element and can display an image both in a transmissive mode and in a reflective mode will be described below.

Cross-Sectional Structure Example 4-1

Figure 25:
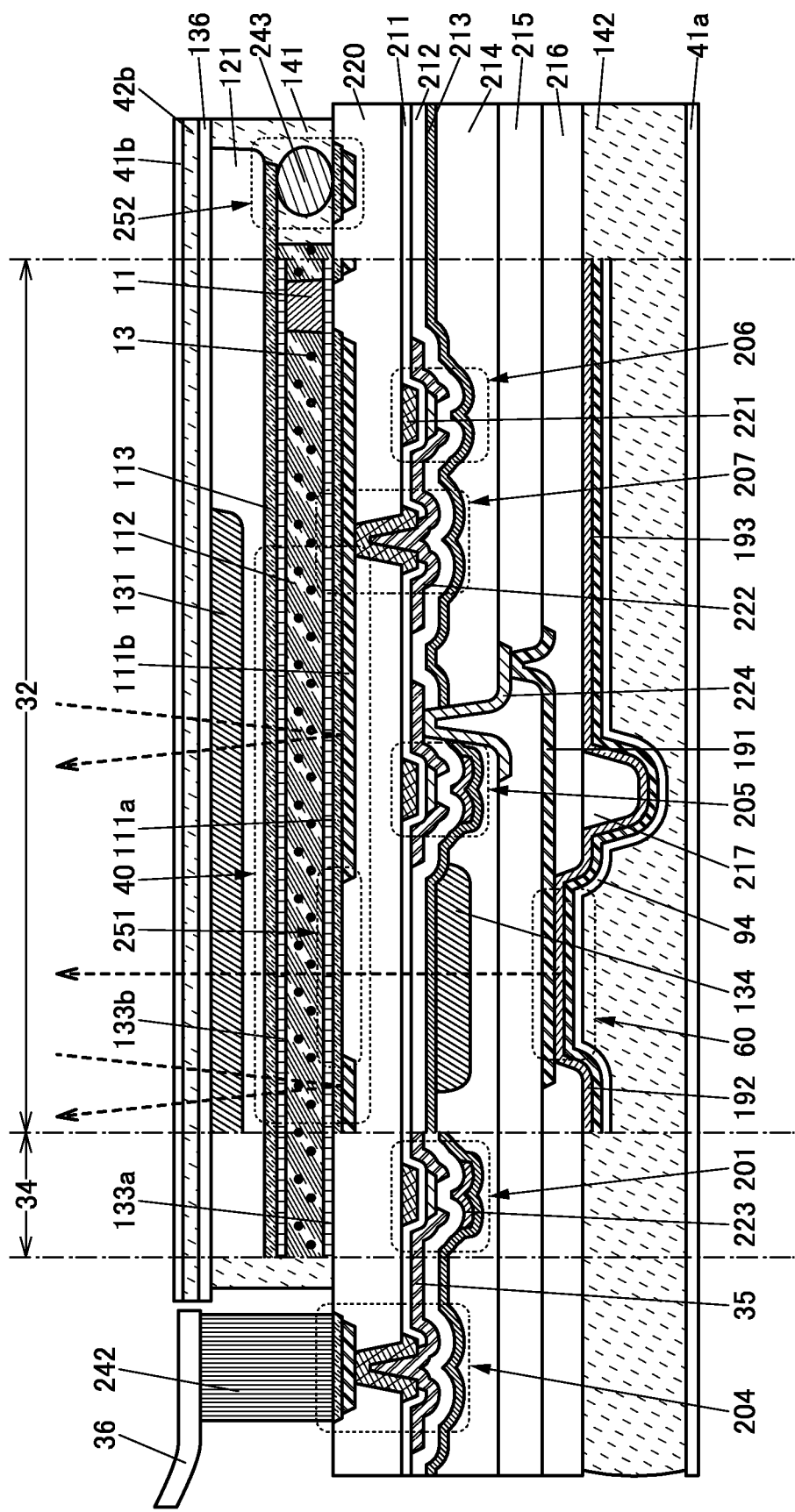
FIG. 25 illustrates a structure example of a display device of an embodiment.

FIG. 25 is a schematic cross-sectional view of a display device described below as an example. The display device illustrated in FIG. 25 corresponds to the display device illustrated in FIG. 12A.

The display device includes an insulating layer 220 between the substrates 41a and 41b. The display device also includes a light-emitting element 60, a transistor 205, a transistor 206, a coloring layer 134, and the like between the substrate 41a and the insulating layer 220. Furthermore, the display device includes the insulating layer 136, the liquid crystal element 40, the coloring layer 131, the partition wall 11, and the like between the insulating layer 220 and the substrate 41b. The substrate 41b and the insulating layer 136 are bonded with the bonding layer 42b. The insulating layer 136 and the insulating layer 220 are bonded with the bonding layer 141. The substrate 41a and the insulating layer 220 are bonded with a bonding layer 142.

The liquid crystal element 40 is a reflective liquid crystal element. The liquid crystal element 40 has a stacked structure of a conductive layer 111a, the liquid crystal 112, and the conductive layer 113. A conductive layer 111b which reflects visible light is provided in contact with the surface of the conductive layer 111a that faces the substrate 41a. The conductive layer 111b includes an opening 251. The conductive layers 111a and 113 contain a material transmitting visible light.

The light-emitting element 60 is a bottom-emission light-emitting element. The light-emitting element 60 has a structure in which a conductive layer 191, an EL layer 192, and a conductive layer 193 are stacked in this order from the insulating layer 220 side. The conductive layer 193 contains a material reflecting visible light, and the conductive layer 191 contains a material transmitting visible light. Light is emitted from the light-emitting element 60 to the substrate 41b side through the coloring layer 134, the insulating layer 220, the opening 251, the conductive layer 113, and the like. In addition, the insulating layer 94 is provided to cover the light-emitting element 60.

An insulating layer 217 is provided on the insulating layer 216 covering an end portion of the conductive layer 191. The insulating layer 217 functions as a spacer for preventing the insulating layer 220 and the substrate 41a from being unnecessarily close to each other. In addition, in the case where the EL layer 192 or the conductive layer 193 is formed using a shielding mask (metal mask), the shielding mask may have a function of preventing the shielding mask from being in contact with a surface on which the EL layer 192 or the conductive layer 193 is formed. Note that the insulating layer 217 is not necessarily provided when not needed.

One of a source and a drain of the transistor 205 is electrically connected to the conductive layer 191 of the light-emitting element 60 through a conductive layer 224.

One of a source and a drain of the transistor 206 is electrically connected to the conductive layer 111b through a connection portion 207. The conductive layers 111b and 111a are in contact with and electrically connected to each other. Here, in the connection portion 207, the conductive layers provided on both surfaces of the insulating layer 220 are connected to each other through openings in the insulating layer 220.

The connection portion 204 is provided in a region that does not overlap with the substrate 41b. The connection portion 204 has a structure similar to that of the connection portion 207. On the top surface of the connection portion 204, a conductive layer obtained by processing the same conductive film as the conductive layer 111a is exposed. Thus, the connection portion 204 and the FPC 36 can be electrically connected to each other through the connection layer 242.

A connection portion 252 is provided in part of a region where the bonding layer 141 is provided. In the connection portion 252, the conductive layer obtained by processing the same conductive film as the conductive layer 111a is electrically connected to part of the conductive layer 113 with a connector 243. Accordingly, a signal or a potential input from the FPC 36 connected to the substrate 41a side can be supplied to the conductive layer 113 formed on the substrate 41b side through the connection portion 252.

The above is the description of Cross-sectional structure example 4-1.

Cross-Sectional Structure Example 4-2

Figure 26:
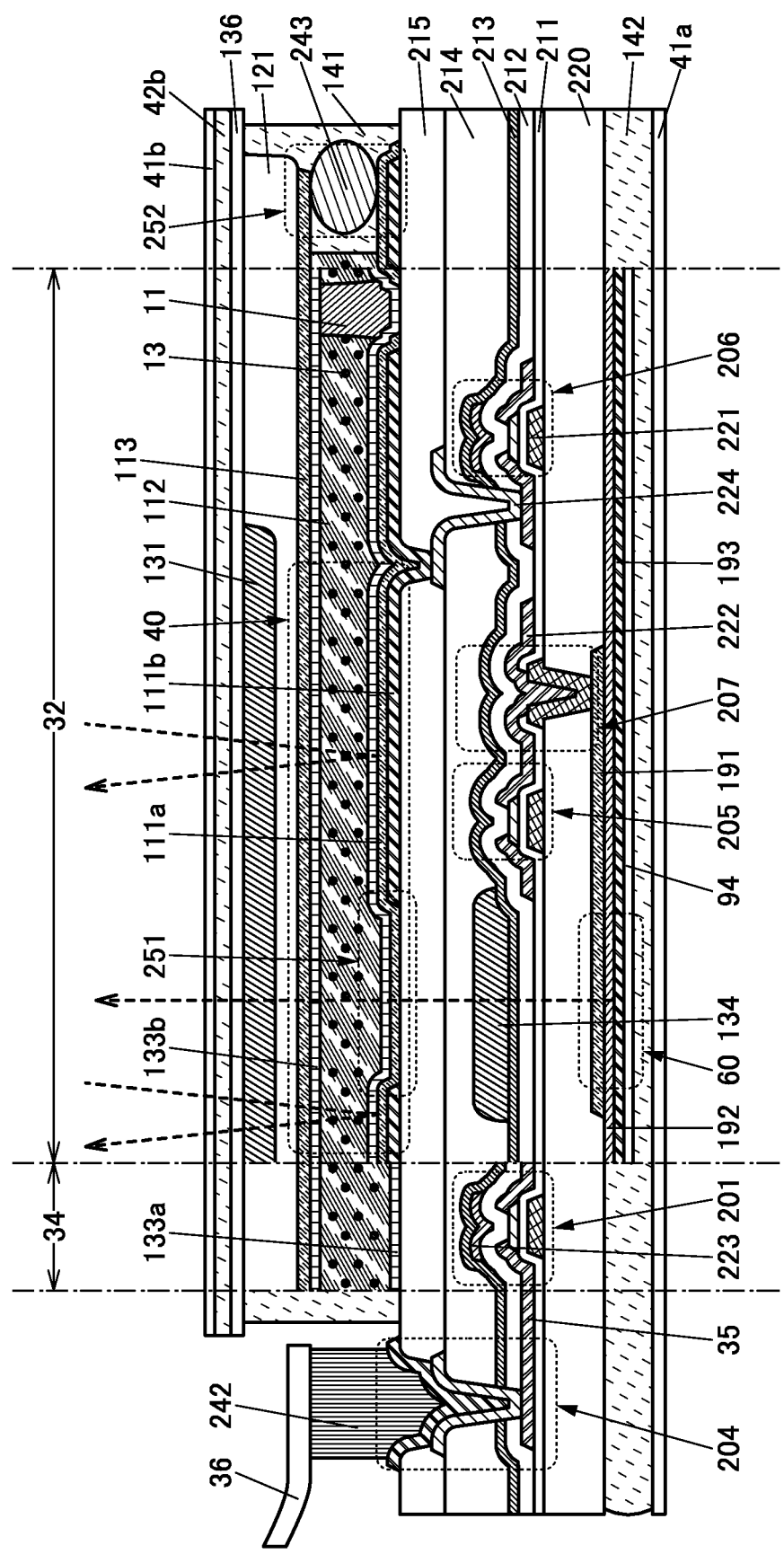
FIG. 26 illustrates a structure example of a display device of an embodiment.

FIG. 26 is a schematic cross-sectional view of a display device described below as an example. The display device illustrated in FIG. 26 corresponds to the display device illustrated in FIG. 12B.

The display device includes the insulating layer 220 between the substrates 41a and 41b. The display device also includes the light-emitting element 60 between the substrate 41a and the insulating layer 220. Furthermore, the display device includes the liquid crystal element 40, the transistor 205, the transistor 206, the coloring layer 134, the coloring layer 131, the partition wall 11, and the like between the insulating layer 220 and the substrate 41b.

FIG. 26 shows an example where the liquid crystal element 40 includes the conductive layer 111b electrically connected to the transistor 206 through the conductive layer 224 and the conductive layer 111a covering the conductive layer 111b.

Light is emitted from the light-emitting element 60 to the substrate 41b side through the coloring layer 134, the insulating layer 220, the opening 251, the conductive layer 113, and the like.

The above is the description of Cross-sectional structure example 4-2.

Cross-Sectional Structure Example 4-3

Figure 27:
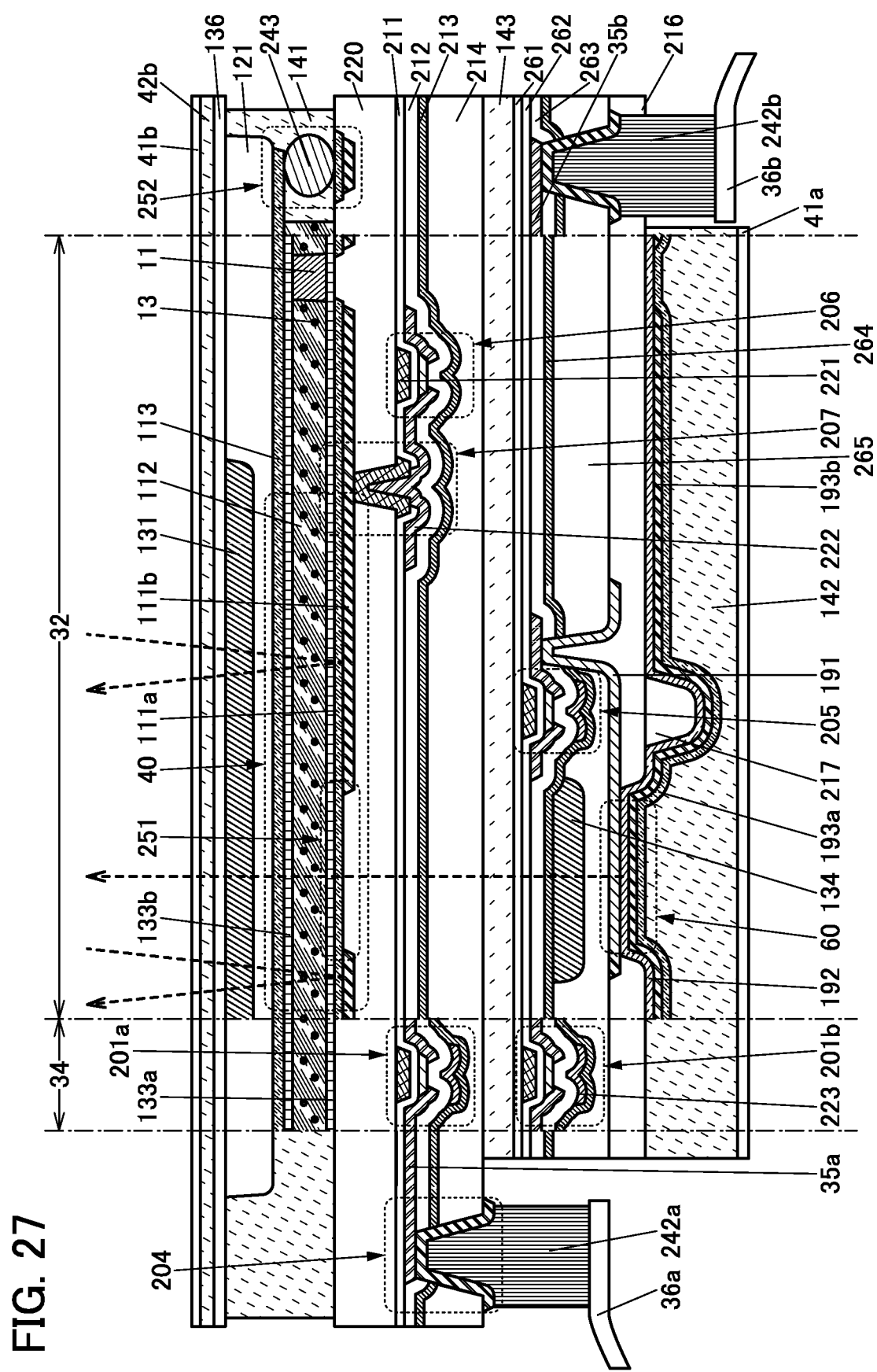
FIG. 27 illustrates a structure example of a display device of an embodiment.

FIG. 27 is a schematic cross-sectional view of a display device described below as an example. The display device illustrated in FIG. 27 corresponds to the display device illustrated in FIG. 18A.

The display device illustrated in FIG. 27 is different from that in FIG. 25 mainly in that the display device includes a transistor 201a and a transistor 201b instead of the transistor 201, an FPC 36a and an FPC 36b instead of the FPC 36, a connection layer 242a and a connection layer 242b instead of the connection layer 242, a bonding layer 143, a wiring 35a and a wiring 35b instead of the wiring 35, an insulating layer 261, an insulating layer 262, an insulating layer 263, an insulating layer 264, and an insulating layer 265.

The transistor 201a is a transistor that drives a pixel circuit including the transistor 206 and the like. The transistor 201b is a transistor that drives a pixel circuit including the transistor 205 and the like.

The FPC 36a is electrically connected to the wiring 35a through the connection layer 242a. The FPC 36b is electrically connected to the wiring 35b through the connection layer 242b.

The insulating layer 214 and the insulating layer 261 are bonded with the bonding layer 143. The insulating layer 262, the insulating layer 263, the insulating layer 264, the insulating layer 265, and the like are stacked on a surface of the insulating layer 261 which is opposite to the surface provided with the bonding layer 143. Part of the insulating layer 262 serves as a gate insulating layer of the transistor 201b and the transistor 205. The insulating layer 263, the insulating layer 264, and the insulating layer 265 are provided to cover the transistor 201b and the transistor 205.

The above is the description of Cross-sectional structure example 4-3.

[Transistor]

An example of a structure of a transistor that can be used in the display device will be described below.

Figure 28A:
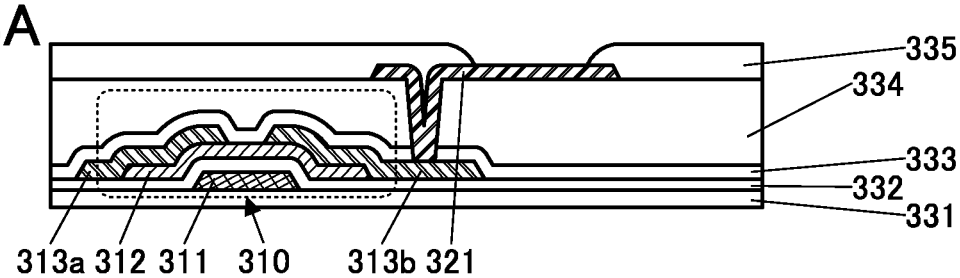
FIGS. 28A to 28E illustrate structure examples of transistors of embodiments.

A transistor 310 illustrated in FIG. 28A is an example of a bottom-gate transistor.

The transistor 310 includes a conductive layer 311 serving as a gate electrode, part of an insulating layer 332 serving as a gate insulating layer, a semiconductor layer 312, a conductive layer 313a serving as one of a source electrode and a drain electrode, and a conductive layer 313b serving as the other of the source electrode and the drain electrode.

In FIG. 28A, the transistor 310 is provided over an insulating layer 331. An insulating layer 334 is provided to cover the transistor 310, and a conductive layer 321 is provided over the insulating layer 334. The conductive layer 321 is electrically connected to the conductive layer 313b through an opening formed in the insulating layer 334 and serves as a pixel electrode. In an example in FIG. 28A, an insulating layer 335 is provided to cover an end portion of the conductive layer 321.

In the transistor 310, the conductive layer 311 functioning as a gate electrode is located closer to the formation surface (the insulating layer 331 side) than the semiconductor layer 312. The insulating layer 332 is provided to cover the conductive layer 311. The semiconductor layer 312 is provided to cover the conductive layer 311. A region of the semiconductor layer 312 that overlaps with the conductive layer 311 corresponds to a channel formation region. The conductive layers 313a and 313b are provided in contact with the top surface and side end portions of the semiconductor layer 312.

Note that in the transistor 310 shown as an example, the width of the semiconductor layer 312 is wider than that of the conductive layer 311. In such a structure, the semiconductor layer 312 is located between the conductive layer 311 and each of the conductive layers 313a and 313b. Thus, the parasitic capacitance between the conductive layer 311 and each of the conductive layers 313a and 313b can be reduced.

The transistor 310 is a channel-etched transistor and can be favorably used for a high-resolution display device because the occupation area of the transistor can be reduced comparatively easily.

Figure 28B:
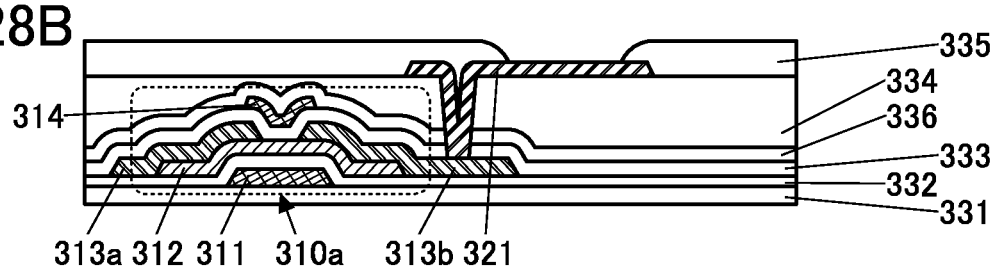

A transistor 310a illustrated in FIG. 28B is different from the transistor 310 in including a conductive layer 314 and an insulating layer 336. The conductive layer 314 is provided over an insulating layer 333 and includes a region overlapping with the semiconductor layer 312. The insulating layer 336 is provided to cover the conductive layer 314 and the insulating layer 333.

The conductive layer 314 is positioned to face the conductive layer 311 with the semiconductor layer 312 therebetween. In the case where the conductive layer 311 is used as a first gate electrode, the conductive layer 314 can serve as a second gate electrode. By supplying the same potential to the conductive layer 311 and the conductive layer 314, the on-state current of the transistor 310a can be increased. By supplying a potential for controlling the threshold voltage to one of the conductive layer 311 and the conductive layer 314 and a potential for driving to the other, the threshold voltage of the transistor 310a can be controlled.

A conductive material including an oxide is preferably used for the conductive layer 314. In that case, a conductive film to be the conductive layer 314 is formed in an atmosphere containing oxygen, whereby oxygen can be supplied to the insulating layer 333. The proportion of an oxygen gas in a film formation gas is preferably higher than or equal to 90% and lower than or equal to 100%. Oxygen supplied to the insulating layer 333 is then supplied to the semiconductor layer 312 by later heat treatment; as a result, oxygen vacancies in the semiconductor layer 312 can be reduced.

It is particularly preferable to use a low-resistance oxide semiconductor for the conductive layer 314. In that case, the insulating layer 336 is preferably formed using an insulating film that releases hydrogen, e.g., a silicon nitride film. Hydrogen is supplied to the conductive layer 314 during the formation of the insulating layer 336 or by heat treatment to be performed after that, whereby the electrical resistance of the conductive layer 314 can be reduced effectively.

Figure 28C:
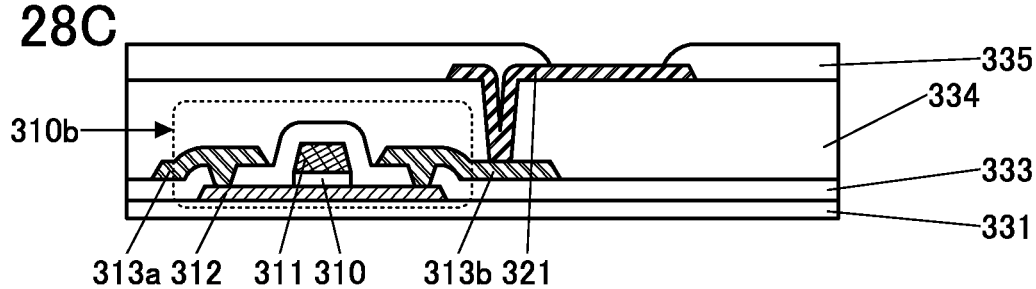

A transistor 310b illustrated in FIG. 28C is a top-gate transistor.

In the transistor 310b, the conductive layer 311 functioning as a gate electrode is provided over the semiconductor layer 312 (provided on the side opposite to the formation surface side). The semiconductor layer 312 is formed over the insulating layer 331. The insulating layer 332 and the conductive layer 311 are stacked over the semiconductor layer 312. The insulating layer 333 is provided to cover the top surface and the side end portions of the semiconductor layer 312, side surfaces of the insulating layer 332, and the conductive layer 311. The conductive layers 313a and 313b are provided over the insulating layer 333. The conductive layers 313a and 313b are electrically connected to the top surface of the semiconductor layer 312 through openings provided in the insulating layer 333.

Note that although the insulating layer 332 is not present in a portion that does not overlap with the conductive layer 311 in the example, the insulating layer 332 may be provided to cover the top surface and the side end portion of the semiconductor layer 312.

In the transistor 310b, the conductive layer 311 can be physically apart from each of the conductive layers 313a and 313b easily; thus, the parasitic capacitance between the conductive layer 311 and each of the conductive layers 313a and 313b can be reduced.

Figure 28D:
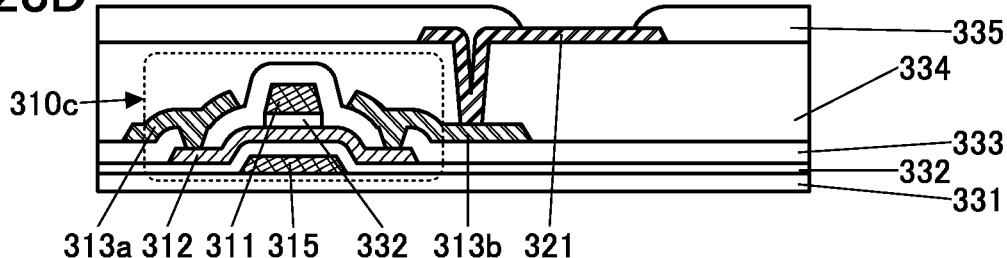

A transistor 310c illustrated in FIG. 28D is different from the transistor 310b in including a conductive layer 315 and an insulating layer 337. The conductive layer 315 is provided over the insulating layer 331 and includes a region overlapping with the semiconductor layer 312. The insulating layer 337 is provided to cover the conductive layer 315 and the insulating layer 331.

The conductive layer 315 serves as a second gate electrode like the conductive layer 314. Thus, the on-state current can be increased and the threshold voltage can be controlled, for example.

Figure 28E:
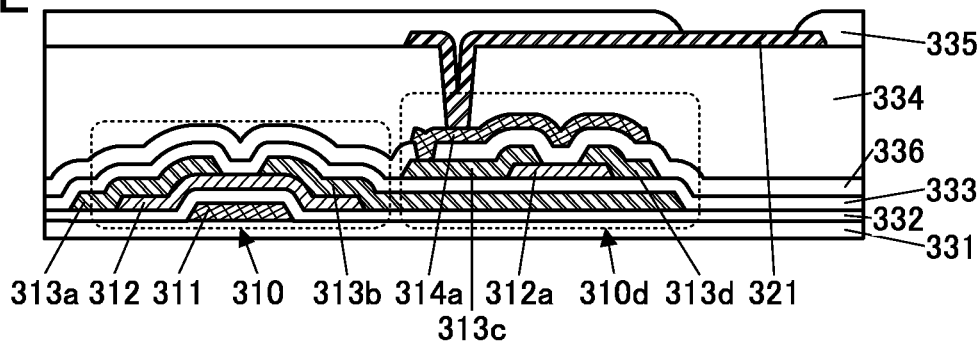

FIG. 28E illustrates a stacked structure of the transistor 310 and a transistor 310d. The transistor 310d is a transistor including a pair of gate electrodes.

The transistor 310d includes part of the conductive layer 313b serving as a first gate electrode, part of the insulating layer 333 serving as a first gate insulating layer, a semiconductor layer 312a, a conductive layer 313c serving as one of a source electrode and a drain electrode, a conductive layer 313d serving as the other of the source electrode and the drain electrode, part of the insulating layer 336 serving as a second gate insulating layer, and a conductive layer 314a serving as a second gate electrode.

In particular, such a structure can be favorably used in a circuit electrically connected to a light-emitting element. That is, it is preferable to use the transistor 310 as a transistor for controlling whether a pixel is selected or not (also referred to as a switching transistor or a selection transistor), and to use the transistor 310d as a transistor for controlling current flowing to a light-emitting element (also referred to as a driving transistor).

In the structure illustrated in FIG. 28E, the conductive layer 314a is electrically connected to the conductive layer 313c through an opening formed in the insulating layer 336. The conductive layer 321 is electrically connected to the conductive layer 314a through an opening formed in the insulating layer 334. Here, the capacitance between the conductive layer 314a and the semiconductor layer 312a (also referred to as gate capacitance) can be utilized as the storage capacitance of a pixel.

The above is the description of the transistor.

At least part of this embodiment can be implemented in combination with any of the other embodiments described in this specification as appropriate.

Embodiment 2

In this embodiment, a specific example of a display device of one embodiment of the present invention will be described. A display device described below includes both a reflective liquid crystal element and a light-emitting element and can perform display in a light-emitting mode and in a reflection mode.

Structure Example

Figure 29A:
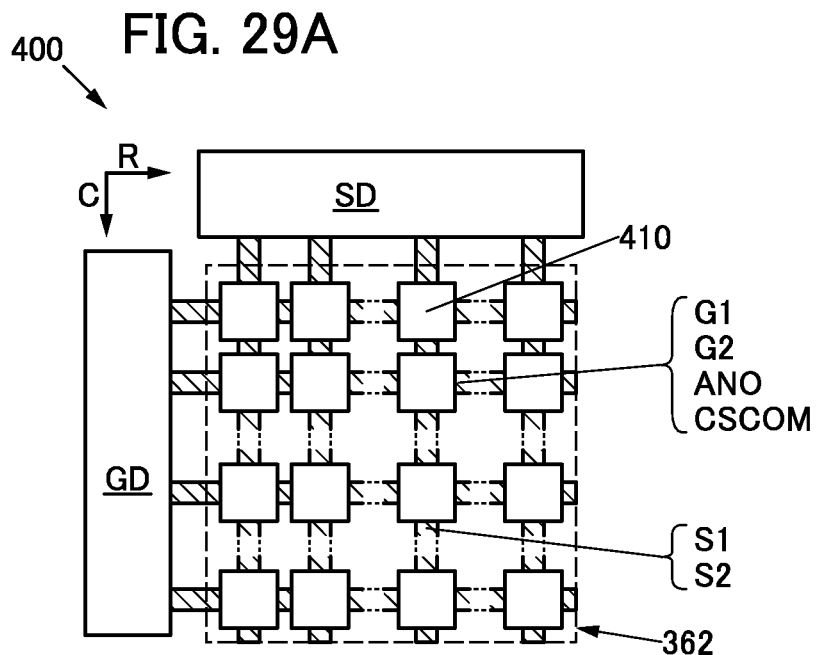
Figure 29A:
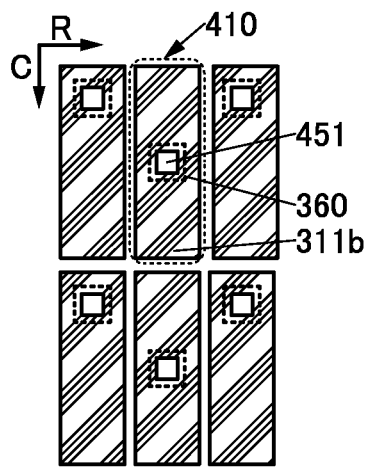
Figure 29A:
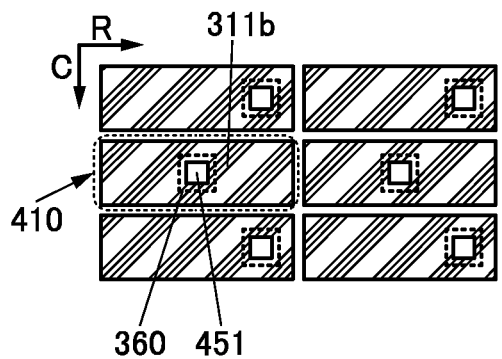

FIG. 29A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes a plurality of wirings S1 and a plurality of wirings S2, which are electrically connected to the circuit SD and the plurality of pixels 410 arranged in a direction C.

Although the configuration including one circuit GD and one circuit SD is illustrated here for simplicity, the circuit GD and the circuit SD for driving the liquid crystal element and those for driving the light-emitting element may be provided separately.

The pixel 410 includes a reflective liquid crystal element and a light-emitting element. In the pixel 410, the liquid crystal element and the light-emitting element partly overlap with each other.

FIG. 29B1 illustrates a structure example of a conductive layer 311b included in the pixel 410. The conductive layer 311b serves as a reflective electrode of the liquid crystal element in the pixel 410. The conductive layer 311b includes an opening 451.

In FIG. 29B1, a light-emitting element 360 in a region overlapping with the conductive layer 311b is shown by a dashed line. The light-emitting element 360 overlaps with the opening 451 included in the conductive layer 311b. Thus, light from the light-emitting element 360 is emitted to the display surface side through the opening 451.

In FIG. 29B1, the pixels 410 adjacent in the direction R correspond to different emission colors. As illustrated in FIG. 29B1, the plurality of openings 451 are preferably provided in different positions in the conductive layers 311b so as not to be aligned in the plurality of pixels arranged in the direction R. This allows the adjacent two light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 29B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the conductive layer 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

Circuit Configuration Example

Figure 30:
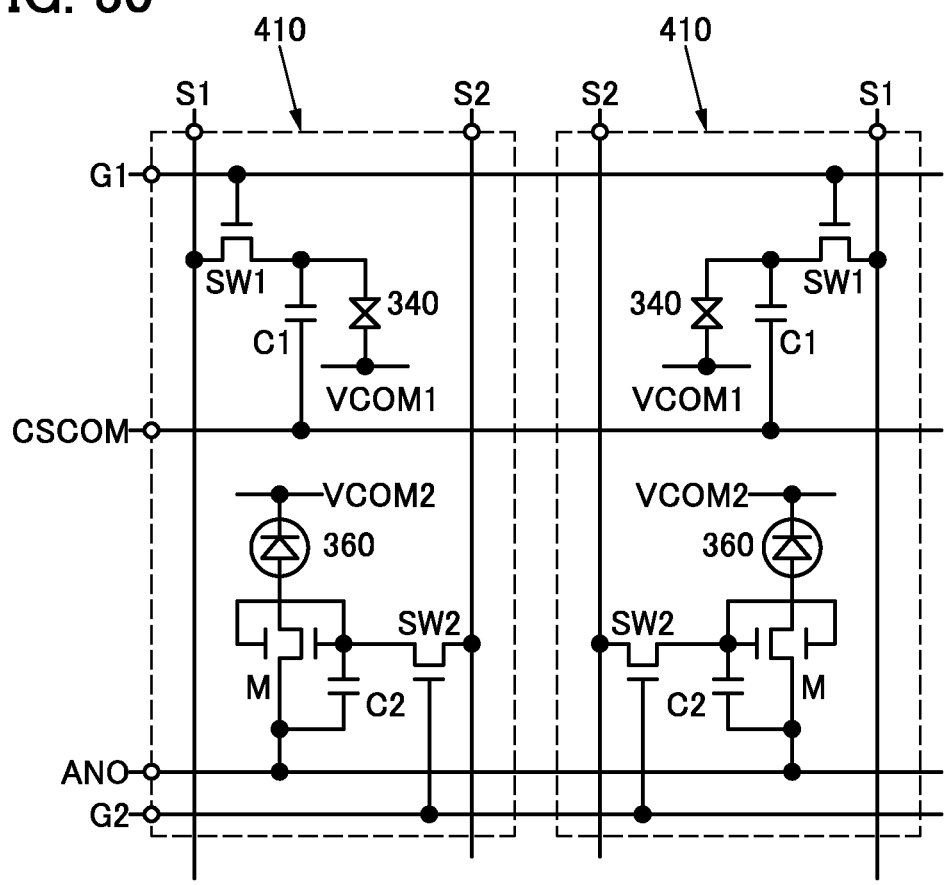
FIG. 30 is a circuit diagram of a display device of an embodiment.

FIG. 30 is a circuit diagram illustrating a configuration example of the pixel 410. FIG. 30 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 30 also illustrates a wiring VCOM1 electrically connected to the liquid crystal element 340 and a wiring VCOM2 electrically connected to the light-emitting element 360.

FIG. 30 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 30 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 30, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 31A:
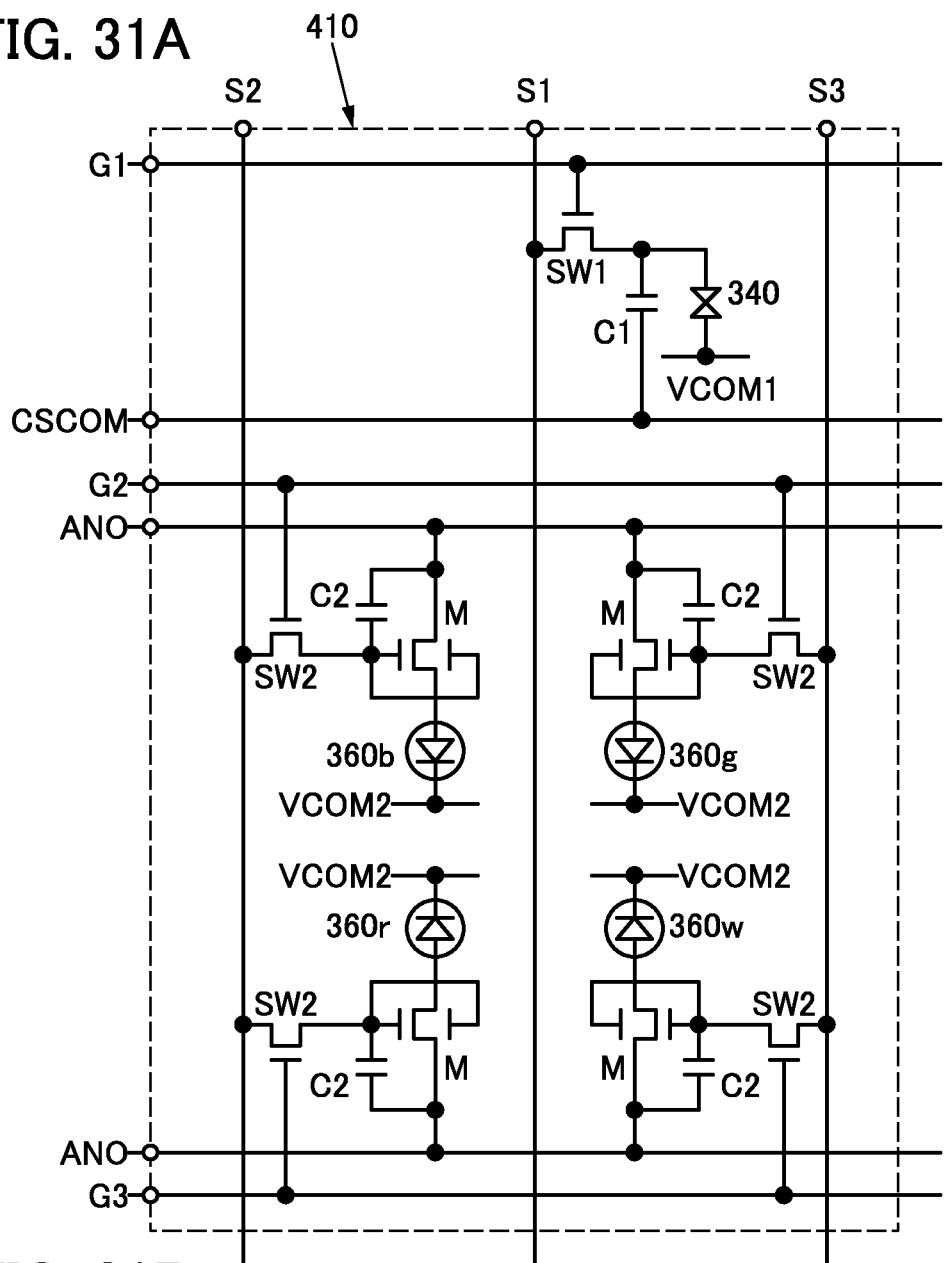
FIG. 31A is a circuit diagram of a display device of an embodiment.

Although FIG. 30 illustrates the example in which one pixel 410 includes one liquid crystal element 340 and one light-emitting element 360, one embodiment of the present invention is not limited to this example. FIG. 31A illustrates an example in which one pixel 410 includes one liquid crystal element 340 and four light-emitting elements (light-emitting elements 360r, 360g, 360b, and 360w). The pixel 410 illustrated in FIG. 31A differs from that in FIG. 30 in being capable of performing full-color display by one pixel.

In addition to the example in FIG. 30, the pixel 410 in FIG. 31A is connected to a wiring G3 and a wiring S3.

In the example illustrated in FIG. 31A, for example, light-emitting elements which exhibit red (R), green (G), blue (B), and white (W) can be used as the four light-emitting elements. A reflective liquid crystal element which exhibits white can be used as the liquid crystal element 340. This enables white display with high reflectance in the reflective mode. This also enables display with excellent color-rendering properties and low power consumption in the transmissive mode.

Figure 31B:
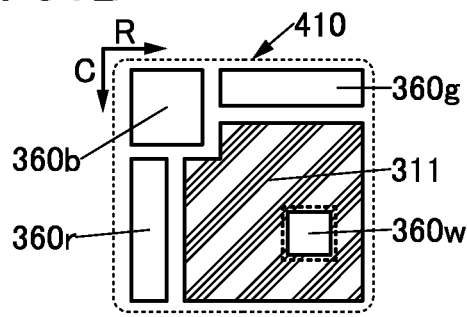
FIG. 31B illustrates a pixel configuration example of the display device.

FIG. 31B illustrates a configuration example of the pixel 410. The pixel 410 includes the light-emitting element 360w which overlaps with the opening in the conductive layer 311 and the light-emitting elements 360r, 360g, and 360b located near the conductive layer 311. It is preferred that the light-emitting elements 360r, 360g, and 360b have substantially the same light-emitting area.

At least part of this embodiment can be implemented in combination with any of the other embodiments described in this specification as appropriate.

Embodiment 3

In this embodiment, a display module that can be fabricated using one embodiment of the present invention will be described.

Figure 32:
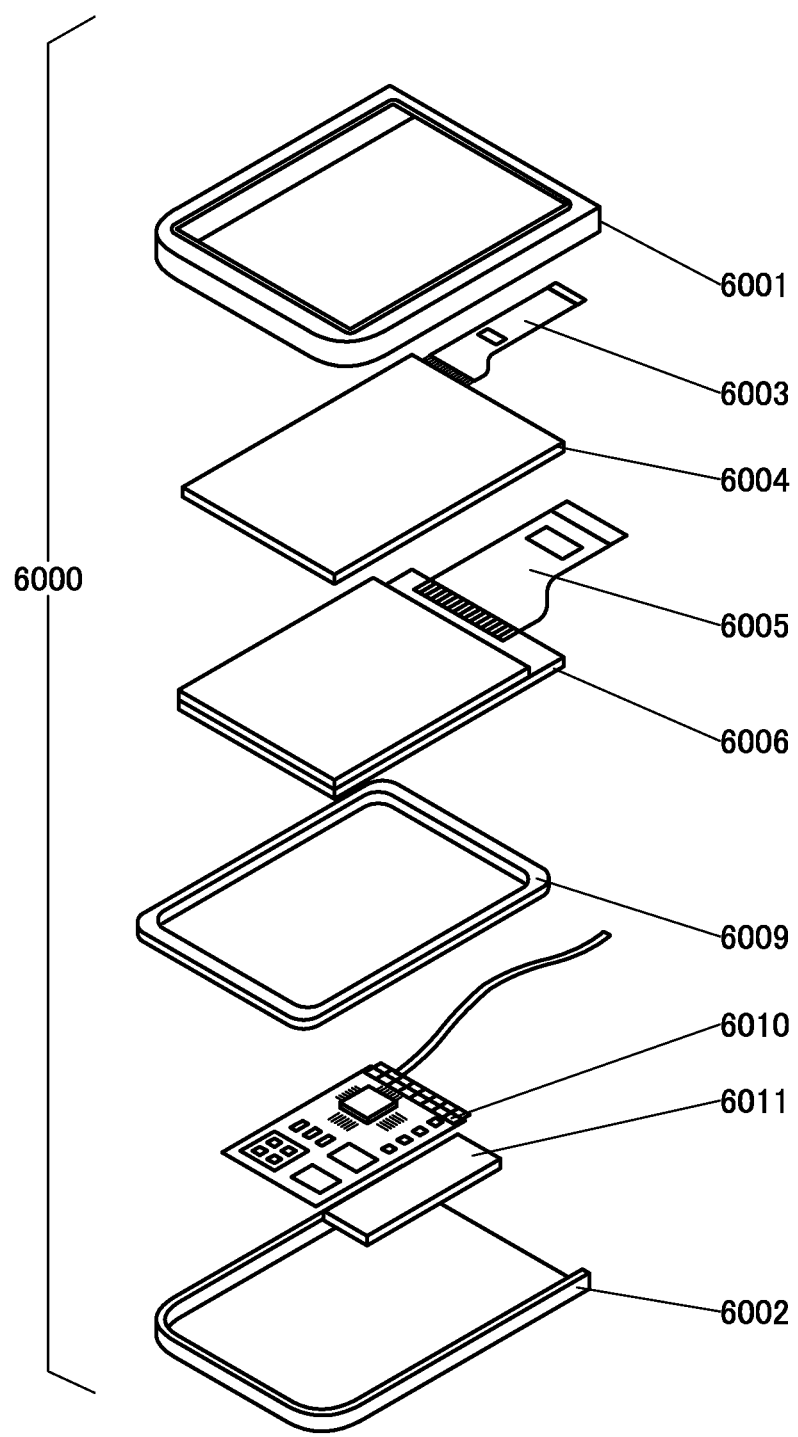
FIG. 32 illustrates a structure example of a display module of an embodiment.

In a display module 6000 illustrated in FIG. 32, a touch panel 6004 connected to an FPC 6003, a display panel 6006 connected to an FPC 6005, a frame 6009, a printed board 6010, and a battery 6011 are provided between an upper cover 6001 and a lower cover 6002.

The display device fabricated using one embodiment of the present invention can be used for, for example, the display panel 6006.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed such that it overlaps with the display panel 6006. Instead of providing a touch panel 6004, the display panel 6006 can have a touch panel function.

The frame 6009 protects the display panel 6006 and functions as an electromagnetic shield for blocking electromagnetic waves generated by the operation of the printed board 6010. The frame 6009 may function as a radiator plate.

The printed board 6010 is provided with a power supply circuit and a signal processing circuit for outputting a video signal and a clock signal. As a power source for supplying power to the power supply circuit, an external commercial power source or a power source using the battery 6011 provided separately may be used. The battery 6011 can be omitted in the case of using a commercial power source.

The display module 6000 may be additionally provided with a member such as a polarizing plate, a retardation plate, or a prism sheet.

At least part of this embodiment can be implemented in combination with any of the other embodiments described in this specification as appropriate.

Embodiment 4

In this embodiment, electronic devices and lighting devices of embodiments of the present invention will be described with reference to drawings.

Electronic devices and lighting devices can be manufactured using the display device of one embodiment of the present invention. Highly reliable electronic devices and highly reliable lighting devices having curved surfaces can be manufactured using the display device of one embodiment of the present invention. In addition, highly reliable electronic devices and highly reliable lighting devices having flexibility can be manufactured using the display device of one embodiment of the present invention.

Examples of electronic devices include a television set, desktop and laptop personal computers, monitors of a computer and the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium-ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, information, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of kinds of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

FIGS. 33A to 33E illustrate examples of electronic devices each including a display portion 7000 with a curved surface. Since the display surface of the display portion 7000 is curved, images can be displayed on the curved display surface. The display portion 7000 may have flexibility.

The display portion 7000 is formed using the display device or the like of one embodiment of the present invention. One embodiment of the present invention makes it possible to provide a highly reliable electronic device a curved display portion.

Figure 33A:
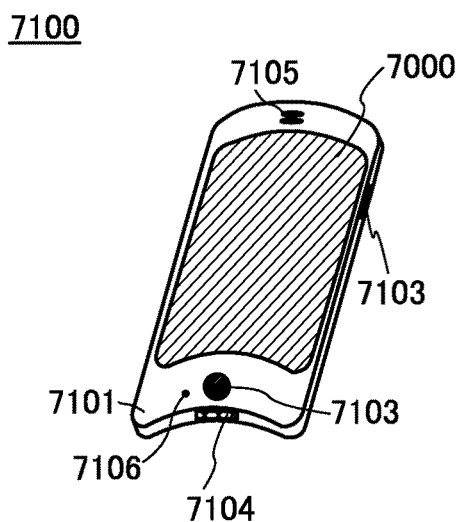
FIGS. 33A to 33F illustrate examples of electronic devices and a lighting device of embodiments.
Figure 33B:
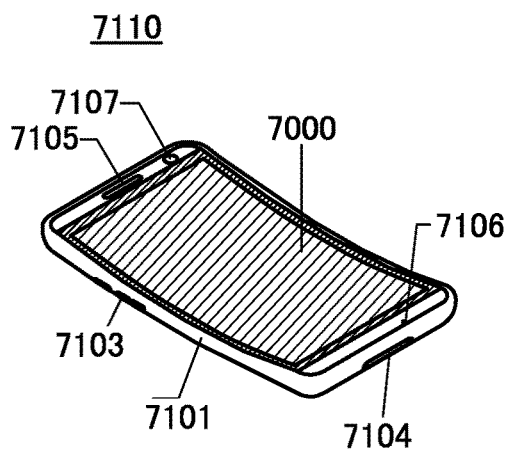

FIGS. 33A and 33B illustrate examples of mobile phones. A mobile phone 7100 illustrated in FIG. 33A and a mobile phone 7110 illustrated in FIG. 33B each include a housing 7101, the display portion 7000, operation buttons 7103, an external connection port 7104, a speaker 7105, a microphone 7106, and the like. The mobile phone 7110 illustrated in FIG. 33B also includes a camera 7107.

Each mobile phone includes a touch sensor in the display portion 7000. Operations such as making a call and inputting text can be performed by touch on the display portion 7000 with a finger, a stylus, or the like.

With the operation buttons 7103, the power can be turned on or off. In addition, types of images displayed on the display portion 7000 can be changed; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 33C:
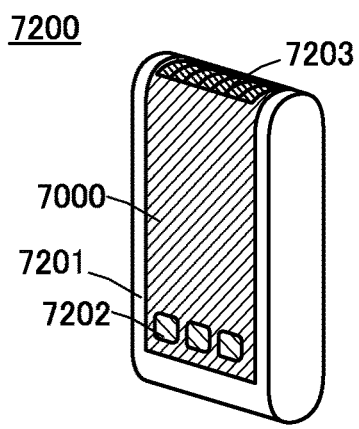
Figure 33D:
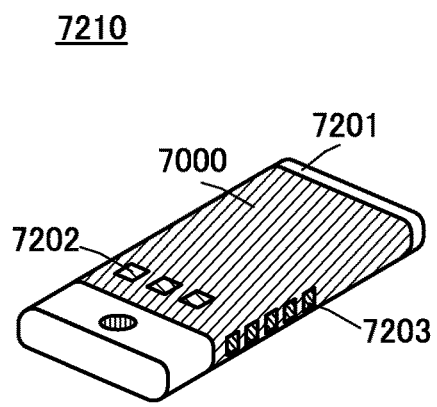

FIGS. 33C and 33D illustrate examples of portable information terminals. A portable information terminal 7200 illustrated in FIG. 33C and a portable information terminal 7210 illustrated in FIG. 33D each include a housing 7201 and the display portion 7000. Each of the portable information terminals may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals can each be used as a smartphone. Each of the portable information terminals illustrated in this embodiment is capable of executing, for example, a variety of applications such as mobile phone calls, e-mailing, reading and editing text, music reproduction, Internet communication, and a computer game.

The portable information terminals 7200 and 7210 can display text, image information, and the like on their plurality of surfaces. For example, as illustrated in FIGS. 33C and 33D, three operation buttons 7202 can be displayed on one surface, and information 7203 indicated by a rectangle can be displayed on another surface. FIG. 33C illustrates an example in which information is displayed on the top surface of the portable information terminal. FIG. 33D illustrates an example in which information is displayed on the side surface of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery level, and the reception sensitivity of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 33E:
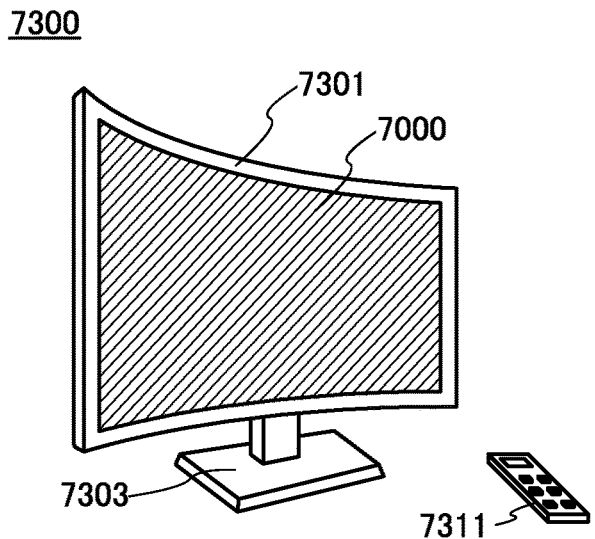

FIG. 33E illustrates an example of a television set. In a television set 7300, the display portion 7000 is incorporated into a housing 7301. Here, the housing 7301 is supported by a stand 7303.

The television set 7300 illustrated in FIG. 33E can be operated with an operation switch of the housing 7301 or a separate remote controller 7311. The display portion 7000 may include a touch sensor so that it can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and a video displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 33F:
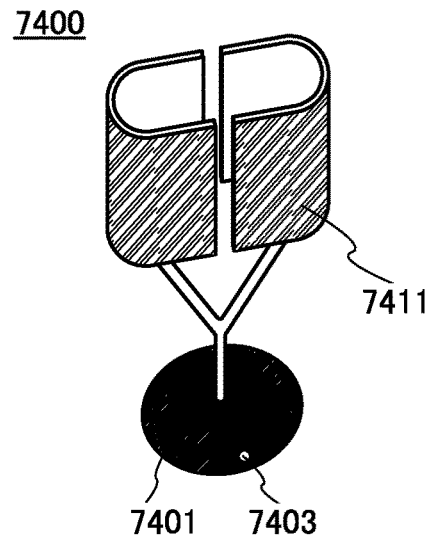

FIG. 33F illustrates an example of a lighting device having a curved light-emitting portion.

The light-emitting portion included in the lighting device illustrated in FIG. 33F can be manufactured using the display device or the like of one embodiment of the present invention. According to one embodiment of the present invention, a highly reliable lighting device with a curved light-emitting portion can be provided.

A light-emitting portion 7411 included in a lighting device 7400 illustrated in FIG. 33F has two convex-curved light-emitting portions symmetrically placed. Thus, light radiates from the lighting device 7400 in all directions.

The light-emitting portion 7411 included in the lighting device 7400 may have flexibility. The light-emitting portion 7411 may be fixed on a plastic member, a movable frame, or the like so that a light-emitting surface of the light-emitting portion 7411 can be bent freely depending on the intended use.

The lighting device 7400 includes a stage 7401 provided with an operation switch 7403 and the light-emitting portion 7411 supported by the stage 7401.

Note that although the lighting device in which the light-emitting portion is supported by the stage is described as an example here, a housing provided with a light-emitting portion can be fixed on a ceiling or suspended from a ceiling.

Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 34A to 34I illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

Figure 34A:
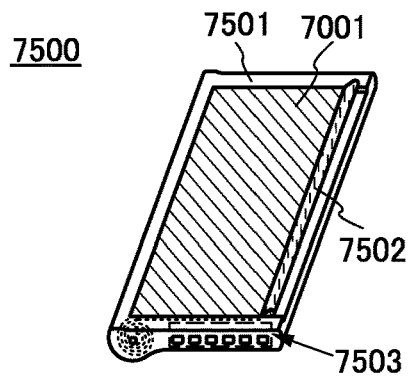
FIGS. 34A to 34I illustrate examples of electronic devices of embodiments.
Figure 34B:
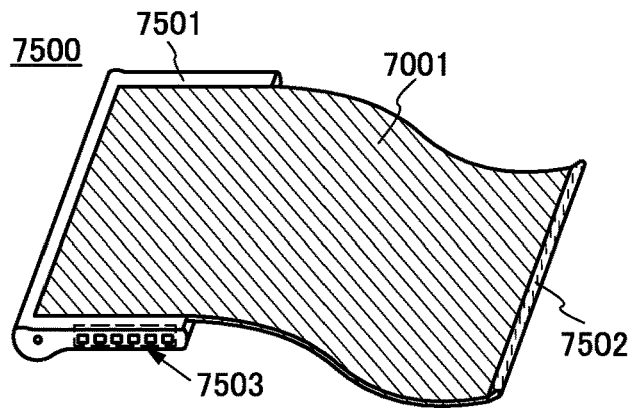

FIGS. 34A and 34B are perspective views illustrating an example of the portable information terminal. A portable information terminal 7500 includes a housing 7501, the display portion 7001, a display portion tab 7502, operation buttons 7503, and the like.

The portable information terminal 7500 includes the rolled flexible display portion 7001 in the housing 7501. The display portion 7001 can be pulled out with the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, changing of displayed videos, and the like can be performed. Although FIGS. 34A and 34B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 34B illustrates the portable information terminal 7500 in a state where the display portion 7001 is pulled out. A video can be displayed on the display portion 7001 in this state. In addition, the portable information terminal 7500 may perform different types of display in the state where part of the display portion 7001 is rolled as shown in FIG. 34A and in the state where the display portion 7001 is pulled out as shown in FIG. 34B. For example, in the state shown in FIG. 34A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figure 34C:
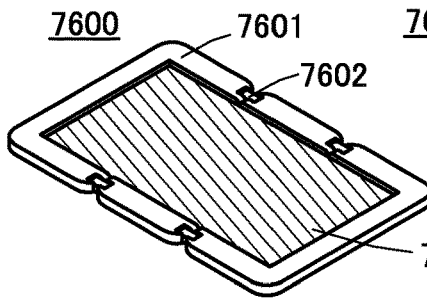
Figure 34D:
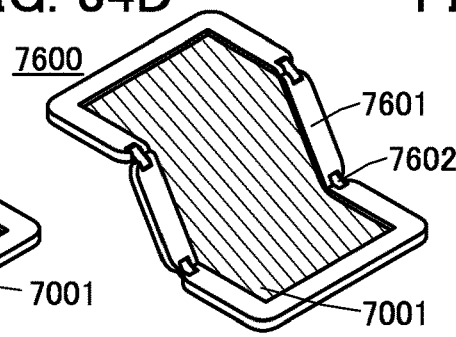
Figure 34E:
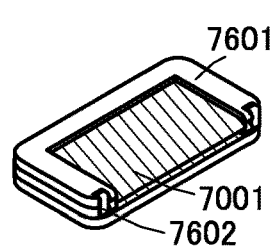

FIGS. 34C to 34E illustrate an example of a foldable portable information terminal. FIG. 34C illustrates a portable information terminal 7600 that is unfolded. FIG. 34D illustrates the portable information terminal 7600 that is being unfolded or folded. FIG. 34E illustrates the portable information terminal 7600 that is folded. The portable information terminal 7600 is highly portable when folded, and is highly browsable when unfolded because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an unfolded state to a folded state.

Figure 34F:
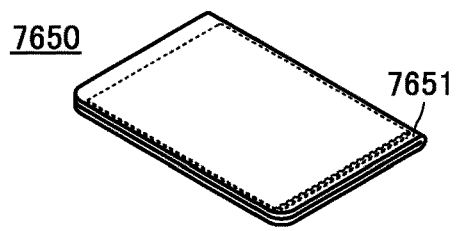
Figure 34G:
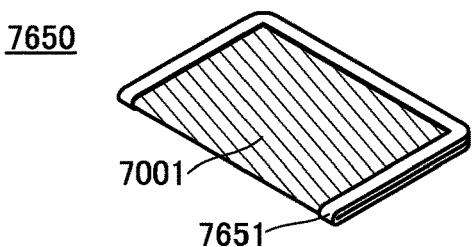

FIGS. 34F and 34G illustrate an example of a foldable portable information terminal. FIG. 34F illustrates a portable information terminal 7650 that is folded so that the display portion 7001 is on the inside. FIG. 34G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

Figure 34H:
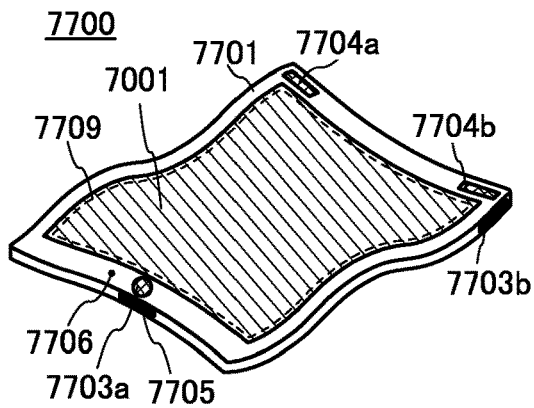

FIG. 34H illustrates an example of a flexible portable information terminal. A portable information terminal 7700 includes a housing 7701 and the display portion 7001. The portable information terminal 7700 may further include buttons 7703a and 7703b serving as input means, speakers 7704a and 7704b serving as sound output means, an external connection port 7705, a microphone 7706, or the like. A flexible battery 7709 can be included in the portable information terminal 7700. The battery 7709 may be positioned to overlap with the display portion 7001, for example.

The housing 7701, the display portion 7001, and the battery 7709 have flexibility. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 34I:
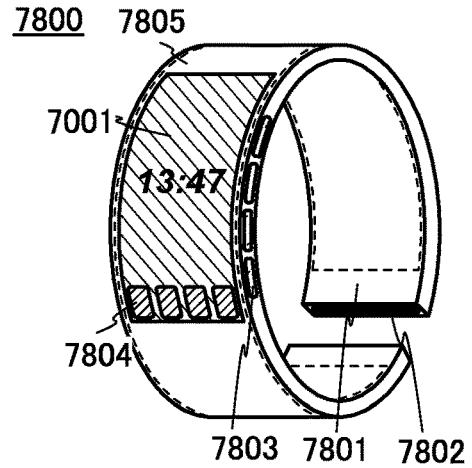

FIG. 34I illustrates an example of a wrist-watch-type portable information terminal. A portable information terminal 7800 includes a band 7801, the display portion 7001, an input/output terminal 7802, operation buttons 7803, and the like. The band 7801 has a function of a housing. A flexible battery 7805 can be included in the portable information terminal 7800. The battery 7805 may be provided to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of a silent mode, and setting and cancellation of a power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 35A:
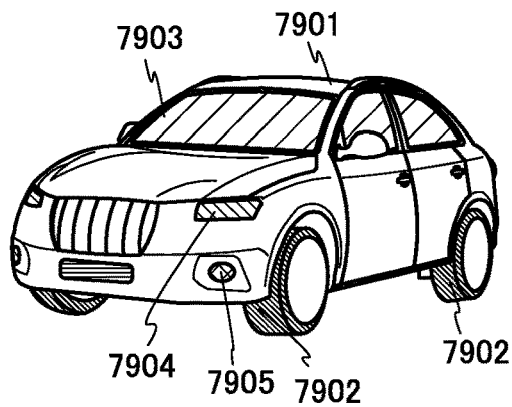
FIGS. 35A to 35F illustrate examples of electronic devices of embodiments.
Figure 35B:
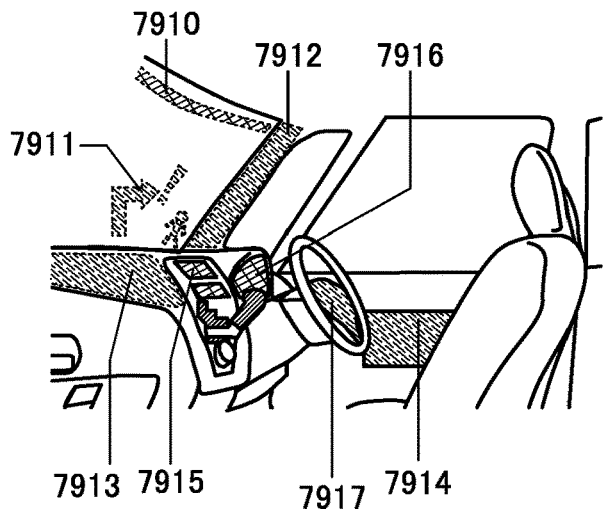

FIG. 35A is an external view of an automobile 7900. FIG. 35B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 35B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using an oxide semiconductor, is preferably used.

A display portion 7912 is provided on a pillar portion. A display portion 7913 is provided on a dashboard. For example, the display portion 7912 can compensate for the view hindered by the pillar portion by showing an image taken by an imaging means provided on the car body. Similarly, the display portion 7913 can compensate for the view hindered by the dashboard and a display portion 7914 can compensate for the view hindered by the door. That is, showing a video taken by an imaging means provided on the outside of the automobile leads to elimination of blind areas and enhancement of safety. In addition, showing a video so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation information, a speedometer, a tachometer, a mileage, a fuel meter, a gearshift indicator, and air-condition setting. The content, layout, or the like of the display on the display portions can be customized freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 35C:
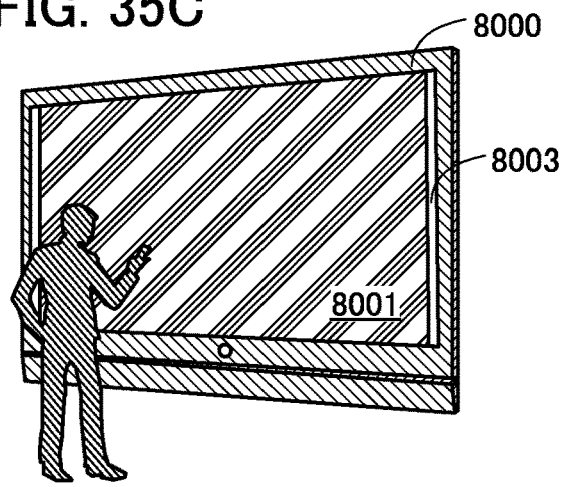
Figure 35D:
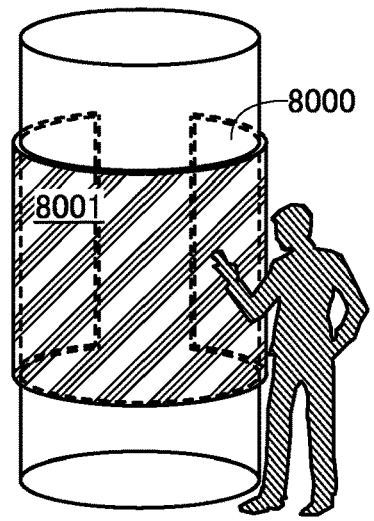

FIGS. 35C and 35D illustrate examples of digital signages. The digital signages each include a housing 8000, a display portion 8001, a speaker 8003, and the like. Also, the digital signages can each include an LED lamp, operation keys (including a power switch and an operation switch), a connection terminal, a variety of sensors, a microphone, and the like.

FIG. 35D illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the device is used to provide information such as route information or traffic information, usability can be enhanced by intuitive operation.

Figure 35E:
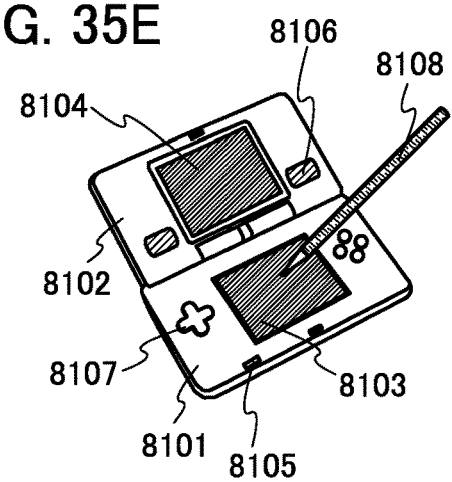

FIG. 35E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 35E includes two display portions 8103 and 8104. Note that the number of display portions of the electronic device of one embodiment of the present invention is not limited to two and can be one or three or more as long as at least one display portion includes the display device of one embodiment of the present invention.

Figure 35F:
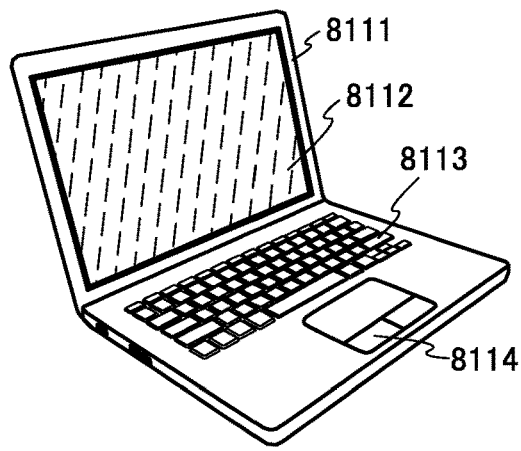

FIG. 35F illustrates a laptop personal computer which includes a housing 8111, a display portion 8112, a keyboard 8113, a pointing device 8114, and the like.

The display device of one embodiment of the present invention can be used for the display portion 8112.

At least part of this embodiment can be implemented in combination with any of the other embodiments described in this specification as appropriate.

This application is based on Japanese Patent Application Serial No. 2016-154436 filed with Japan Patent Office on Aug. 5, 2016, the entire contents of which are hereby incorporated by reference.

What is claimed is:

1. A display device comprising:
a first electrode;
a second electrode;
a liquid crystal layer;
a first coloring layer;
a second coloring layer;
a second insulating layer and a light-emitting element;
a resin layer configured to transmit visible light; and
a conductive layer configured to reflect visible light,
wherein the first electrode and the second electrode are apart from each other, and the first electrode, the second electrode, and the resin layer are on a same plane,
wherein the first coloring layer and the second coloring layer are apart from each other and on a same plane,
wherein the first coloring layer comprises a portion overlapping with the first electrode, wherein the second coloring layer comprises a portion overlapping with the second electrode, wherein the liquid crystal layer comprises a first portion overlapping with the first electrode and a second portion overlapping with a region between the first electrode and the second electrode, wherein the second portion comprises a portion overlapping with neither the first coloring layer nor the second coloring layer, and comprises a region overlapping with the resin layer and the conductive layer, wherein the first portion comprises monomers and liquid crystal, wherein the second portion comprises a polymer in which the monomers are polymerized, wherein the light-emitting element comprises a structure in which a fourth electrode configured to transmit visible light, a layer comprising a light-emitting substance, and a fifth electrode are stacked from the second insulating layer side, and wherein the light-emitting element is configured to emit light through the second insulating layer and the liquid crystal layer.

2. The display device according to claim 1, wherein the first electrode and the second electrode are each configured to reflect visible light.

3. The display device according to claim 1, wherein the first electrode and the second electrode are each configured to transmit visible light.

4. The display device according to claim 1, further comprising:
a third electrode overlapping with the first electrode with the liquid crystal layer sandwiched therebetween,
wherein the third electrode configured to transmit visible light.

5. The display device according to claim 4, further comprising:
a first alignment film covering the first electrode; and
a second alignment film covering the third electrode,
wherein the first portion is in contact with the first alignment film and the second alignment film.

6. The display device according to claim 1, further comprising a structure body having an insulating property inside the second portion.

7. The display device according to claim 1, further comprising:
a first insulating layer having a depression,
wherein the first electrode and the second electrode are each located over the first insulating layer and do not overlap with the depression, and
wherein the second portion comprises a portion overlapping with the depression.

8. The display device according to claim 1, further comprising:
a first substrate and a second substrate,
wherein the first electrode and the second electrode are each located between the first substrate and the liquid crystal layer,
wherein the first coloring layer and the second coloring layer are each located between the second substrate and the liquid crystal layer, and
wherein the first substrate and the second substrate each have flexibility.

9. The display device according to claim 1, further comprising:
a first transistor electrically connected to the first electrode; and
a second transistor electrically connected to the second electrode,
wherein the first transistor and the second transistor are on a same plane.

10. The display device according to claim 9,
wherein the first transistor and the second transistor are each on a first surface side of the second insulating layer,
wherein the first electrode is on an opposite side of the second insulating layer from the first transistor, and
wherein the first electrode and the first transistor are electrically connected to each other through an opening in the second insulating layer.

11. The display device according to claim 9,
wherein the first transistor and the second transistor are each on a first surface side of the second insulating layer,
wherein the fourth electrode is on an opposite side of the second insulating layer from the second transistor, and
wherein the fourth electrode and the second transistor are electrically connected to each other through an opening in the second insulating layer.

12. A method for manufacturing a display device, comprising:
a first step of forming a first electrode and a second electrode over a substrate so that the first electrode and the second electrode are apart from each other;
a second step of forming a light-blocking layer over a support substrate, a resin layer covering the light-blocking layer, and a first coloring layer and a second coloring layer over the resin layer in this order;
a third step of bonding the substrate and the support substrate to each other with a liquid crystal layer sandwiched therebetween, the liquid crystal layer comprising liquid crystal, monomers, and a polymerization initiator;
a fourth step of performing light irradiation from the support substrate side so that the monomers in the liquid crystal layer are polymerized in a region not shielded by the light-blocking layer; and
a fifth step of performing separation between the resin layer and each of the support substrate and the light-blocking layer.

13. A method for manufacturing a display device, comprising:
a first step of forming a first insulating layer over a first support substrate and forming a first electrode and a second electrode over the first insulating layer so that the first electrode and the second electrode are apart from each other;
a second step of forming a light-blocking layer over a second support substrate, a resin layer covering the light-blocking layer, and a first coloring layer and a second coloring layer over the resin layer in this order;
a third step of bonding the first support substrate and the second support substrate to each other with a liquid crystal layer sandwiched therebetween, the liquid crystal layer comprising liquid crystal, monomers, and a polymerization initiator;
a fourth step of performing light irradiation from the second support substrate side so that the monomers in the liquid crystal layer are polymerized in a region not shielded by the light-blocking layer;
a fifth step of performing separation between the resin layer and each of the second support substrate and the light-blocking layer;

a sixth step of removing an exposed part of the resin layer by etching, and bonding a second substrate to the first coloring layer and the second coloring layer with a first bonding layer;

a seventh step of performing separation between the first support substrate and the first insulating layer; and an eighth step of bonding a first substrate to an exposed surface of the first insulating layer with a second bonding layer.

14. The method for manufacturing a display device, according to claim 13, wherein the first substrate and the second substrate are each a flexible substrate.

* * * * *